(12) United States Patent
Lin et al.

(10) Patent No.: US 8,440,272 B2
(45) Date of Patent: May 14, 2013

(54) METHOD FOR FORMING POST PASSIVATION AU LAYER WITH CLEAN SURFACE

(75) Inventors: Mou-Shiung Lin, Hsin-Chu (TW); Shih-Hsiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 598 days.

(21) Appl. No.: 11/949,785

(22) Filed: Dec. 4, 2007

(65) Prior Publication Data
US 2008/0131983 A1 Jun. 5, 2008

Related U.S. Application Data

(60) Provisional application No. 60/868,353, filed on Dec. 4, 2006.

(51) Int. Cl.
*H01L 21/66* (2006.01)

(52) U.S. Cl.
USPC ..................................... 428/18; 257/E21.523

(58) Field of Classification Search ............. 438/18; 257/E21.523
See application file for complete search history.

(56) References Cited

U.S. PATENT DOCUMENTS

| | | | | |
|---|---|---|---|---|
| 6,162,652 A * | 12/2000 | Dass et al. | ...... | 438/18 |
| 6,204,074 B1 * | 3/2001 | Bertolet et al. | ...... | 438/18 |
| 6,521,996 B1 * | 2/2003 | Seshan | ...... | 257/737 |
| 7,081,404 B2 * | 7/2006 | Jan et al. | ...... | 438/613 |
| 2002/0119647 A1 * | 8/2002 | Riley et al. | ...... | 438/595 |
| 2003/0181042 A1 * | 9/2003 | Chen et al. | ...... | 438/689 |
| 2004/0004216 A1 * | 1/2004 | Eldridge et al. | ...... | 257/48 |
| 2004/0016452 A1 * | 1/2004 | Kunisawa et al. | ...... | 134/113 |
| 2004/0145031 A1 * | 7/2004 | Ito | ...... | 257/642 |
| 2006/0292851 A1 * | 12/2006 | Lin et al. | ...... | 438/618 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

(Continued)

*Primary Examiner* — Daniel Luke
(74) *Attorney, Agent, or Firm* — Seyfarth Shaw LLP

(57) ABSTRACT

A method for fabricating and testing a wafer includes forming metal traces with metal pads, wherein forming the metal traces include forming a TiW layer on a passivation layer and on pads, next forming a seed layer on the TiW layer, next forming a photoresist layer on the seed layer, next forming a metal layer on the seed layer exposed by openings in the photoresist layer, next removing the photoresist layer, next removing the seed layer not under the metal layer, and then etching the TiW layer not under the metal layer with an etchant containing $H_2O_2$ at a temperature of between 35 and 50° C., or with an etchant containing $H_2O_2$ and with ultrasonic waves applied to the etchant, next contacting probe tips of a probe card with some of the metal pads, next cleaning the probe tips until repeating the step of contacting the probe tips with some of the metal pads at greater than 100 times, and then after cleaning the probe tips, repeating the step of contacting the probe tips with some of the metal pads.

20 Claims, 53 Drawing Sheets

OTHER PUBLICATIONS

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Intergrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Office Action and Search Report dated Nov. 23, 2011 for Taiwan Patent Application No. 096146006 and English translation.

Search Report dated Mar. 10, 2012 for Taiwan Patent Application No. 096146006 and English translation.

\* cited by examiner

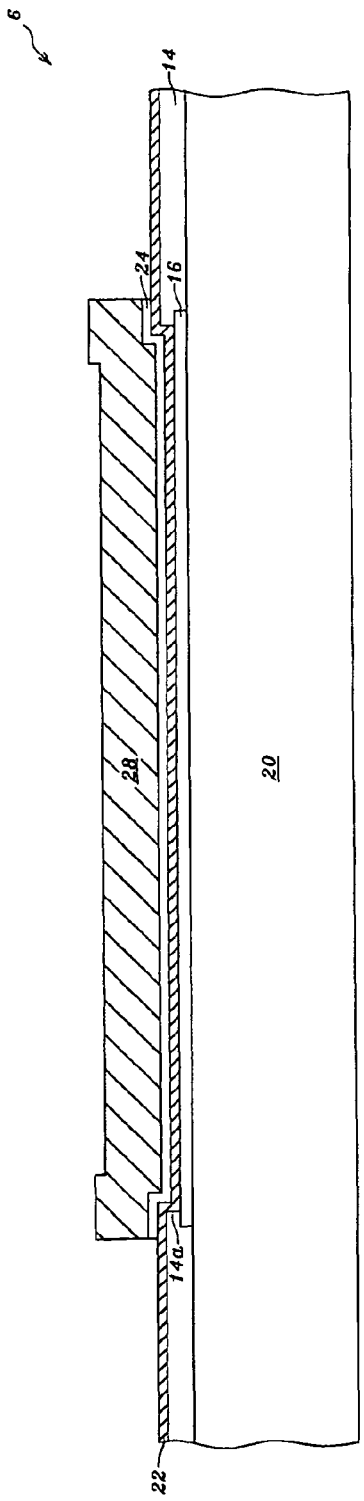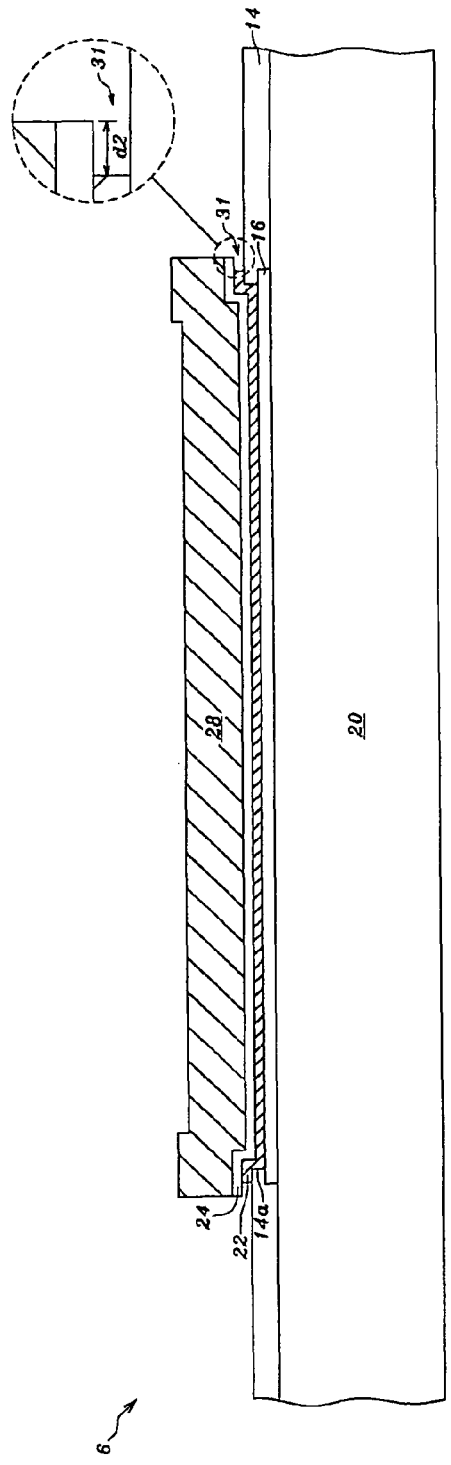
Fig. 2G
Fig. 2H

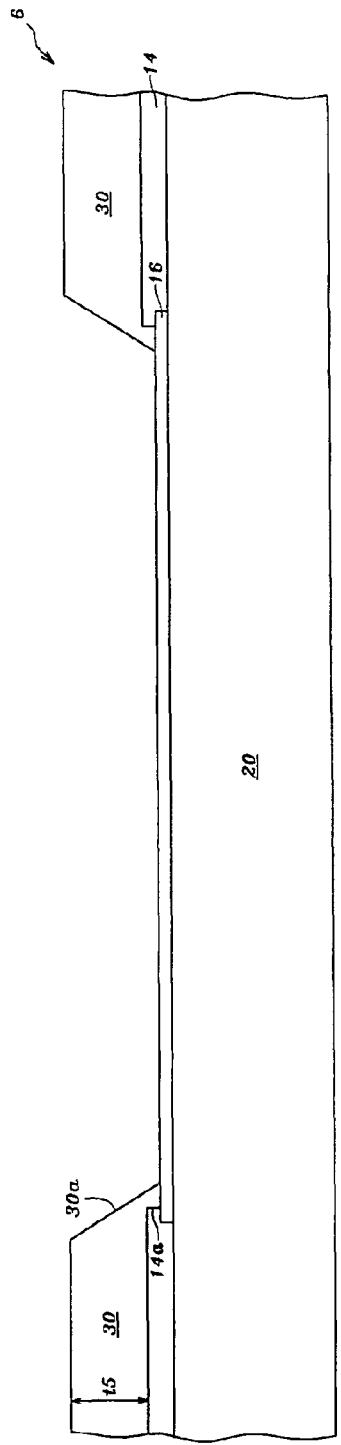
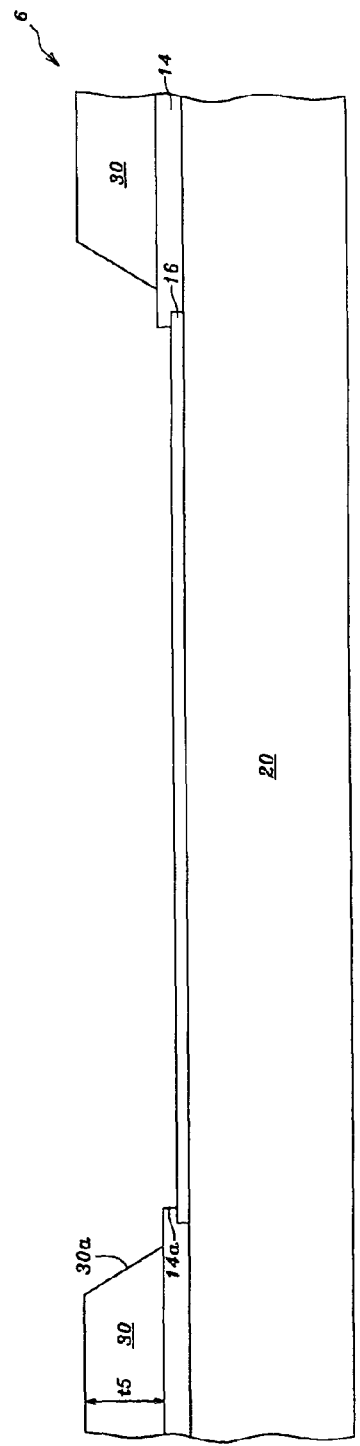

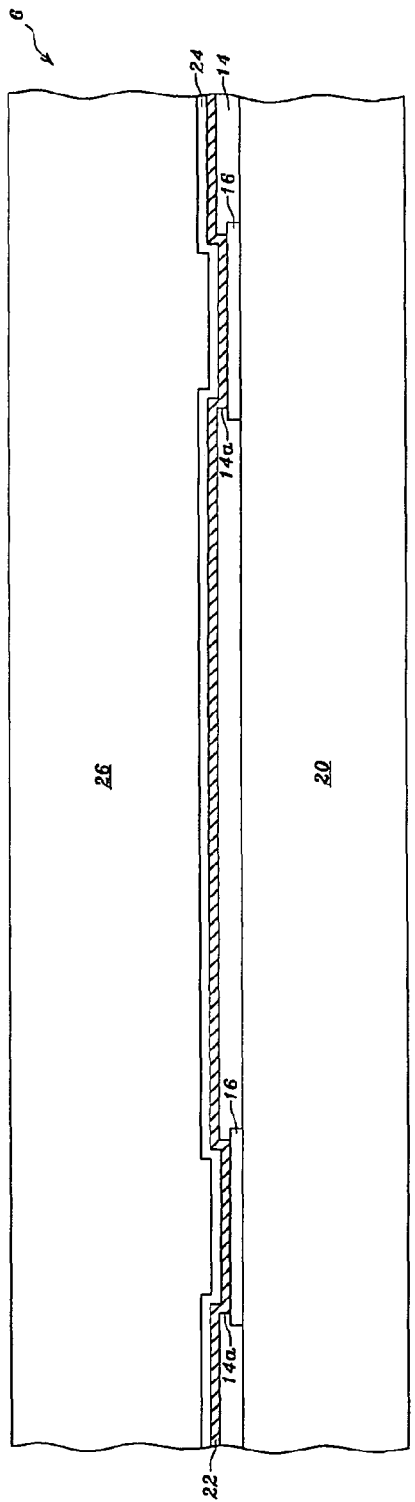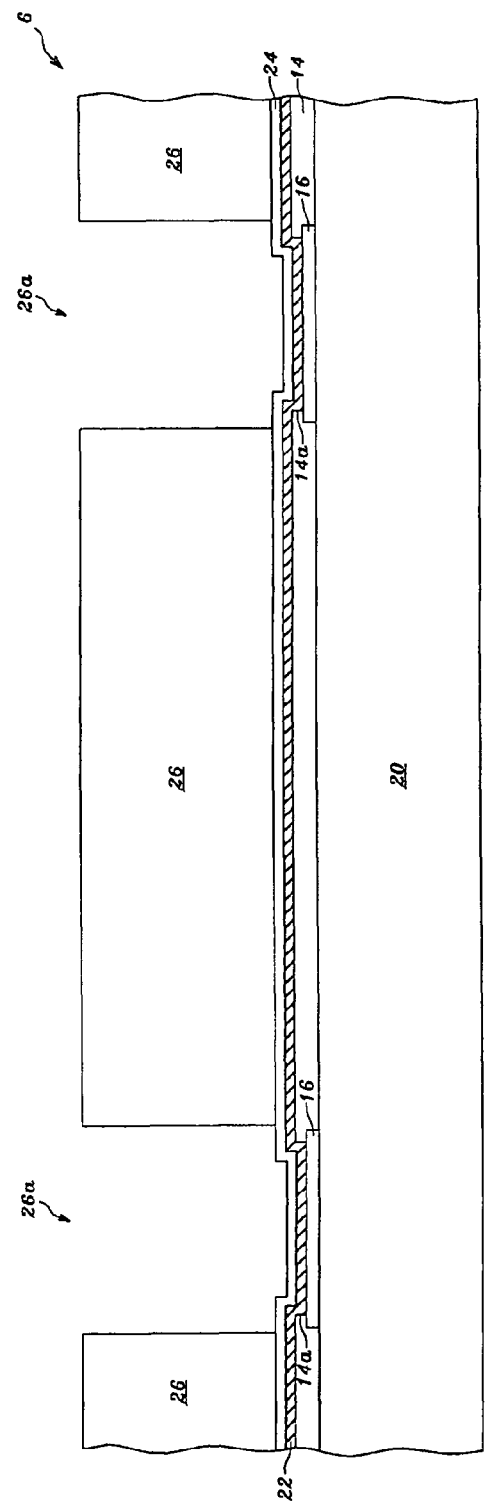
Fig. 3A
Fig. 3B

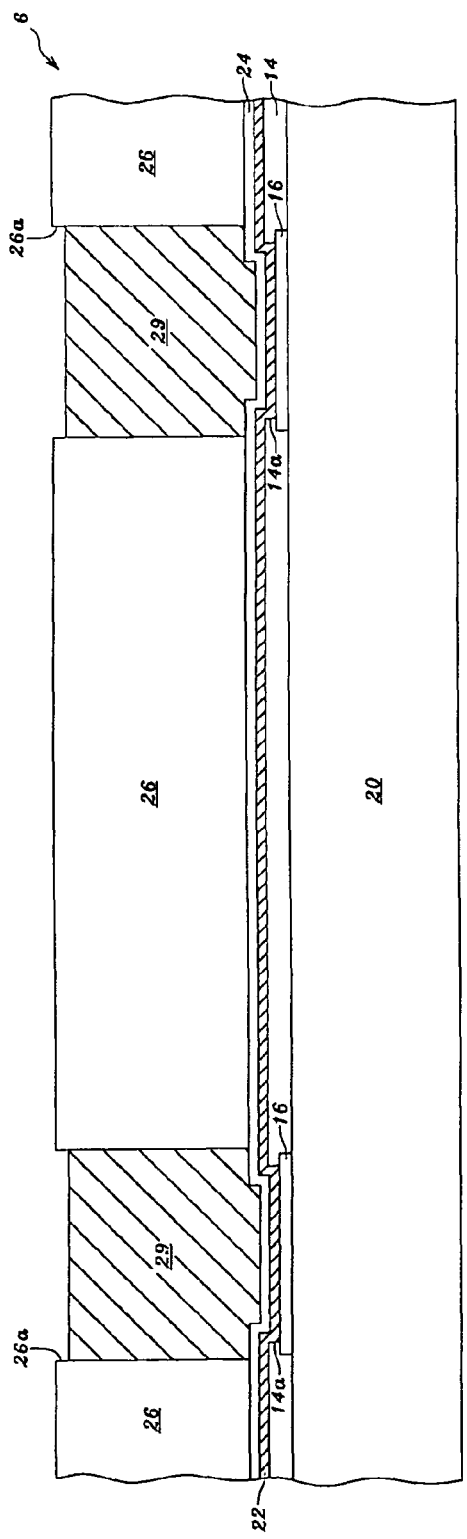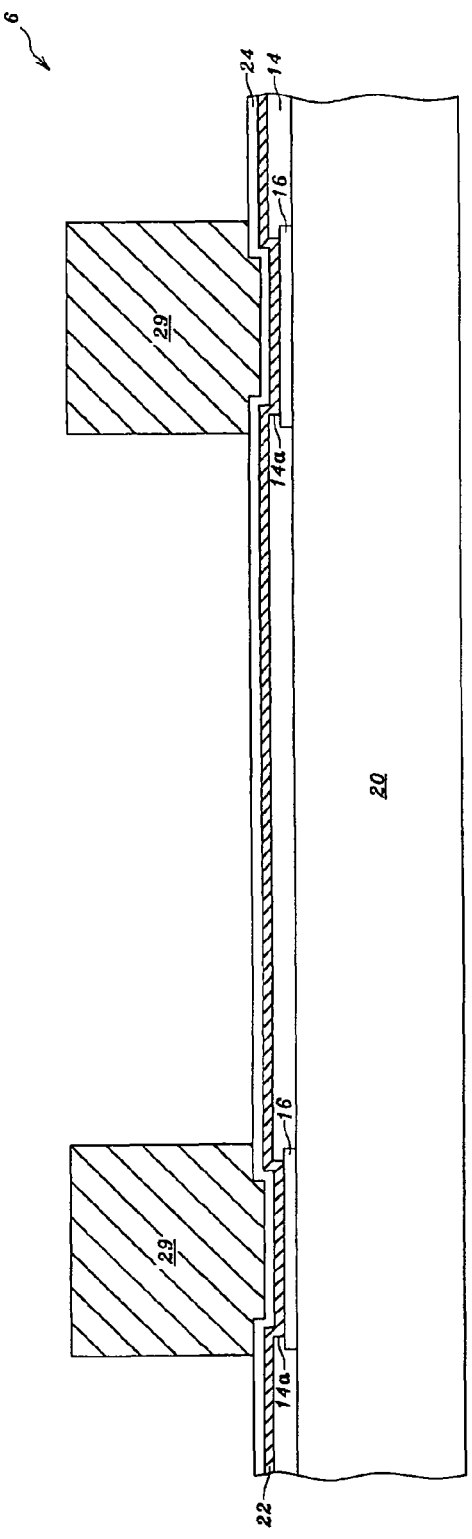
Fig. 3C
Fig. 3D

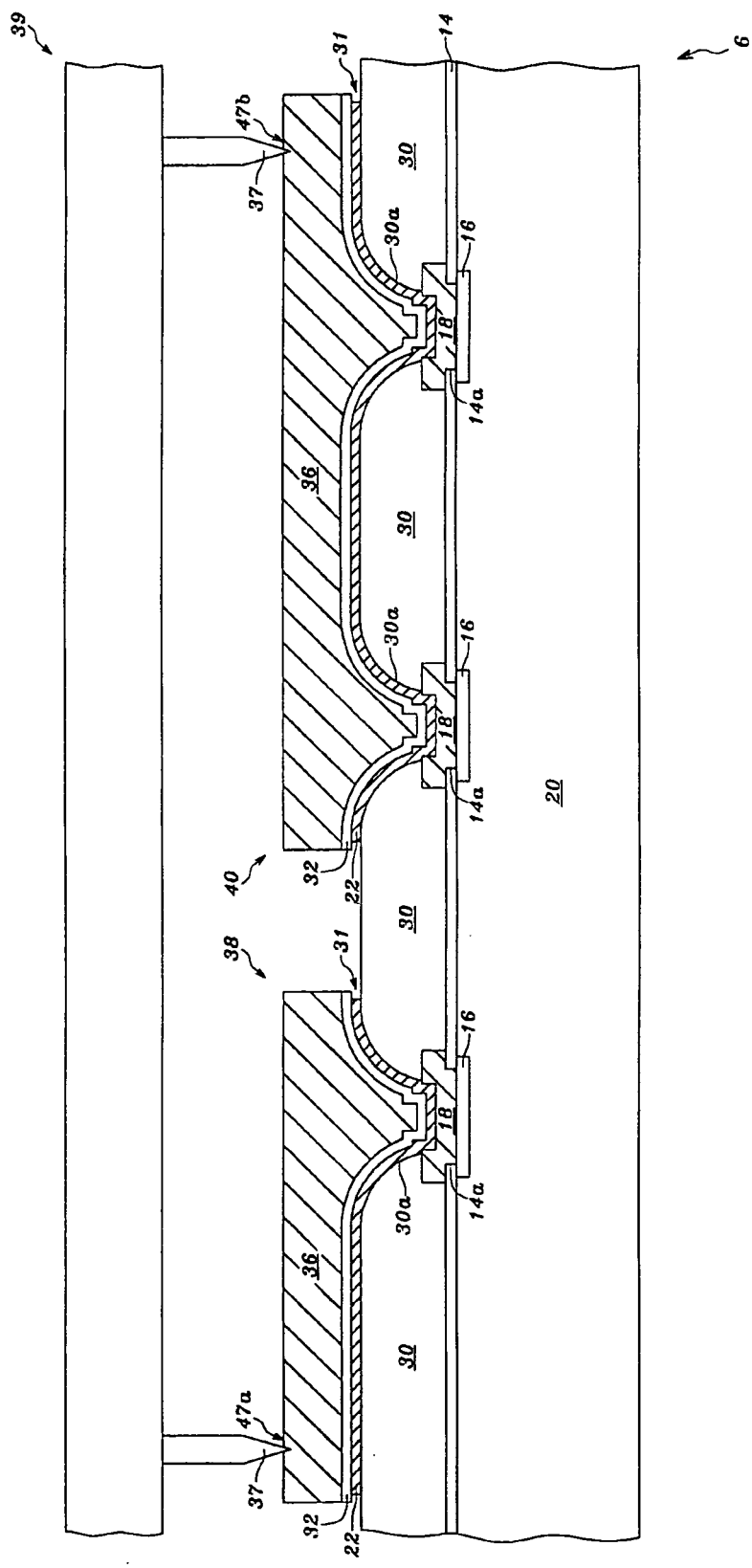

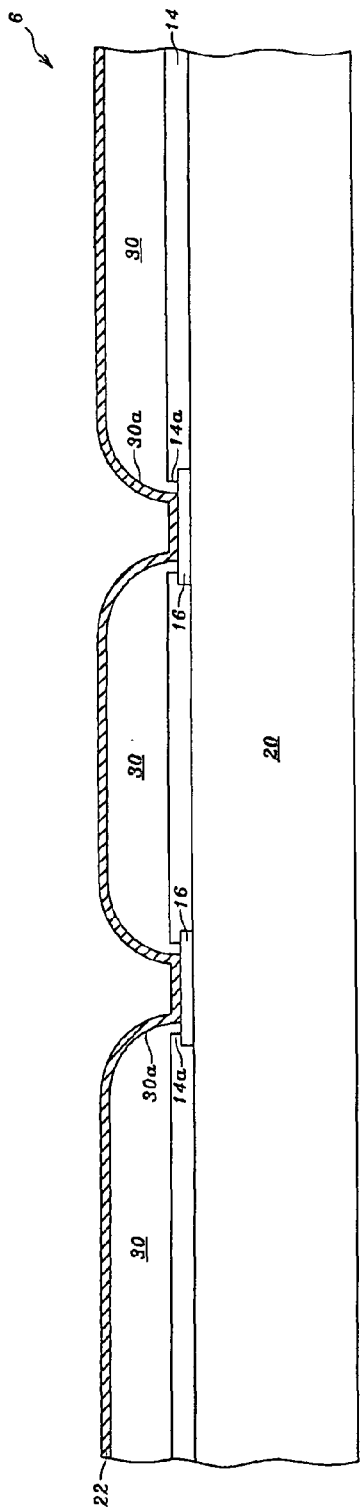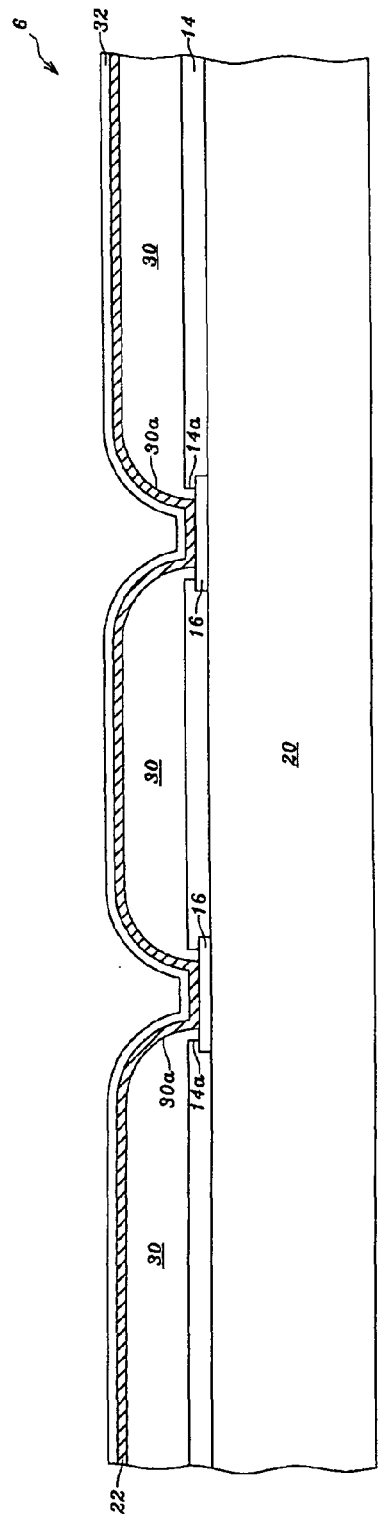
Fig. 5A
Fig. 5B

METHOD FOR FORMING POST PASSIVATION AU LAYER WITH CLEAN SURFACE

This application claims priority to U.S. provisional application No. 60/868,353, filed on Dec. 4 2006, which is herein incorporated by reference in its entirety.

BACKGROUND OF THE INVENTION

1. Field of the Invention

The invention relates to a method for forming and testing a semiconductor wafer, by which the frequency of cleaning test probes is significantly reduced, and, more specifically, to a method for forming and testing a semiconductor wafer, by which the residual of metal oxide remaining on metal pads of the semiconductor wafer can be reduced, and the chance of the residual stuck onto the test probes can be diminished.

2. Brief Description of the Related Art

Titanium-tungsten alloy is one of barrier-type metals treated as an adhesion/barrier layer to prevent the occurrence of interdiffusion in semiconductor connector. Titanium-tungsten film, of 10% Ti and 90% W by weight, is layered onto a substrate under a sputtered gold film as a seed layer for following a plating process.

Electroplating provides the electrochemical reaction to deposit Au onto the seed layer with a covered layer of patterned photoresist. Then, the continuous seed layer and UBM layer have necessary to completely remove by the Au etching and TiW etching sequentially in order to prevent interbumps connection electrically.

However, it always results from a residual problem to the TiW surrounded Au Bumps with this set of etching process. The significant amount of residue that is discontinuously distributed throughout all of the bumps presents a shape in elliptic or sheet-like within an order of magnitude of 100 nm. The presence of residue over bumps will cause a contamination problem to the following chip probing test of bumped wafers.

The test probes may be needed to make the electrical contact with Au bumps in order to thoroughly analyze a chip circuit. Thus, the probe heads often undergo residue remaining on Au bumps and the test probes, if contaminated, need to be cleaned by cleaning sheets during chip probing (CP) test. As above description, analysis misses without cleaning tips of test probes could happen after a number of probe touchdowns. As a result, a chip probing retest need to be carried out, if required, due to the low reliability in the probing test.

A frequent cleaning cycle to the test probes is necessary, and thus time cost increases to a proprietor. Moreover, the great amount of residue on the rough surface of Au bumps has been found experimentally.

SUMMARY OF THE INVENTION

It is the objective of the invention to provide a method to reduce the residual of titanium oxide and tungsten oxide remaining on metal pads of a semiconductor wafer.

It is the objective of the invention to provide a method to reduce a frequency of cleaning test probes.

In order to reach the above objectives, a method for fabricating and testing a semiconductor wafer comprises the following steps: providing a silicon substrate, multiple metal oxide semiconductor (MOS) devices in or over said silicon substrate, a first dielectric layer over said silicon substrate, a metallization structure over said first dielectric layer, wherein said metallization structure comprises a first metal layer and a second metal layer over said first metal layer, and wherein said metallization structure is connected to said multiple metal oxide semiconductor devices, a second dielectric layer between said first and second metal layers, a passivation layer over said metallization structure, over said first and second dielectric layers and over said multiple metal oxide semiconductor devices, and multiple pads over said silicon substrate, wherein said multiple pads are connected to said metallization structure, sputtering a titanium-tungsten-alloy layer on said passivation layer and on said multiple pads, sputtering a gold layer on said titanium-tungsten-alloy layer, forming a photoresist layer on said gold layer, multiple openings in said photoresist layer exposing said gold layer, electroplating multiple gold pads with a thickness of between 1 and 8.5 micrometers on said gold layer exposed by said multiple openings, removing said photoresist layer, removing said gold layer not under said multiple gold pads, etching said titanium-tungsten-alloy layer not under said multiple gold pads with an etchant containing hydrogen peroxide at a temperature of between 35 and 50 degrees C., or with an etchant containing hydrogen peroxide and with ultrasonic waves applied to said etchant, contacting multiple probe tips of a probe card with some of said multiple gold pads to probe said semiconductor wafer, cleaning said multiple probe tips of said probe card until repeating the step of said contacting said multiple probe tips with some of said multiple gold pads at greater than 100 times, and after said cleaning said probe tips of said probe card, repeating the step of said contacting said multiple probe tips with some of said multiple gold pads.

In order to reach the above objectives, a method for fabricating and testing a semiconductor wafer comprises the following steps: providing a silicon substrate, multiple metal oxide semiconductor (MOS) devices in or over said silicon substrate, a first dielectric layer over said silicon substrate, a metallization structure over said first dielectric layer, wherein said metallization structure comprises a first metal layer and a second metal layer over said first metal layer, and wherein said metallization structure is connected to said multiple metal oxide semiconductor devices, a second dielectric layer between said first and second metal layers, a passivation layer over said metallization structure, over said first and second dielectric layers and over said multiple metal oxide semiconductor devices, and multiple first pads over said silicon substrate and over said first dielectric layer, wherein said multiple first pads are connected to said metallization structure, next forming multiple metal traces over said passivation layer and on said multiple first pads, wherein said multiple metal traces comprise multiple second pads over said passivation layer, and the positions of said multiple first pads from a top perspective view are different from those of said multiple second pads, wherein said forming said multiple metal traces comprises sputtering a titanium-tungsten-alloy layer with a thickness of between 0.03 and 0.5 μm over said passivation layer and on said multiple first pads, forming a seed layer with a thickness of between 0.03 and 0.5 μm on said titanium-tungsten-alloy layer, forming a photoresist layer on said seed layer, multiple openings in said photoresist layer exposing said seed layer, forming a third metal layer with a thickness of between 1 and 30 micrometers on said seed layer exposed by said multiple openings, removing said photoresist layer, removing said seed layer not under said third metal layer, and etching said titanium-tungsten-alloy layer not under said third metal layer with an etchant containing hydrogen peroxide at a temperature of between 35 and 50 degrees C., or with an etchant containing hydrogen peroxide and with ultrasonic waves applied to said etchant, next contacting multiple probe tips of a probe card with some of said multiple second pads to probe said semiconductor wafer, next cleaning said multiple probe tips of said probe card until repeating the step of said contacting said multiple probe tips of said probe card with some of said multiple second pads at greater than 100 times, and then after said cleaning said probe tips of said probe card, repeating the step of said contacting said multiple probe tips of said probe card with some of said multiple second pads.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIGS. 2A through 2H and FIGS. 2J through 2P are cross-sectional views showing a process for fabricating multiple gold pads and electrically testing dies according to one embodiment of the present invention.

FIGS. 3A through 3F and FIGS. 3H through 3I are cross-sectional views showing a process for fabricating multiple gold bumps and electrically testing dies according to one embodiment of the present invention.

FIGS. 4A through 4J and FIGS. 4L through 4V are cross-sectional views showing a process for fabricating multiple metal traces and electrically testing dies according to one embodiment of the present invention.

FIGS. 5A through 5L and FIGS. 5N through 5P are cross-sectional views showing a process for fabricating multiple metal traces and multiple metal bumps on the metal traces, and electrically testing dies according to one embodiment of the present invention.

DETAILED DESCRIPTION OF THE INVENTION

Figure 1A:
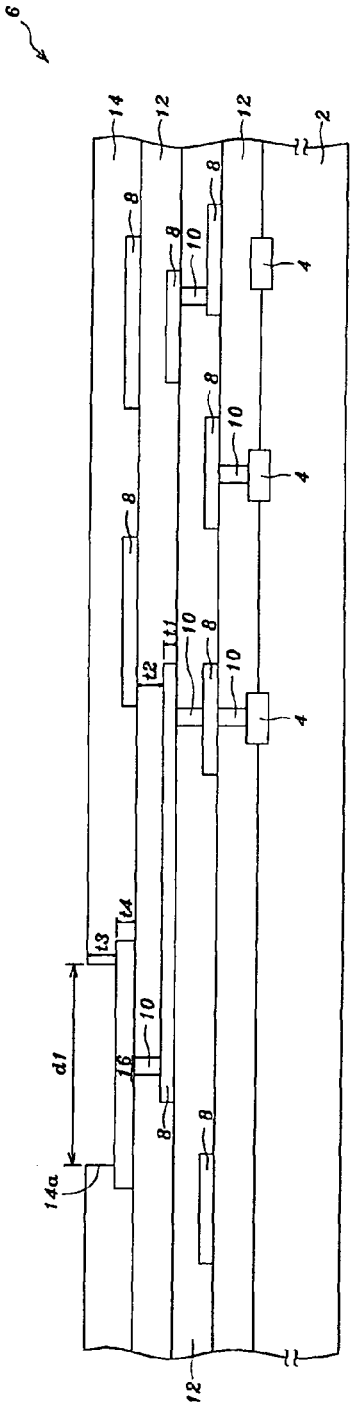
FIGS. 1A and 1B are cross-sectional views schematically showing a wafer according to the present invention.
Figure 1B:
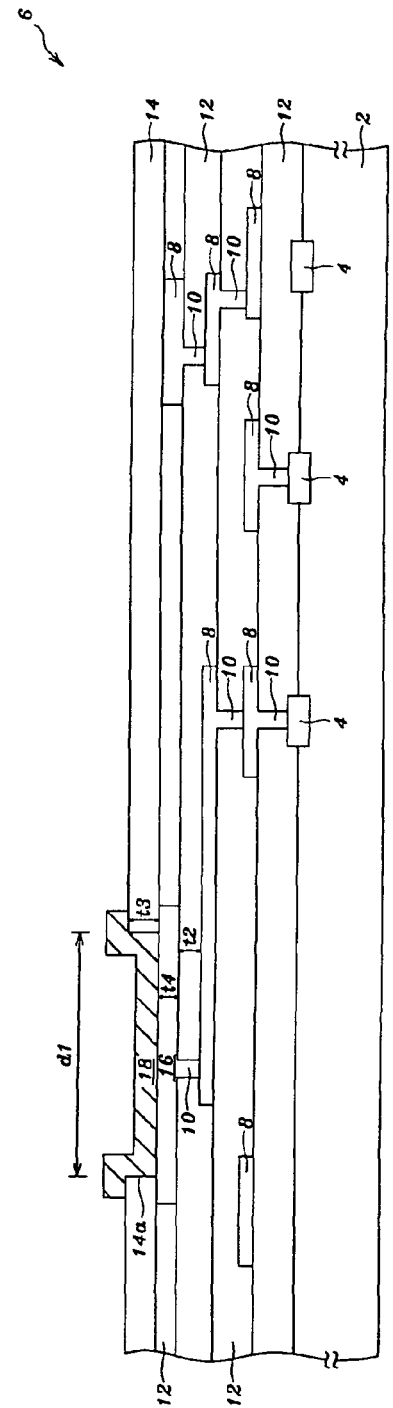

Referring to FIGS. 1A and 1B, a semiconductor wafer 6 includes a semiconductor substrate 2, multiple semiconductor devices 4, a metallization structure, multiple dielectric layers 12 and a passivation layer 14. The semiconductor substrate 2 may be a silicon substrate, a GaAs substrate or a SiGe substrate.

Referring to FIGS. 1A and 1B, the semiconductor devices 4 are formed in or over the semiconductor substrate 2. The semiconductor device 4 may be a memory device, a logic device, a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

Referring to FIGS. 1A and 1B, the metallization structure, circuit structure, is formed over the semiconductor substrate 2, connected to the semiconductor devices 4. The metallization structure comprises multiple patterned metal layers 8 having a thickness t1 of less than 3 micrometers (such as between 0.2 and 2 μm) and multiple metal plugs 10. For example, the patterned metal layers 8 and the metal plugs 10 are principally made of copper, wherein the patterned metal layer 8 is a copper-containing layer having a thickness of less than 3 micrometers (such as between 0.2 and 2 μm). Alternatively, the patterned metal layer 8 is principally made of aluminum or aluminum-alloy, and the metal plug 10 is principally made of tungsten, wherein the patterned metal layer 8 is an aluminum-containing layer having a thickness of less than 3 micrometers (such as between 0.2 and 2 μm).

Figure 1C:
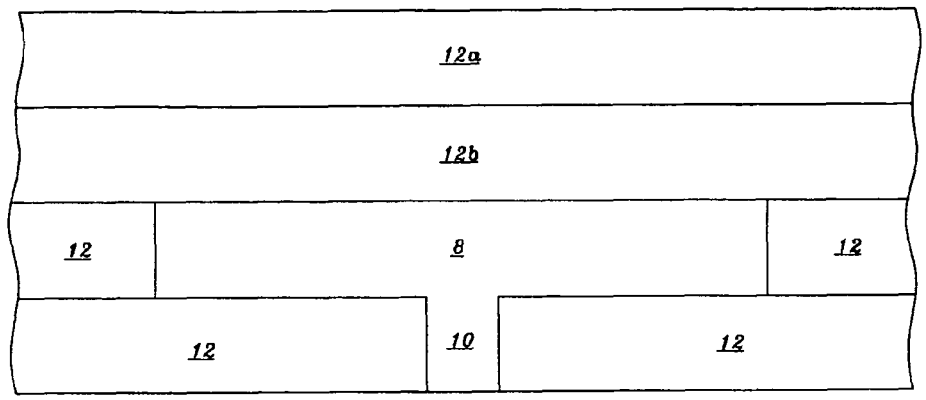
FIGS. 1C through 1L are cross-sectional views showing a process of forming a metallization structure over a semiconductor substrate.
Figure 1D:
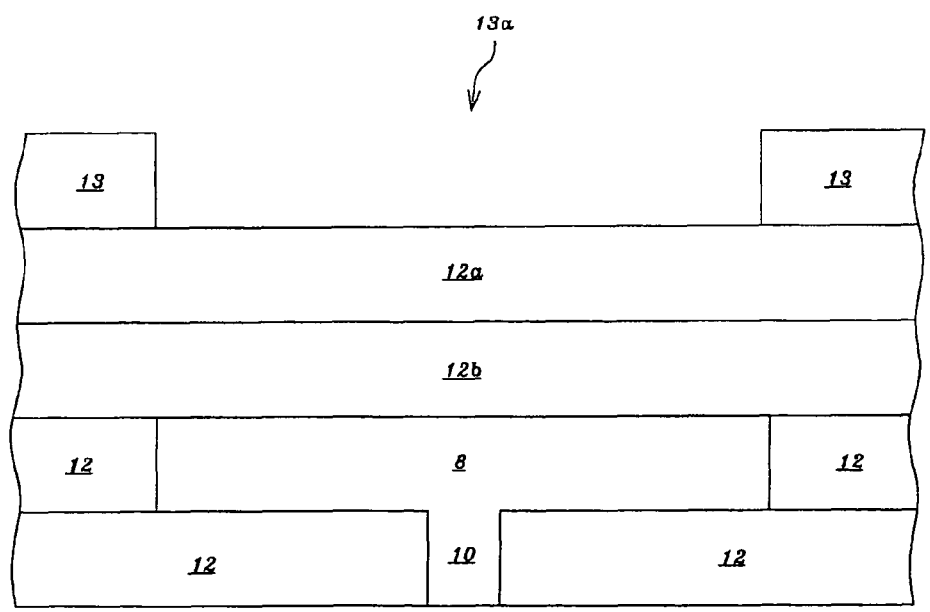
Figure 1E:
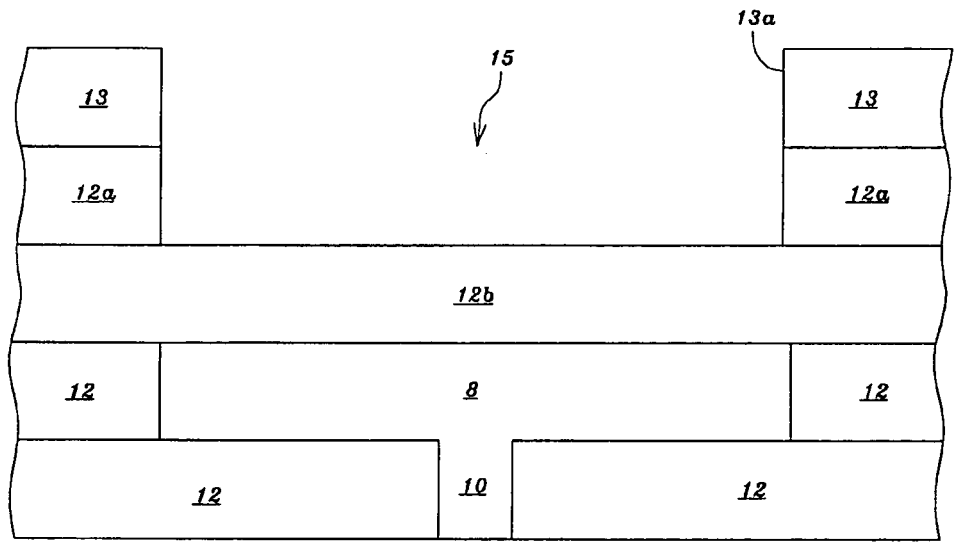
Figure 1F:
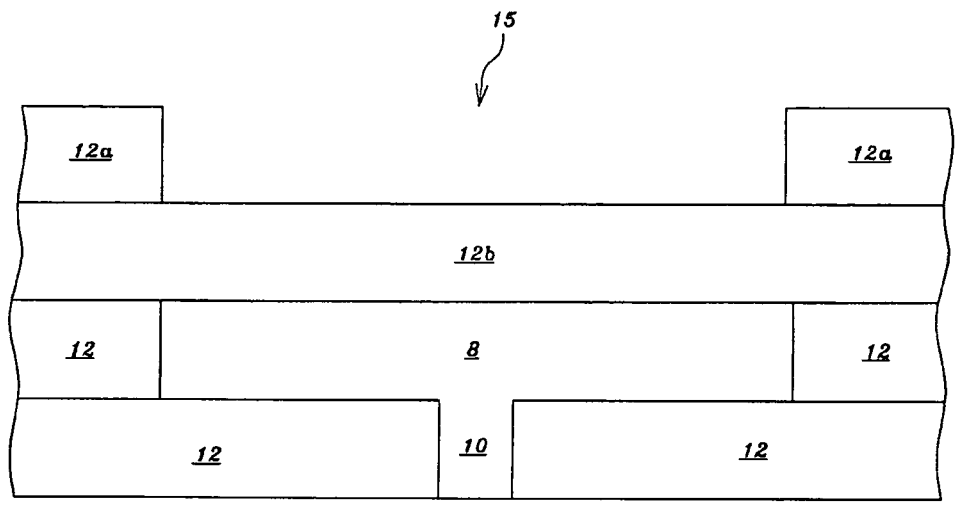
Figure 1G:
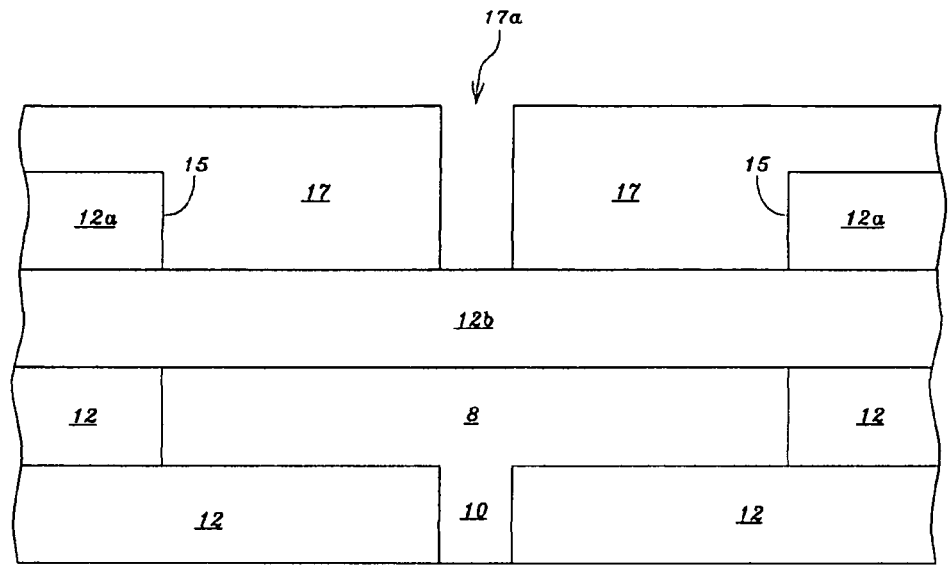
Figure 1H:
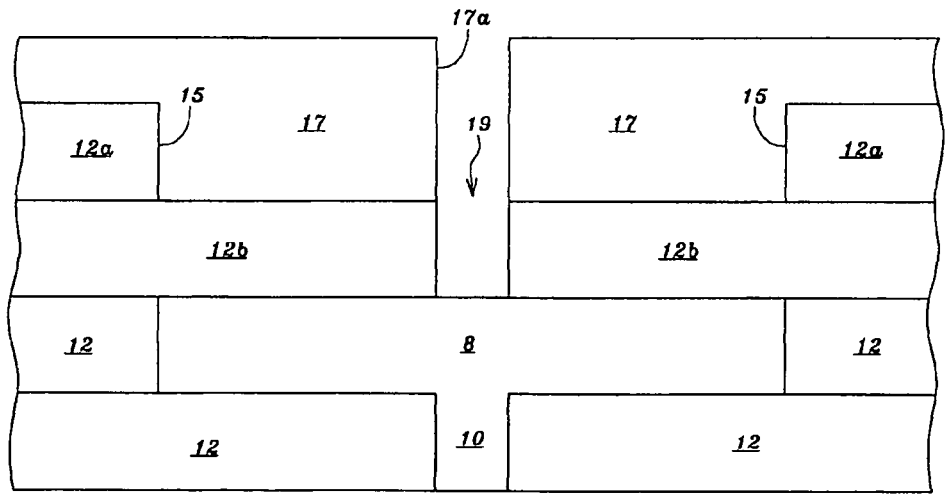
Figure 1I:
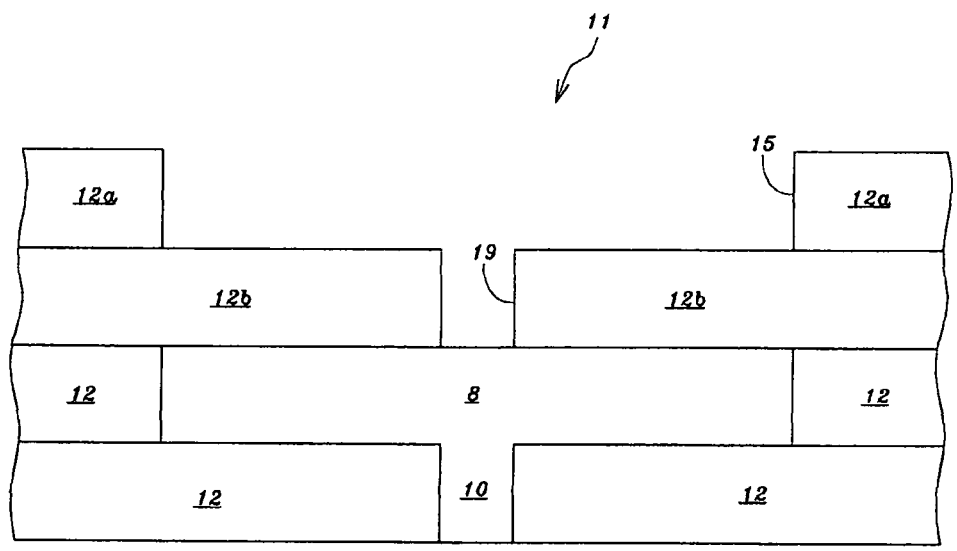
Figure 1J:
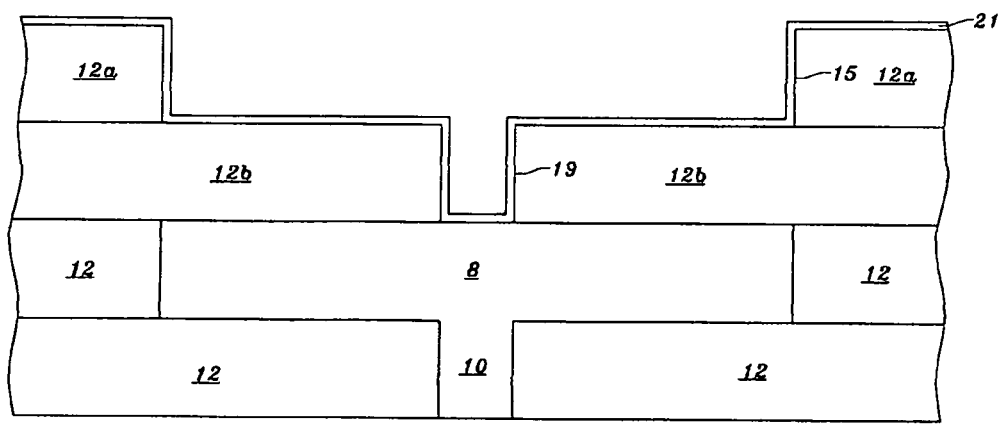
Figure 1K:
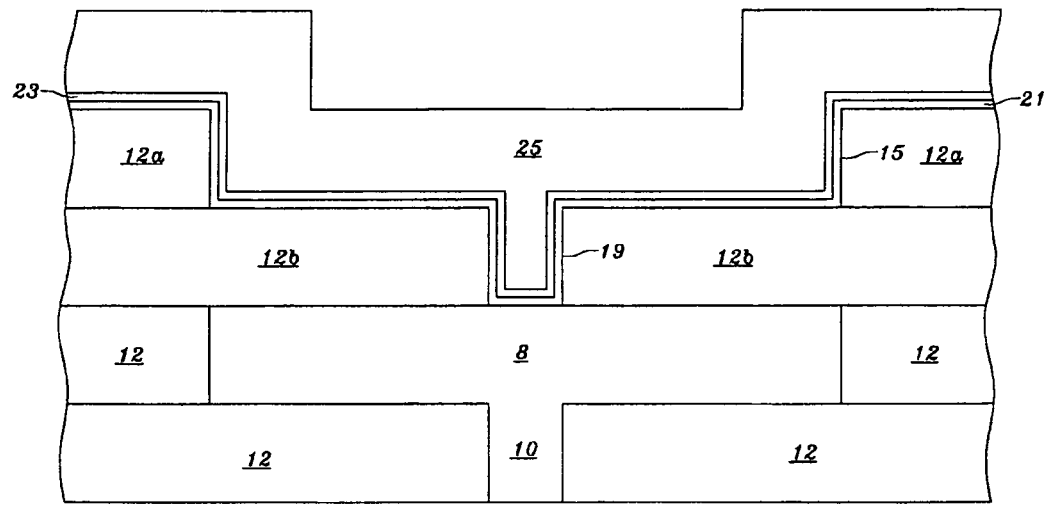
Figure 1L:
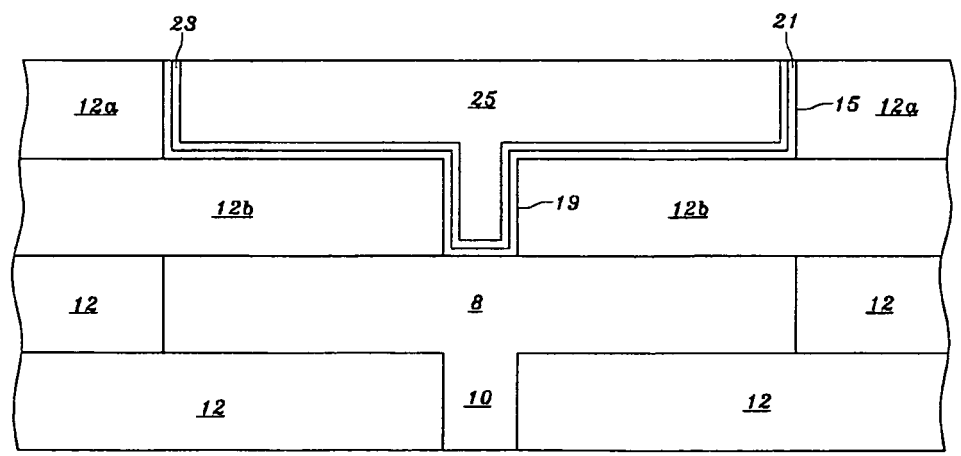

The metallization structure may be formed by a damascene process. In the following, a damascene process for forming one pattern metal layer and one metal plug are illustrated. The damascene process can be referred to as forming multiple pattern metal layers 8 and multiple metal plugs 10 in the metallization structure. Referring to FIG. 1C, multiple dielectric layers 12 in FIGS. 1A and 1B include two dielectric layers 12a and 12b. The dielectric layer 12a is formed on the dielectric layer 12b by a chemical vapor deposition (CVD) process or a spin-on coating process, wherein each of the dielectric layers 12a and 12b may be composed of a low-K oxide layer with a thickness of between 0.3 and 2 μm, and preferably of between 0.5 and 1 μm, and an oxynitride layer on the low-K oxide layer, of a low-K polymer layer with a thickness of between 0.3 and 2 μm, and preferably of between 0.5 and 1 μm, and an oxynitride layer on the low-K polymer layer, of a low-K oxide layer with a thickness of between 0.3 and 2 μm, and preferably of between 0.5 and 1 μm, and a nitride layer on the low-K oxide layer, of a low-K polymer layer with a thickness of between 0.3 and 2 μm, and preferably of between 0.5 and 1 μm, and a nitride layer on the low-K polymer layer, or of a low-K dielectric layer with a thickness of between 0.3 and 2 μm, and preferably of between 0.5 and 1 μm, and a nitride-containing layer on the low-K dielectric layer. Next, referring to FIG. 1D, a photoresist layer 13 is formed on the dielectric layer 12a, an opening 13a in the photoresist layer 13 exposing the dielectric layer 12a. Next, referring to FIG. 1E, the dielectric layer 12a under the opening 13a is removed by a dry etching method to form a trench 15 in the dielectric layer 12a exposing the dielectric layer 12b. Next, referring to FIG. 1F, after forming the trench 15 in the dielectric layer 12a, the photoresist layer 13 is removed. Next, referring to FIG. 1G, a photoresist layer 17 is formed on the dielectric layer 12a and on the dielectric layer 12b exposed by the trench 15, an opening 17a in the photoresist layer 17 exposing the dielectric layer 12b exposed by the trench 15. Next, referring to FIG. 1H, the dielectric layer 12b under the opening 17a is removed by a dry etching method to form a via 19 in the dielectric layer 12b exposing the patterned metal layer 8 of the metallization structure. Next, referring to FIG. 1I, after forming the via 19 in the dielectric layer 12b, the photoresist layer 17 is removed. Thereby, an opening 11 including the trench 15 and the via 19 is formed in the dielectric layers 12a and 12b. Next, referring to FIG. 1J, an adhesion/barrier layer 21 having a thickness of between 20 and 200 angstroms is sputtered on the patterned metal layer 8 of the metallization structure exposed by the opening 11, on the sidewalls of the opening 11 and on the top surface of the dielectric layer 12a. The material of the adhesion/barrier layer 21 may include titanium, titanium nitride, a titanium-tungsten alloy, tantalum, tantalum nitride, or a composite of the abovementioned materials. For example, the adhesion/barrier layer 21 may be formed by sputtering a tantalum layer on the metallization structure exposed by the opening 11, on the sidewalls of the opening 11 and on the top surface of the dielectric layer 12a. Alternatively, the adhesion/barrier layer 21 may be formed by sputtering a tantalum-nitride layer on the metallization structure exposed by the opening 11, on the sidewalls of the opening 11 and on the top surface of the dielectric layer 12a. Alternatively, the adhesion/barrier layer 21 may be formed by forming a tantalum-nitride layer on the metallization structure exposed by the opening 11, on the sidewalls of the opening 11 and on the top surface of the dielectric layer 12a by a chemical vapor deposition (CVD) process. Next, referring to FIG. 1K, a seed layer 23, made of copper, having a thickness of between 50 and 500 angstroms is formed on the adhesion/barrier layer 21 using a sputtering process or a chemical vapor deposition (CVD) process, and then a copper layer 25 having a thickness of between 0.5 and 5 μm, and preferably of between 1 and 2 μm, is electroplated on the seed layer 23. Next, referring to FIG. 1L, the copper layer 25, the seed layer 23 and the adhesion/barrier layer 21 outside the opening 11 in the dielectric layers 12a and 12b are removed using a chemical mechanical polishing (CMP) process until the top surface of the dielectric layer 12a is exposed to an ambient. Thereby, the patterned metal layer 8 is composed of the adhesion/barrier layer 21, the seed layer 23 and the copper layer 25 formed in the trench 15, and the metal plug 10 is composed of the adhesion/barrier layer 21, the seed layer 23 and the copper layer 25 formed in the via 19. The patterned metal layer 8 can be connected to the semiconductor device 4 through the metal plug 10 inside the dielectric layer 12, and the neighboring patterned metal layers 8 are interconnected through the metal plugs 10 inside the dielectric layer 12.

Referring to FIG. 1A, alternatively, the patterned metal layer 8 may be formed by a process including sputtering an adhesion/barrier layer with a thickness of between 500 and 1500 angstroms on an insulating layer, such as silicon oxide, next sputtering an aluminum-alloy layer, containing more than 90 wt. % of aluminum and less than 10 wt. % of copper, having a thickness between 0.2 and 2 micrometers on the adhesion/barrier layer, next sputtering an anti-reflection layer, such as a titanium-nitride layer, with a thickness of between 200 and 600 angstroms on the aluminum-alloy layer, next forming a photoresist layer on the anti-reflection layer, next patterning the photoresist layer using a photolithography process, next etching the adhesion/barrier layer, the aluminum-alloy layer and the anti-reflection layer not under the patterned photoresist layer using the patterned photoresist layer as an etching mask, and then removing the patterned photoresist layer. The material of the adhesion/barrier layer may include titanium, titanium nitride, a titanium-tungsten alloy, tantalum, tantalum nitride, or a composite of the above-mentioned materials.

Referring to FIGS. 1A and 1B, the dielectric layers 12 are located over the semiconductor substrate 2 and interposed respectively between the neighboring patterned metal layers 8, and the neighboring patterned metal layers 8 are interconnected through the metal plugs 10 inside the dielectric layer 12. The dielectric layers 12 are commonly formed by a chemical vapor deposition (CVD) process. The material of the dielectric layers 12 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), BPSG (borophosphosilicate glass), a polyarylene ether, PBO (Polybenzoxazole), or a material having a low dielectric constant (K) of between 1.5 and 3, for example. The dielectric layer 12 between the neighboring patterned metal layers 8 has a thickness t2 of less than 3 micrometers, such as between 0.3 and 3 μm or between 0.3 and 2.5 μm.

Referring to FIGS. 1A and 1B, the passivation layer 14 is formed over the semiconductor devices 4, over the metallization structure (including the metal layers 12 and the metal plugs 14) and over the dielectric layers 12. The passivation layer 14 can protect the semiconductor devices 4 and the metallization structure from being damaged by moisture and foreign ion contamination. In other words, mobile ions (such as sodium ion), transition metals (such as gold, silver and copper) and impurities can be prevented from penetrating through the passivation layer 14 to the semiconductor devices 4, such as transistors, polysilicon resistor elements and poly-silicon-polysilicon capacitor elements, and to the metallization structure.

The passivation layer 14 is commonly made of silicon oxide (such as $SiO_2$), silicon oxynitride, silicon nitride (such as $Si_3N_4$) or PSG (phosphosilicate glass). The passivation layer 14 on a pad 16 of the metallization structure and on the topmost metal layer 8 of the metallization structure commonly has a thickness t3 of more than 0.3 μm, such as between 0.3 and 2 μm or between 0.3 and 1.5 μm. In a preferred case, the silicon nitride layer in the passivation layer 14 has a thickness of more than 0.3 μm. Ten methods for depositing the passivation layer 14 are described as below.

In a first method, the passivation layer 14 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 14 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 14 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 14 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 14 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 14 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 µm on the insulating layer using a CVD method.

In a seventh method, the passivation layer 14 is formed by optionally depositing a first silicon oxynitride layer with a thickness of between 0.05 and 0.15 µm using a CVD method, next depositing a silicon oxide layer with a thickness of between 0.2 and 1.2 µm on the first silicon oxynitride layer using a CVD method, next optionally depositing a second silicon oxynitride layer with a thickness of between 0.05 and 0.15 µm on the silicon oxide layer using a CVD method, next depositing a silicon nitride layer with a thickness of between 0.2 and 1.2 µm on the second silicon oxynitride layer or on the silicon oxide using a CVD method, next optionally depositing a third silicon oxynitride layer with a thickness of between 0.05 and 0.15 µm on the silicon nitride layer using a CVD method, and then depositing a silicon oxide layer with a thickness of between 0.2 and 1.2 µm on the third silicon oxynitride layer or on the silicon nitride layer using a CVD method.

In a eighth method, the passivation layer 14 is formed by depositing a first silicon oxide layer with a thickness of between 0.2 and 1.2 µm using a CVD method, next depositing a second silicon oxide layer with a thickness of between 0.5 and 1 µm on the first silicon oxide layer using a spin-coating method, next depositing a third silicon oxide layer with a thickness of between 0.2 and 1.2 µm on the second silicon oxide layer using a CVD method, next depositing a silicon nitride layer with a thickness of between 0.2 and 1.2 µm on the third silicon oxide layer using a CVD method, and then depositing a fourth silicon oxide layer with a thickness of between 0.2 and 1.2 µm on the silicon nitride layer using a CVD method.

In a ninth method, the passivation layer 14 is formed by depositing a first silicon oxide layer with a thickness of between 0.5 and 2 µm using a HDP-CVD method, next depositing a silicon nitride layer with a thickness of between 0.2 and 1.2 µm on the first silicon oxide layer using a CVD method, and then depositing a second silicon oxide layer with a thickness of between 0.5 and 2 µm on the silicon nitride using a HDP-CVD method.

In a tenth method, the passivation layer 14 is formed by depositing a first silicon nitride layer with a thickness of between 0.2 and 1.2 µm using a CVD method, next depositing a silicon oxide layer with a thickness of between 0.2 and 1.2 µm on the first silicon nitride layer using a CVD method, and then depositing a second silicon nitride layer with a thickness of between 0.2 and 1.2 µm on the silicon oxide layer using a CVD method.

An opening 14a in the passivation layer 14 exposes a pad 16 of the metallization structure used to input or output signals or to be connected to a power source or a ground reference. In practical, a plurality of the openings 14a can be formed in the passivation layer 14, exposing a plurality of the pads 16, respectively. The pad 16 may have a thickness t4 of between 0.4 and 3 µm or between 0.2 and 2 µm, and the pad 16 is connected to the semiconductor device 4 through the metal layers 8 and the metal plugs 10. For example, the pad 16 may be composed of a sputtered aluminum layer or a sputtered aluminum-copper-alloy layer with a thickness of between 0.2 and 2 µm. Alternatively, the pad 16 may include an electroplated copper layer with a thickness of between 0.2 and 2 µm, and a barrier layer, such as tantalum or tantalum nitride, on a bottom surface and side walls of the electroplated copper layer.

Therefore, the pad 16 can be an aluminum pad, principally made of sputtered aluminum with a thickness of between 0.2 and 2 µm. Alternatively, the pad 16 can be a copper pad, principally made of electroplated copper with a thickness of between 0.2 and 2 µm.

The opening 14a may have a transverse dimension d1, from a top view, of between 0.5 and 20 µm or between 20 and 200 µm. The shape of the opening 14a from a top view may be a circle, and the diameter of the circle-shaped opening 14a may be between 0.5 and 20 µm or between 20 and 200 µm. Alternatively, the shape of the opening 14a from a top view may be a square, and the width of the square-shaped opening 14a may be between 0.5 and 20 µm or between 20 and 200 µm. Alternatively, the shape of the opening 14a from a top view may be a polygon, such as hexagon or octagon, and the polygon-shaped opening 14a may have a width of between 0.5 and 20 µm or between 20 and 200 µm. Alternatively, the shape of the opening 14a from a top view may be a rectangle, and the rectangle-shaped opening 14a may have a shorter width of between 0.5 and 20 µm or between 20 and 200 µm. Further, there may be some of the semiconductor devices 4 under the pad 16 exposed by the opening 14a. Alternatively, there may be no active devices under the pad 16 exposed by the opening 14a.

Referring to FIG. 1B, a metal cap 18 having a thickness of between 0.4 and 5 µm can be optionally formed on the pad 16 exposed by the opening 14a in the passivation layer 14 to prevent the pad 16 from being oxidized or contaminated. In practical, a plurality of the metal caps 18 can be formed on a plurality of the pads 16, respectively. The material of the metal cap 18 may include aluminum, an aluminum-copper alloy, an Al—Si—Cu alloy or gold. For example, when the pad 16 is a copper pad, the metal cap 18 including aluminum is used to protect the copper pad 16 from being oxidized. The metal cap 18 may comprise a barrier layer having a thickness of between 0.01 and 0.5 µm on the pad 16. The barrier layer may be made of titanium, titanium nitride, titanium-tungsten alloy, tantalum, tantalum nitride, chromium or nickel.

For example, the metal cap 18 may include a tantalum-containing layer, such as tantalum layer or tantalum-nitride layer, having a thickness of between 0.01 and 0.5 µm on the pad 16, principally made of electroplated copper, exposed by the opening 14a, and an aluminum-containing layer, such as aluminum layer or aluminum-alloy layer, having a thickness of between 0.4 and 3 µm on the tantalum-containing layer. Alternatively, the metal cap 18 may include a titanium-containing layer, such as titanium layer or titanium-tungsten-alloy layer, having a thickness of between 0.01 and 0.7 µm, and preferably of between 0.03 and 0.35 µm, on the pad 16, principally made of electroplated copper, exposed by the opening 14a, a sputtered gold layer having a thickness of between 0.03 and 1 µm, and preferably of between 0.05 and 0.2 µm, on the titanium-containing layer, and an electroplated gold layer having a thickness of between 1 and 5 µm on the sputtered gold layer. Alternatively, the metal cap 18 may be a gold layer having a thickness of between 0.4 and 5 µm on the pad 16, principally made of electroplated copper, exposed by the opening 14a. Alternatively, the metal cap 18 may include a nickel layer having a thickness of between 0.3 and 2 µm on the pad 16, principally made of electroplated copper, exposed by the opening 14a, and a gold layer having a thickness of between 0.4 and 3 µm on the nickel layer.

The semiconductor substrate 2, the metallization structure, the dielectric layer 12, the passivation layer 14 and the pad 16 are described in the above paragraphs. Below, the integrated circuit (IC) scheme 20 under the passivation layer 14 may be any one of the structures shown in FIGS. 1A and 1B under the passivation layer 14; the IC scheme 20 represents the combination of the semiconductor substrate 2, the semiconductor devices 4, the metallization structure (including the metal layers 8 and the metal plugs 10) and the dielectric layers 12 in FIG. 1A and FIG. 1B.

EMBODIMENT 1

Figure 2A:
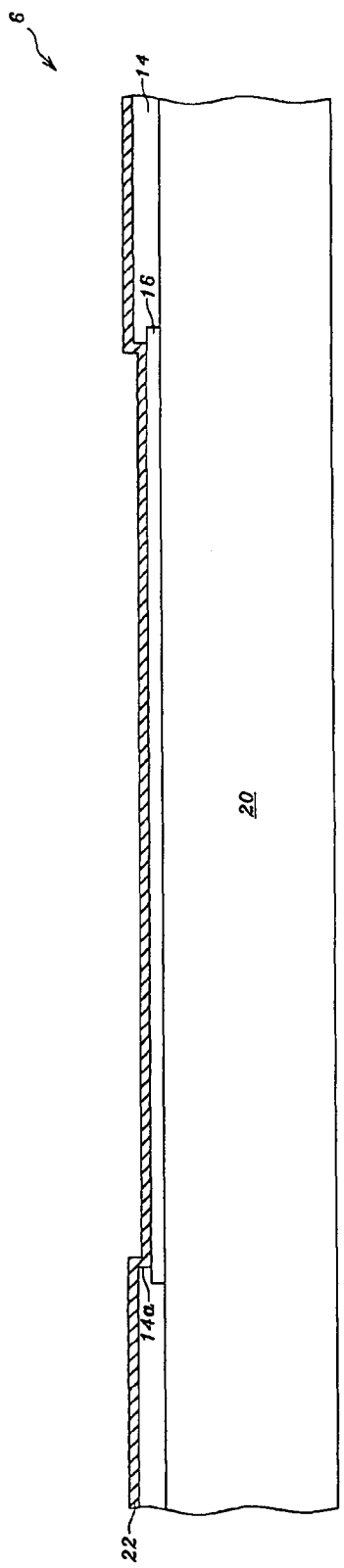

Referring to FIG. 2A, a titanium-tungsten-alloy layer 22 having a thickness of between 0.03 and 0.7 μm, and preferably of between 0.03 and 0.35 μm, can be formed on the passivation layer 14 and on the pads 16 exposed, respectively, by the openings 14a. Only one of the pads 16 and only one of the openings 14a are shown. For example, the titanium-tungsten-alloy layer 22 having a thickness of between 0.02 and 0.5 μm can be sputtered on the passivation layer 14 and on the pads 16, principally made of aluminum, exposed, respectively, by the openings 14a. Alternatively, the titanium-tungsten-alloy layer 22 having a thickness of between 0.02 and 0.5 μm can be sputtered on the passivation layer 14 and on the pads 16, principally made of copper, exposed, respectively, by the openings 14a. The titanium-tungsten-alloy layer 22 is treated as an adhesion/barrier layer to prevent the occurrence of interdiffusion between metal layers and to provide good adhesion between the metal layers.

Figure 2B:
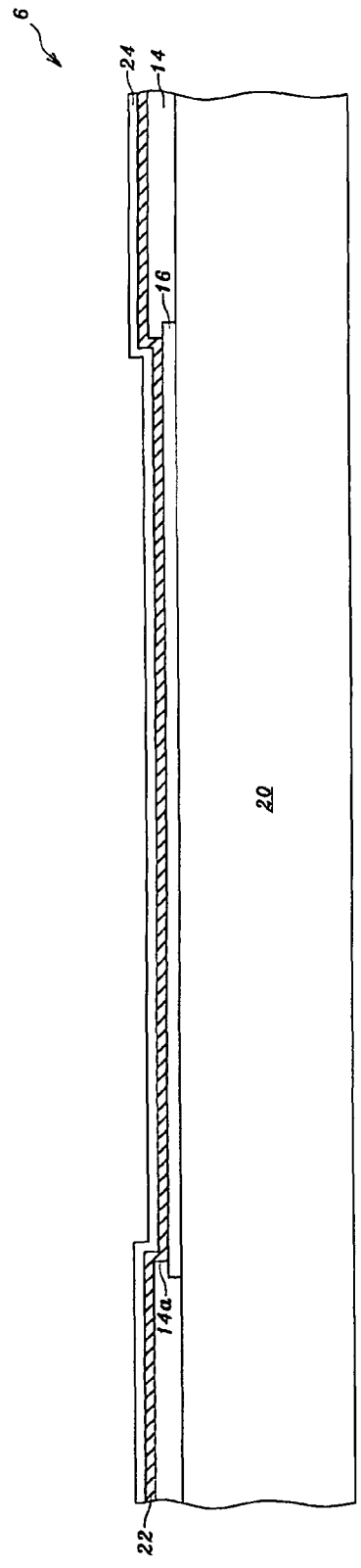

Referring to FIG. 2B, a seed layer 24, made of gold, having a thickness of between 0.02 and 0.5 μm, and preferably of between 0.02 and 0.3 μm, can be sputtered on the titanium-tungsten-alloy layer 22. Alternatively, the seed layer 24 can be formed by a vapor deposition method, an electroless plating method or a physical vapor deposition (PVD) method. The seed layer 24 is beneficial to electroplating a metal layer thereon.

Figure 2C:
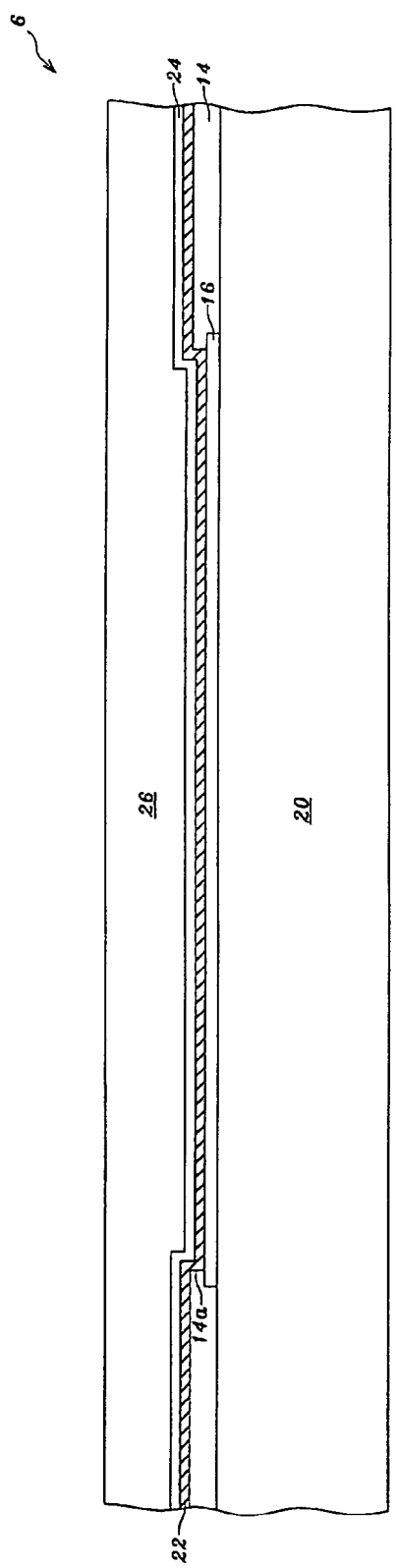
Figure 2D:
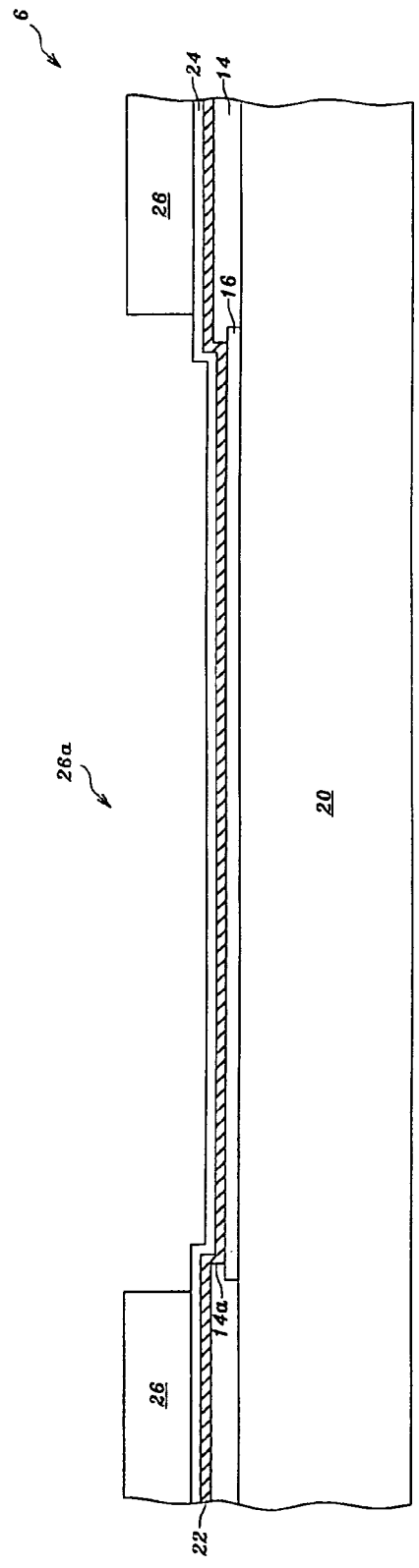

Referring to FIG. 2C, a photoresist layer 26, such as positive-type photoresist layer, having a thickness of between 2 and 10 micrometers is spin-on coated on the seed layer 24. Referring to FIG. 2D, the photoresist layer 26 is patterned with the processes of exposure and development to form openings 26a (only one of them is shown) in the photoresist layer 26 exposing the seed layer 24. A 1× stepper or 1× contact aligner can be used to expose the photoresist layer 26 during the process of exposure.

For example, the photoresist layer 26 can be formed by spin-on coating a positive-type photosensitive polymer layer having a thickness of between 2 and 10 μm on the seed layer 24, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 24 with an $O_2$ plasma or a plasma containing fluorine of below 200 PPM and oxygen, such that the photoresist layer 26 can be patterned with the openings 26a in the photoresist layer 26 exposing the seed layer 24.

Figure 2E:
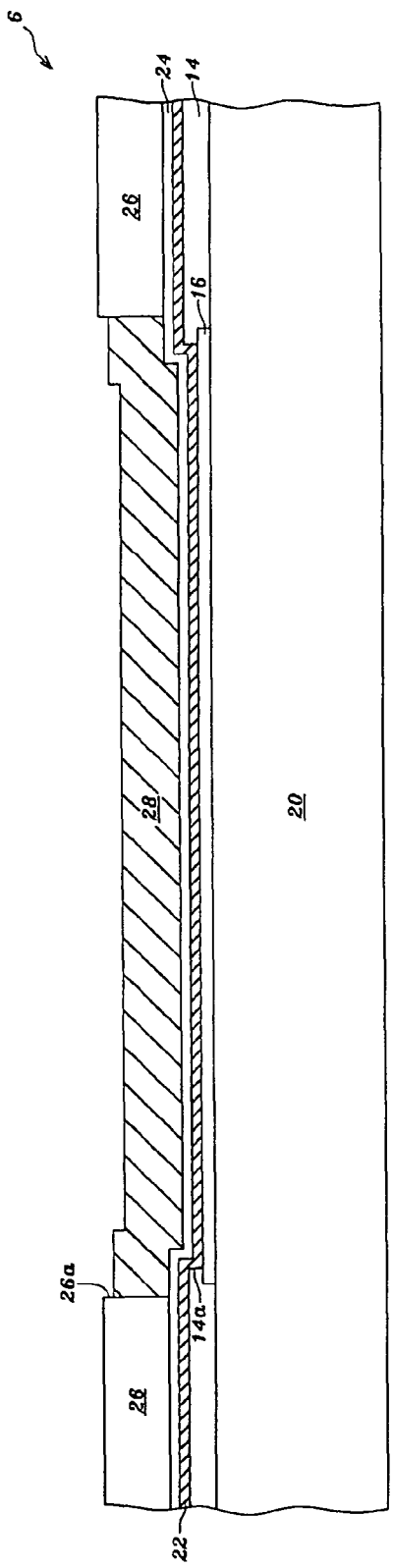

Referring to FIG. 2E, multiple gold pads 28 (only one of them is shown) having a thickness of between 1 and 8.5 micrometers, and preferably of between 2 and 5 μm, are electroplated, respectively, on the seed layer 24 exposed by the openings 26a.

For example, the gold pads 28 may be formed by electroplating a gold layer having a thickness of between 1 and 8.5 μm, and preferably of between 2 and 5 μm, on the seed layer 24, made of gold, exposed by the openings 26a with an electroplating solution containing gold of between 1 and 20 grams per litter (g/L), and preferably between 5 and 15 g/L, and sulfite ion 0 of between 10 and 120 g/L, and preferably between 30 and 90 g/L. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold layer are described below:

1. The above-mentioned electroplating solution used to electroplate the gold layer on the seed layer 24 exposed by the openings 26a can be at a temperature of between 30 and 70° C., and preferably between 45 and 65° C.

2. The above-mentioned electroplating solution can be used to electroplate the gold layer on the seed layer 24 exposed by the openings 26a through an electric current with a current density at between 1 and 10 $mA/cm^2$, and preferably between 4 and 6 $mA/cm^2$.

3. The above-mentioned electroplating solution may have a pH value of between 6 and 9, and preferably between 7 and 8.5, to electroplate the gold layer on the seed layer 24 exposed by the openings 26a.

Alternatively, the gold pads 28 may be formed by electroplating a gold layer having a thickness between 1 and 8.5 μm, and preferably between 2 and 5 μm, on the seed layer 24, made of gold, exposed by the openings 26a with an electroplating solution containing cyanide.

Figure 2F:
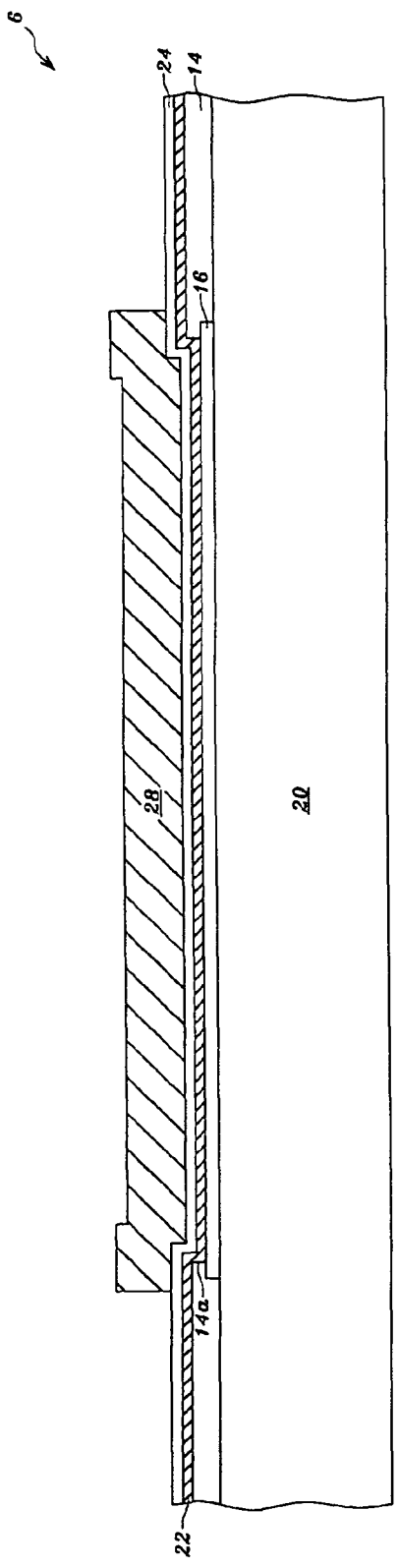

Referring to FIG. 2F, after the gold pads 28 are formed, most of the photoresist layer 26 can be removed using an organic solution with amide. However, some residuals from the photoresist layer 26 could remain on the gold pads 28 and on the seed layer 24. Thereafter, the residuals can be removed from the gold pads 28 and from the seed layer 24 with a plasma, such as $O_2$ plasma or plasma containing fluorine of below 200 PPM and oxygen.

Referring to FIG. 2G, the seed layer 24 not under the gold pads 28 can be removed with a dry etching method or a wet etching method. As to the wet etching method, the seed layer 24, made of gold, can be etched with an iodine-containing solution, such as solution containing potassium iodide. As to the dry etching method, the seed layer 24, made of gold, can be removed with an Ar sputtering etching process.

Referring to FIG. 2H, the titanium-tungsten-alloy layer 22 not under the gold pads 28 can be removed with a wet etching method. Two methods for removing the titanium-tungsten-alloy layer 22 not under the gold pads 28 are described as below:

In a first method, the semiconductor wafer 6 shown in FIG. 2G can be immersed in an etchant containing between 15 wt. % and 50 wt. % of hydrogen peroxide, such as 30 wt. % of hydrogen peroxide, at a temperature of between 35 and 50 degrees C., and preferably of between 38 and 42 degrees C., such as 40 degrees C., for a time of between 3 and 20 minutes, and preferably of between 5 and 15 minutes, to etch the titanium-tungsten-alloy layer 22 not under the gold pads 28 with circulation flow. Alternatively, the semiconductor wafer 6 shown in FIG. 2G can be immersed in an etchant containing between 15 wt. % and 50 wt. % of hydrogen peroxide, such as 30 wt. % of hydrogen peroxide, at a temperature of between 43 and 47 degrees C., and preferably of 45 degrees C., for a time of between 3 and 20 minutes, and preferably of between 5 and 15 minutes, to etch the titanium-tungsten-alloy layer 22 not under the gold pads 28 with circulation flow. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The method has a high etching rate and can improve the etching behavior to prevent the titanium oxide and tungsten oxide from drifting onto the gold pads 28 with the hydrodynamic circulation flow. Therefore, the frequency of probe cleaning during a chip probing (CP) test and of a CP re-test can be reduced due to the gold pads 28 having clean surface.

In a second method, the semiconductor wafer 6 shown in FIG. 2G can be immersed in an etchant containing between 15 wt. % and 50 wt. % of hydrogen peroxide, such as 30 wt. % of hydrogen peroxide, at a temperature of between 23 and 27 degrees C., and preferably of 25 degrees C., for a time of between 10 and 50 minutes, and preferably of between 15 and 40 minutes, to etch the titanium-tungsten-alloy layer 22 not under the gold pads 28 with circulation flow, and ultrasonic waves are applied to the etchant in the entire etching process or in a selected time interval between 5 and 10 minutes at the final period of the etching process. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The ultrasonic waves having a fixed frequency selected from a frequency range between 28K Hz and 120K Hz are used here. The ultrasonic waves have a power of between 1.0 KW and 2.0 KW, and preferably of 1.5 KW. The method can prevent the titanium oxide and tungsten oxide from drifting onto the gold pads 28 with the hydrodynamic circulation flow. Therefore, the frequency of probe cleaning during a chip probing (CP) test and of a CP re-test can be reduced due to the gold pads 28 having clean surface.

Multiple undercuts 31 are formed under the seed layer 24 when the titanium-tungsten-alloy layer 22 not under the gold pads 28 is removed using a wet etching method. The titanium-tungsten-alloy layer 22 under the gold pads 28 has a first sidewall recessed from a second sidewall of the seed layer 24, wherein a distance d2 between the first sidewall and the second sidewall is between 0.3 and 2 micrometers.

Thereby, in the present invention, the gold pads 28 can be formed, respectively, over the pads 16, such as aluminum pads or copper pads, exposed by the openings 14a and the titanium oxide and tungsten oxide, remaining on the gold pads 28, can be reduced.

Figure 2I:
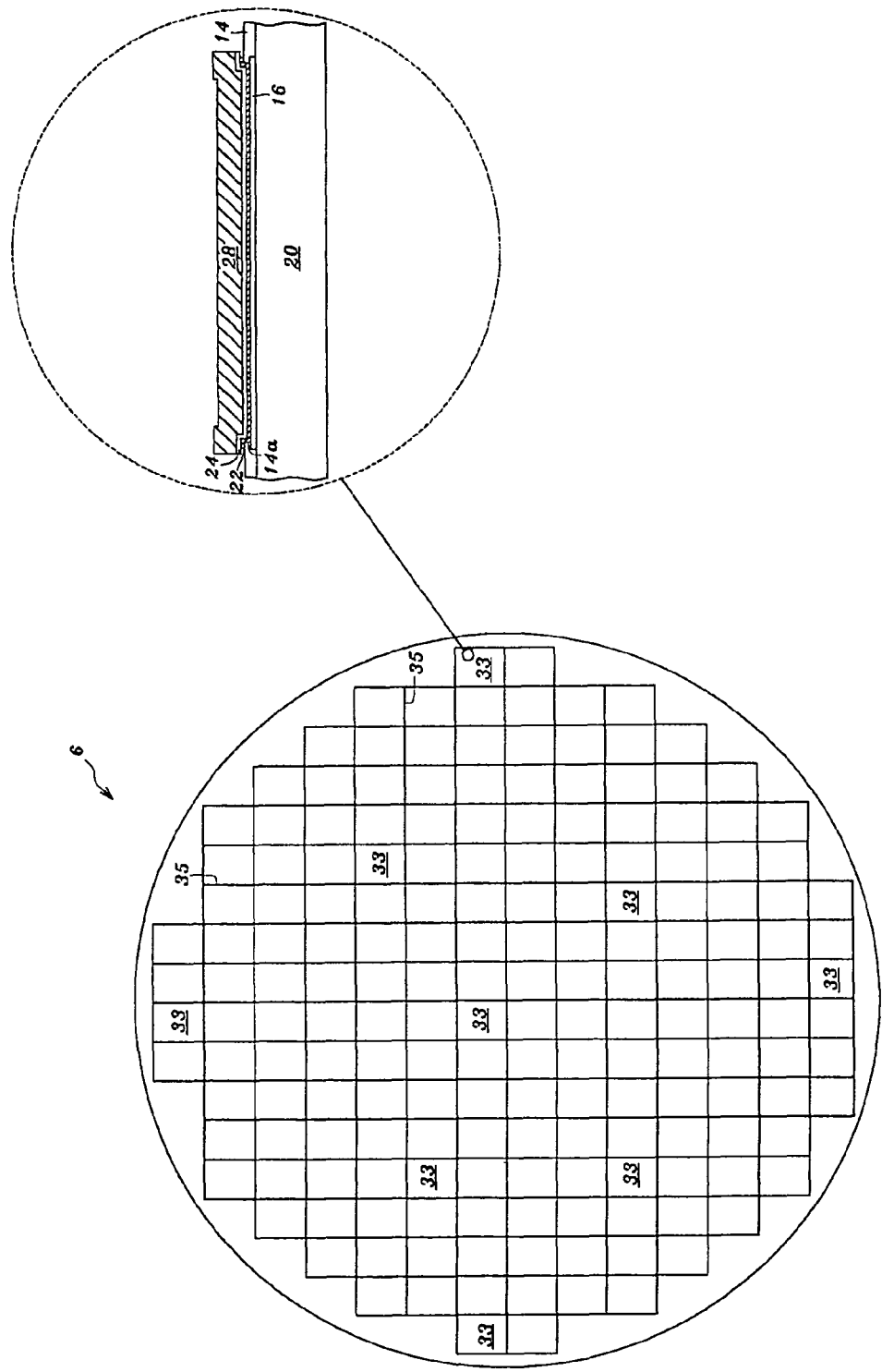
FIG. 2I is a top view showing a semiconductor wafer with multiple gold pads.

Referring to FIG. 2I, the semiconductor wafer 6 includes multiple dies 33 with scribe lines 35 between neighboring two of the dies 33. In the following wafer dicing process, the semiconductor wafer 6 can be cut along the scribe lines 35 to separate the dies 33. Each of the dies 33 may have the gold pads 28, respectively, over the pads 16 exposed by the openings 14a.

Figure 2J:
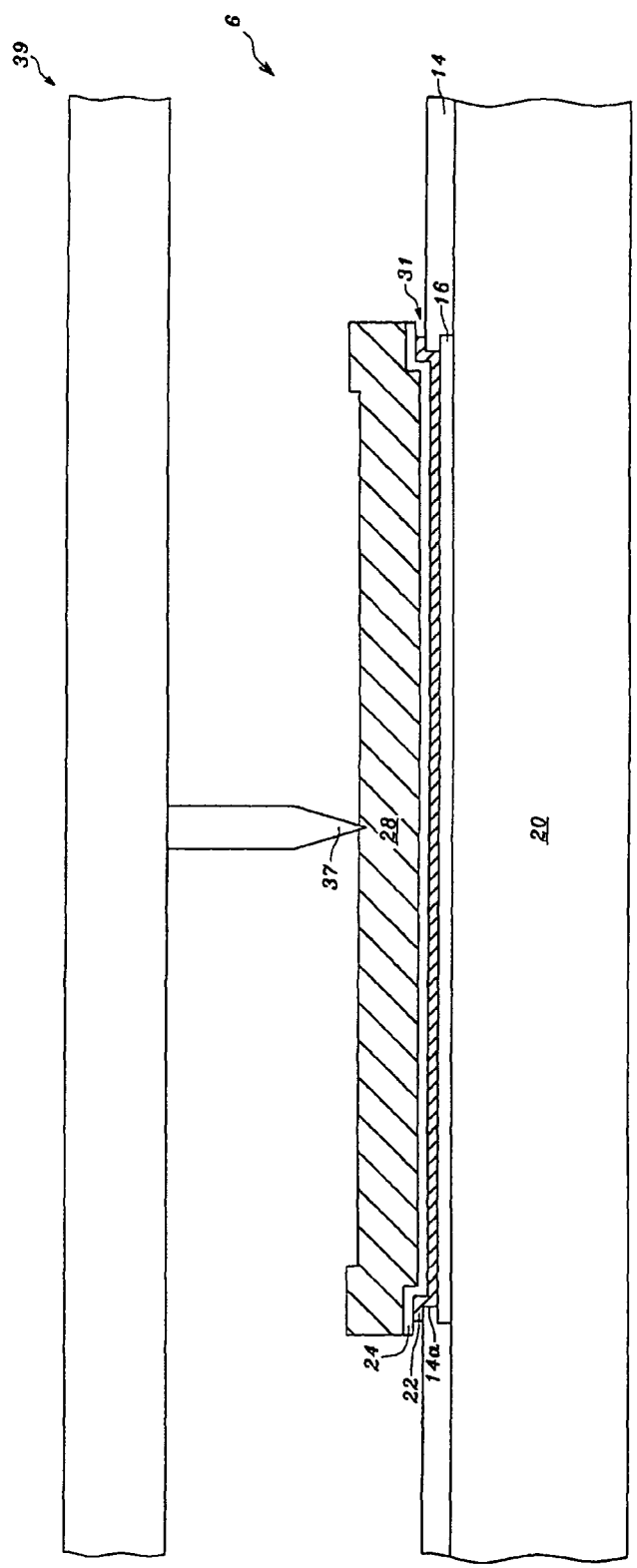

Referring to FIGS. 2I and 2J, after etching the titanium-tungsten-alloy layer 22 not under the gold pads 28, a chip probing (CP) test can be performed to electrically test all dies 33 of the semiconductor wafer 6 shown in FIG. 2H by contacting multiple probe tips 37 of a probe card 39 with some of the gold pads 28 of the semiconductor wafer 6, in sequence, until the probe tips 37 of the probe card 39 have contacted with the entire gold pads 28 provided by the semiconductor wafer 6. The probe tips 37 can contact with the entire gold pads 28 provided by one of the dies 33 of the semiconductor wafer 6 once, or the probe tips 37 can contact with the entire gold pads 28 provided by at least two of the dies 33 of the semiconductor wafer 6 once. The probe card 39 can be a vertical probe card, that is, the probe tips 37 can vertically contact with top surfaces of the gold pads 28. The material of the probe tips 37 may include tungsten or rhenium.

Therefore, all dies 33 of the semiconductor wafer 6 can be electrically tested by contacting the probe tips 37 of the probe card 39 with the entire gold pads 28 provided by one or more than one of the dies 33 once, until the probe tips 37 of the probe card 39 have contacted with the entire gold pads 28 provided by the semiconductor wafer 6. The electrically testing process comprises following steps:

Step 1: the probe tips 37 of the probe card 39 probe the entire gold pads 28 provided by one or more than one of the dies 33 of the semiconductor wafer 6 to electrically test the probed die or dies 33;

Step 2: the probe tips 37 of the probe card 39 probe the entire gold pads 28 provided by another one or more than another one of the dies 33 of the semiconductor wafer 6 to electrically test the probed die or dies 33;

Step 3: the probe tips 37 of the probe card 39 are cleaned until the probe tips 37 probe the gold pads 28 provided by the semiconductor wafer 6 at greater than 100 times, 150 times or even 200 times for electrically testing the respective dies 33 of the semiconductor wafer 6;

Step 4: after cleaning the probe tips 37 of the probe card 39, the probe tips 37 of the probe card 39 probe the gold pads 28 provided by the other untested dies 33 of the semiconductor wafer 6; and Step 5: repeating the step 3 and step 4 until all of the dies 33 of the semiconductor wafer 6 have been electrically tested using the probe card 39.

The probe tips 37 of the probe card 39 may be cleaned by a cleaning sheet to remove metal oxide, such as titanium oxide or tungsten oxide, adhered to the probe tips 37.

In the present invention, the residual of titanium oxide and tungsten oxide remaining on the gold pads 28 of the semiconductor wafer 6 can be reduced using the two above-mention methods for removing the titanium-tungsten-alloy layer 22 not under the gold pads 28. Thereby, the probe tips 37 of the probe card 39 should be cleaned only until the probe tips 37 of the probe card 39 contact with the gold pads 28 provided by the semiconductor wafer 6 at greater than 100 times, 150 times or even 200 times. The invention can reduce the frequency of cleaning the probe tips 37 on the probe card 39 during a chip probing (CP) test and reduce the frequency of a CP re-test.

After the chip probing (CP) test, the semiconductor wafer 6 can be cut along the scribe lines 35 into multiple individual semiconductor chips 33, integrated circuit chips.

Referring to FIGS. 2K and 2L, a polymer layer 30 can be formed on the passivation layer 14, and multiple openings 30a are formed in the polymer layer 30 by patterning the polymer layer 30 to expose the pads 16 exposed by the openings 14a, respectively. Only one of the pads 16 and only one of the openings 30a are shown. In a case, the polymer layer 30 covers peripheral regions of each pads 16 exposed by the openings 14a, respectively, and covers the passivation layer 14, each openings 30a in the polymer layer 30 exposing center regions of each pads 16 exposed by the openings 14a, respectively, as shown in FIG. 2K, wherein the peripheral regions surround the center regions, respectively. In this type, the polymer layer 30 covers sidewalls of the openings 14a. In another case, each openings 30a shown in FIG. 2L may expose some regions of a top surface of the passivation layer 14 surrounding the center regions of each pads 16, respectively, in addition to exposing each pads 16, respectively, and the polymer layer 30 is on other regions of the top surface of the passivation layer 14 surrounding the regions of the top surface of the passivation layer 14, respectively, exposed by the openings 30a.

The material of the polymer layer 30 may include benzocyclobutane (BCB), polyimide (PI), polyurethane, epoxy resin, a parylene-based polymer, a solder-mask material, an elastomer, or a porous dielectric material. The polymer layer 30 has a thickness t5 of between 3 and 25 μm.

The polymer layer 30 can be formed by a spin-on coating process, a lamination process or a screen-printing process. Below, the process of forming a patterned polymer layer 30 is exemplified with the case of spin-on coating a polyimide layer on the passivation layer 14 and then patterning the polyimide layer. Alternatively, the polymer layer 30 can be formed by spin-on coating a layer of benzocyclobutane, polyurethane, epoxy resin, a parylene-based polymer, a solder-mask material, an elastomer or a porous dielectric material on the passivation layer 14 and then patterning the layer.

For example, the polymer layer 30 can be formed by spin-on coating a negative-type photosensitive polyimide layer, containing ester-typer precursor, having a thickness of between 6 and 50 µm on the passivation layer 14 and on the pads 16 exposed by the openings 14a, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings in the exposed polyimide layer exposing the pads 16, respectively, then curing or heating the developed polyimide layer at a peak temperature of between 180 and 400° C. for a time of between 20 and 150 minutes in a nitrogen ambient or in an oxygen-free ambient, the cured polyimide layer having a thickness of between 3 and 25 µm, and then removing the residual polymeric material or other contaminants from the upper surface of the pads 16 exposed by the polyimide openings with an $O_2$ plasma or a plasma containing fluorine of below 200 PPM and oxygen, such that the polymer layer 30 can be patterned with multiple openings 30a in the polymer layer 30 exposing the pads 16, respectively. For example, the developed polyimide layer can be cured or heated at a temperature between 180 and 250° C. for a time of between 20 and 150 minutes in a nitrogen ambient or in an oxygen-free ambient. Alternatively, the developed polyimide layer can be cured or heated at a temperature between 250 and 290° C. for a time of between 20 and 150 minutes in a nitrogen ambient or in an oxygen-free ambient. Alternatively, the developed polyimide layer can be cured or heated at a temperature between 290 and 400° C. for a time of between 20 and 150 minutes in a nitrogen ambient or in an oxygen-free ambient.

Figure 2M:
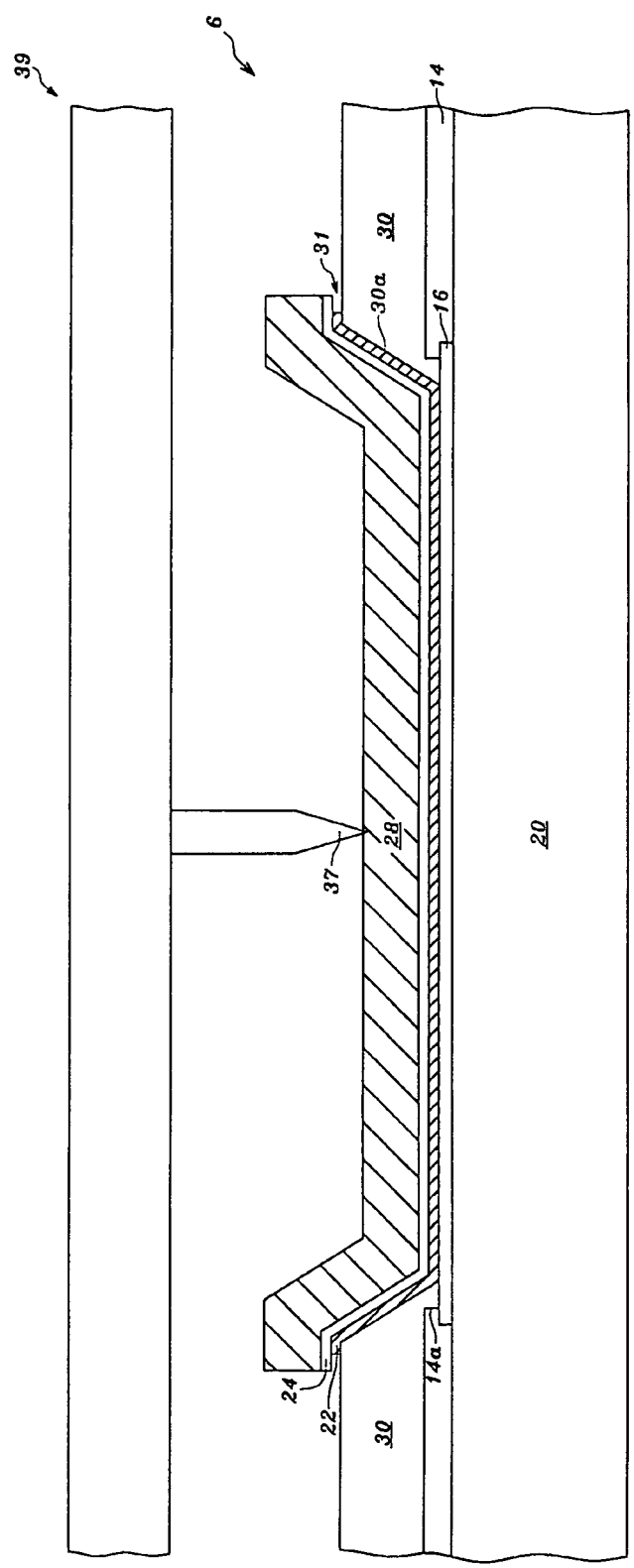
Figure 2N:
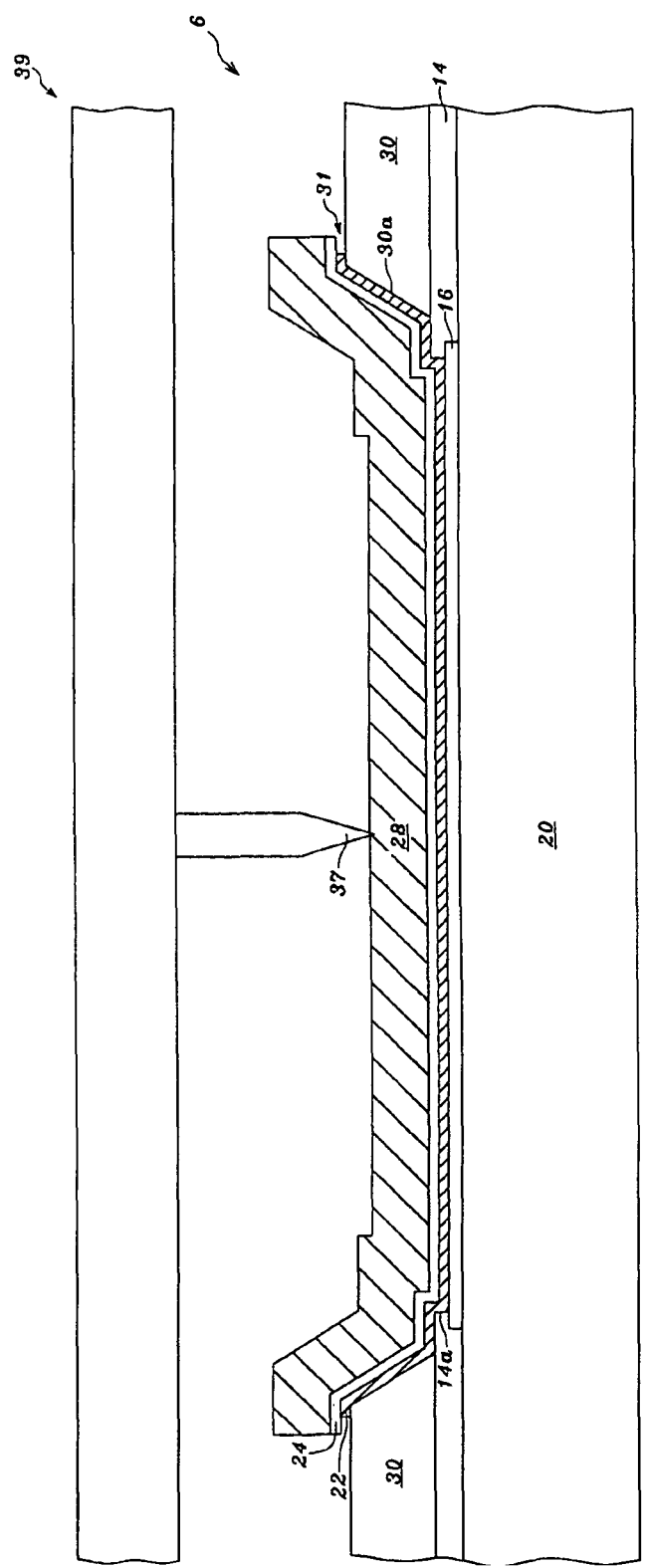
Figure 20:
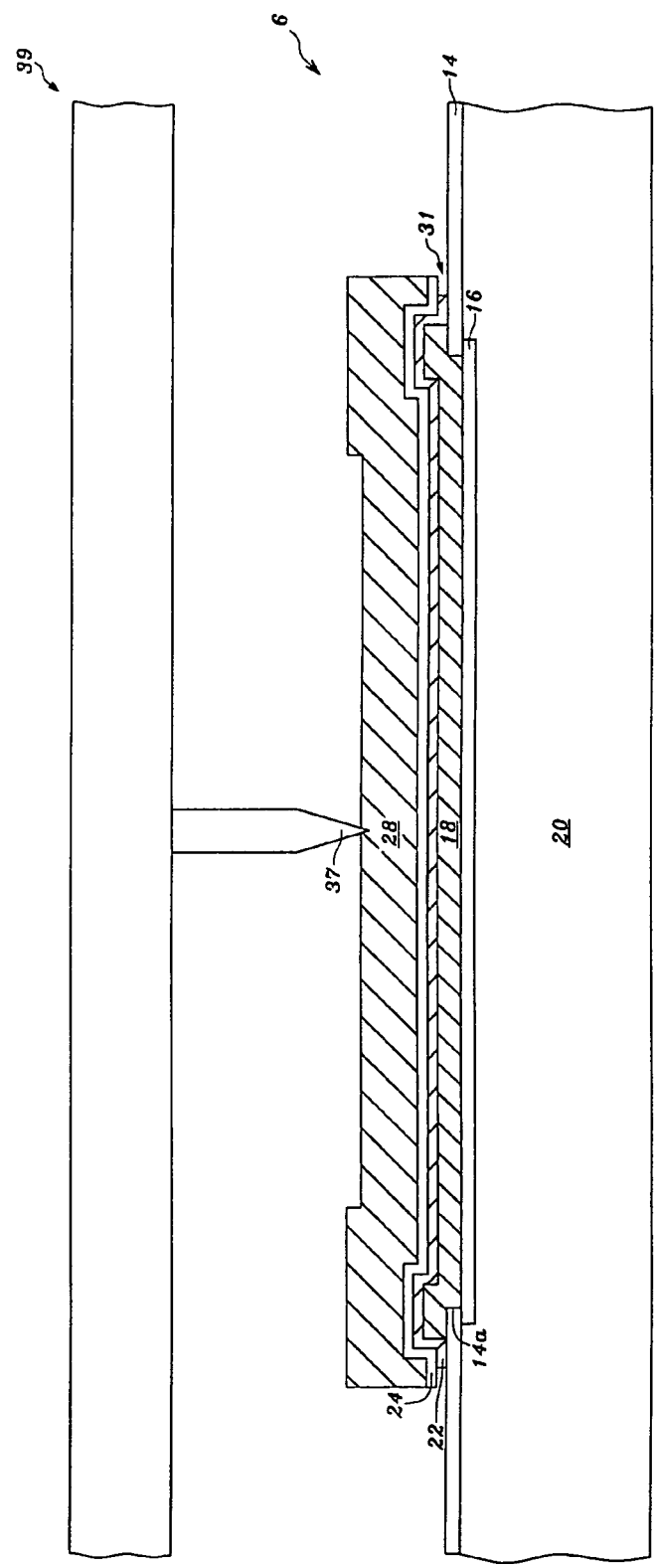

Referring to FIGS. 2M and 2N, the gold pads 28 (only one of them is shown) can be formed, respectively, over the pads 16, such as aluminum pads or copper pads, exposed by the openings 30a in the polymer layer 30, that is, the titanium-tungsten-alloy layer 22 having a thickness of between 0.03 and 0.7 µm, and preferably of between 0.03 and 0.35 µm or between 0.02 and 0.5 µm, can be sputtered on the polymer layer 30 and on the pads 16, such as aluminum pads or copper pads, exposed, respectively, by the openings 30a, followed by the above-mentioned steps as shown in FIGS. 2B-2J.

Referring to FIG. 2O, the gold pads 28 (only one of them is shown) can be formed over the metal caps 18, respectively, that is, the titanium-tungsten-alloy layer 22 having a thickness of between 0.03 and 0.7 µm, and preferably of between 0.03 and 0.35 µm or between 0.02 and 0.5 µm, can be sputtered on the passivation layer 14 and on the aluminum-containing layer of the metal caps 18, wherein the aluminum-containing layer may be an aluminum layer, an aluminum-copper-alloy layer or an Al—Si—Cu-alloy layer, followed by the above-mentioned steps as shown in FIGS. 2B-2H. Next, the semiconductor wafer 6 can be electrically tested by performing the above-mentioned steps as shown in FIGS. 2I-2J. After the step shown in FIG. 2J, the semiconductor wafer 6 can be cut along the scribe lines into multiple individual semiconductor chips.

Figure 2P:
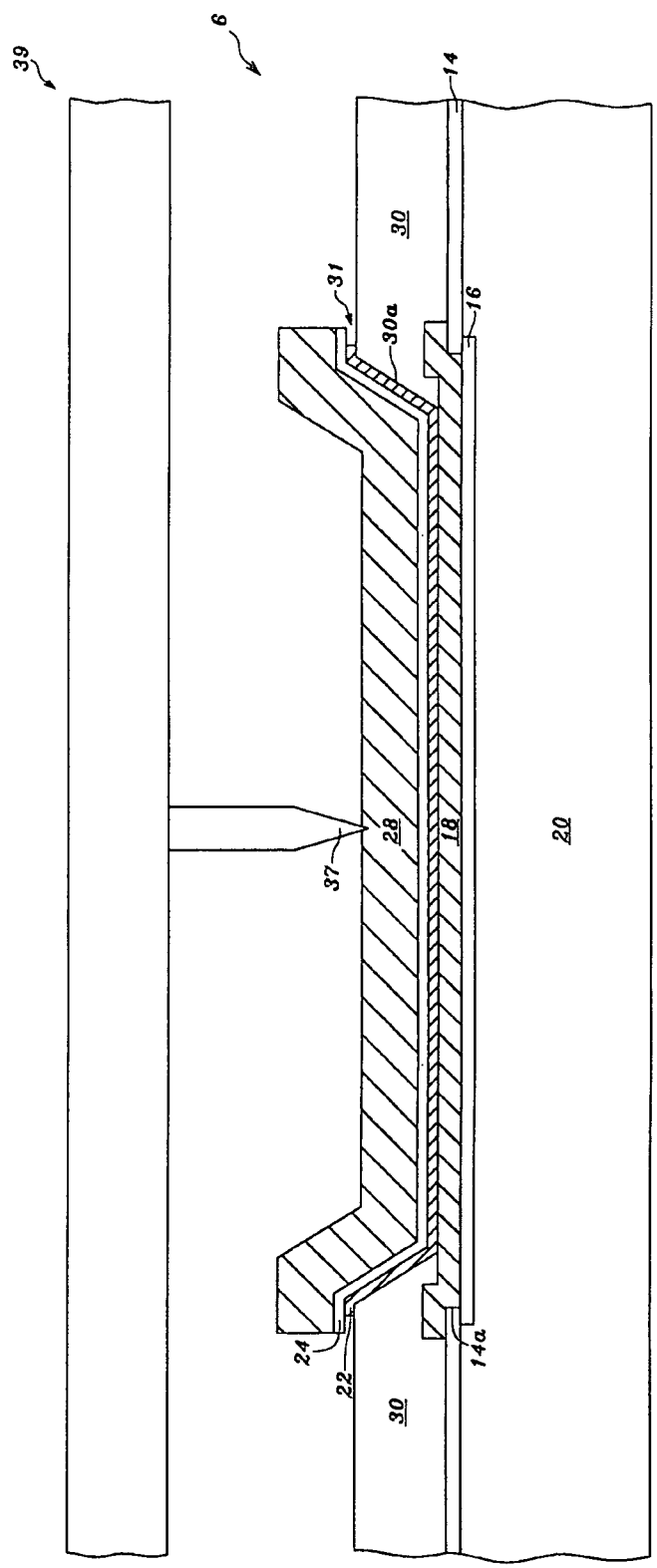

Referring to FIG. 2P, the polymer layer 30 can be formed on the passivation layer 14, and the openings 30a are formed in the polymer layer 30 by patterning the polymer layer 30 to expose the metal caps 18, respectively. Only one of the pads 16, only one of the metal caps 18 and only one of the openings 30a are shown. Next, the gold pads 28 can be formed, respectively, over the metal caps 18 exposed by the openings 30a, that is, the titanium-tungsten-alloy layer 22 having a thickness of between 0.03 and 0.7 µm, and preferably of between 0.03 and 0.35 µm or between 0.02 and 0.5 µm, can be sputtered on the polymer layer 30 and on the aluminum-containing layer of the metal caps 18, wherein the aluminum-containing layer may be aluminum layer, aluminum-copper-alloy layer or Al—Si—Cu-alloy layer, followed by the above-mentioned steps as shown in FIGS. 2B-2H. Next, the semiconductor wafer 6 can be electrically tested by performing the above-mentioned steps as shown in FIGS. 2I-2J. After the step shown in FIG. 2J, the semiconductor wafer 6 can be cut along the scribe lines into multiple individual semiconductor chips. The specification of the polymer layer 30 shown in FIG. 2P can be referred to as the polymer layer 30 illustrated in FIGS. 2K and 2L. The process of forming the polymer layer 30, as shown in FIG. 2P, can be referred to as the process of forming the polymer layer 30, as illustrated in FIG. 2K or 2L.

EMBODIMENT 2

Referring to FIG. 3A, after the step shown in FIG. 2B, a photoresist layer 26, such as positive-type photoresist layer, having a thickness of between 10 and 35 micrometers is spin-on coated on the seed layer 24. Referring to FIG. 3B, the photoresist layer 26 is patterned with the processes of exposure and development to form multiple openings 26a in the photoresist layer 26 exposing the seed layer 24. A 1× stepper or 1× contact aligner can be used to expose the photoresist layer 26 during the process of exposure.

For example, the photoresist layer 26 can be formed by spin-on coating a positive-type photosensitive polymer layer having a thickness of between 10 and 35 µm on the seed layer 24, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 24 with an $O_2$ plasma or a plasma containing fluorine of below 200 PPM and oxygen, such that the photoresist layer 26 can be patterned with the openings 26a in the photoresist layer 26 exposing the seed layer 24.

Referring to FIG. 3C, multiple gold bumps 29 (only two of them are shown) having a thickness of between 8.5 and 30 micrometers, and preferably of between 12 and 25 µm, are electroplated, respectively, on the seed layer 24 exposed by the openings 26a.

For example, the gold bumps 29 may be formed by electroplating a gold layer having a thickness between 8.5 and 30 µm, and preferably of between 12 and 25 µm, on the seed layer 24, made of gold, exposed by the openings 26a with an electroplating solution containing gold of between 1 and 20 grams per litter (g/L), and preferably between 5 and 15 g/L, and sulfite ion of between 10 and 120 g/L, and preferably between 30 and 90 g/L. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold layer are described below:

1. The above-mentioned electroplating solution used to electroplate the gold layer on the seed layer 24 exposed by the openings 26a can be at a temperature of between 30 and 70° C., and preferably between 45 and 65° C.

2. The above-mentioned electroplating solution can be used to electroplate the gold layer on the seed layer 24 exposed by the openings 26a through an electric current with a current density at between 1 and 10 $mA/cm^2$, and preferably between 4 and 6 $mA/cm^2$.

3. The above-mentioned electroplating solution may have a pH value of between 6 and 9, and preferably between 7 and 8.5, to electroplate the gold layer on the seed layer 24 exposed by the openings 26a.

Alternatively, the gold bumps 29 may be formed by electroplating a gold layer having a thickness between 8.5 and 30 µm, and preferably between 12 and 25 µm, on the seed layer 24, made of gold, exposed by the openings 26a with an electroplating solution containing cyanide.

Referring to FIG. 3D, after the gold bumps 29 are formed, most of the photoresist layer 26 can be removed using an organic solution with amide. However, some residuals from the photoresist layer 26 could remain on the gold bumps 29 and on the seed layer 24. Thereafter, the residuals can be removed from the gold bumps 29 and from the seed layer 24 with a plasma, such as $O_2$ plasma or plasma containing fluorine of below 200 PPM and oxygen.

Figure 3E:
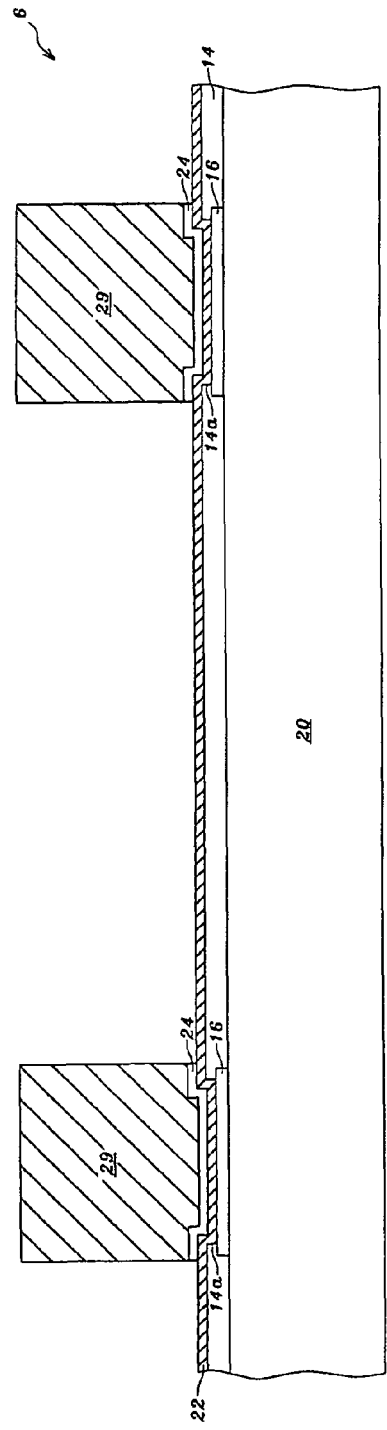

Referring to FIG. 3E, the seed layer 24 not under the gold bumps 29 can be removed with a dry etching method or a wet etching method. As to the wet etching method, the seed layer 24, made of gold, can be etched with an iodine-containing solution, such as solution containing potassium iodide. As to the dry etching method, the seed layer 24, made of gold, can be removed with an Ar sputtering etching process.

Figure 3F:
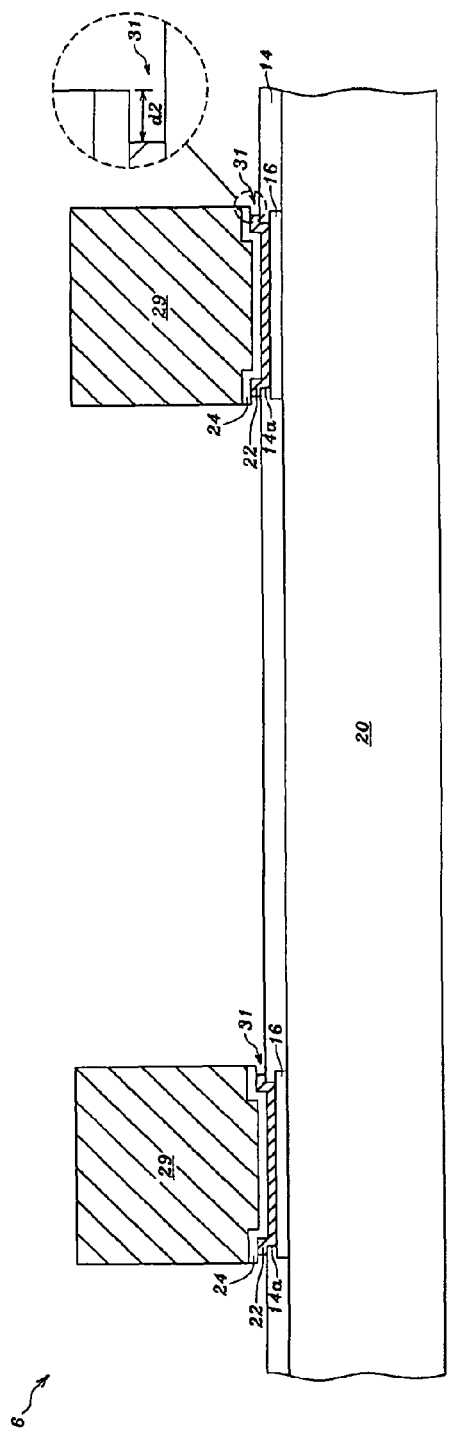

Referring to FIG. 3F, the titanium-tungsten-alloy layer 22 not under the gold bumps 29 can be removed with a wet etching method. Two methods for removing the titanium-tungsten-alloy layer 22 not under the gold bumps 29 are described as below:

In a first method, the semiconductor wafer 6 shown in FIG. 3E can be immersed in an etchant containing between 15 wt. % and 50 wt. % of hydrogen peroxide, such as 30 wt. % of hydrogen peroxide, at a temperature of between 35 and 50 degrees C., and preferably of between 38 and 42 degrees C., such as 40 degrees C., for a time of between 3 and 20 minutes, and preferably of between 5 and 15 minutes, to etch the titanium-tungsten-alloy layer 22 not under the gold bumps 29 with circulation flow. Alternatively, the semiconductor wafer 6 shown in FIG. 3E can be immersed in an etchant containing between 15 wt. % and 50 wt. % of hydrogen peroxide, such as 30 wt. % of hydrogen peroxide, at a temperature of between 43 and 47 degrees C., and preferably of 45 degrees C., for a time of between 3 and 20 minutes, and preferably of between 5 and 15 minutes, to etch the titanium-tungsten-alloy layer 22 not under the gold bumps 29 with circulation flow. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The method has a high etching rate and can improve the etching behavior to prevent the titanium oxide and tungsten oxide from drifting onto the gold bumps 29 with the hydrodynamic circulation flow. Therefore, the frequency of probe cleaning during a chip probing (CP) test and of a CP re-test can be reduced due to the gold bumps 29 having clean surface.

In a second method, the semiconductor wafer 6 shown in FIG. 3E can be immersed in an etchant containing between 15 wt. % and 50 wt. % of hydrogen peroxide, such as 30 wt. % of hydrogen peroxide, at a temperature of between 23 and 27 degrees C., and preferably of 25 degrees C., for a time of between 10 and 50 minutes, and preferably of between 15 and 40 minutes, to etch the titanium-tungsten-alloy layer 22 not under the gold bumps 29 with circulation flow, and ultrasonic waves are applied to the etchant in the entire etching process or in a selected time interval between 5 and 10 minutes at the final period of the etching process. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The ultrasonic waves having a fixed frequency selected from a frequency range between 28K Hz and 120K Hz are used here. The ultrasonic waves have a power of between 1.0 KW and 2.0 KW, and preferably of 1.5 KW. The method can prevent the titanium oxide and tungsten oxide from drifting onto the gold bumps 29 with the hydrodynamic circulation flow. Therefore, the frequency of probe cleaning during a chip probing (CP) test and of a CP re-test can be reduced due to the gold bumps 29 having clean surface.

Multiple undercuts 31 are formed under the seed layer 24 when the titanium-tungsten-alloy layer 22 not under the gold bumps 29 is removed using a wet etching method. The titanium-tungsten-alloy layer 22 under the gold bumps 29 has a first sidewall recessed from a second sidewall of the seed layer 24, wherein a distance d2 between the first sidewall and the second sidewall is between 0.3 and 2 micrometers.

Thereby, in the present invention, the gold bumps 29 can be formed, respectively, over the pads 16, such as aluminum pads or copper pads, exposed by the openings 14a and the titanium oxide and tungsten oxide, remaining on the gold bumps 29, can be reduced.

Figure 3G:
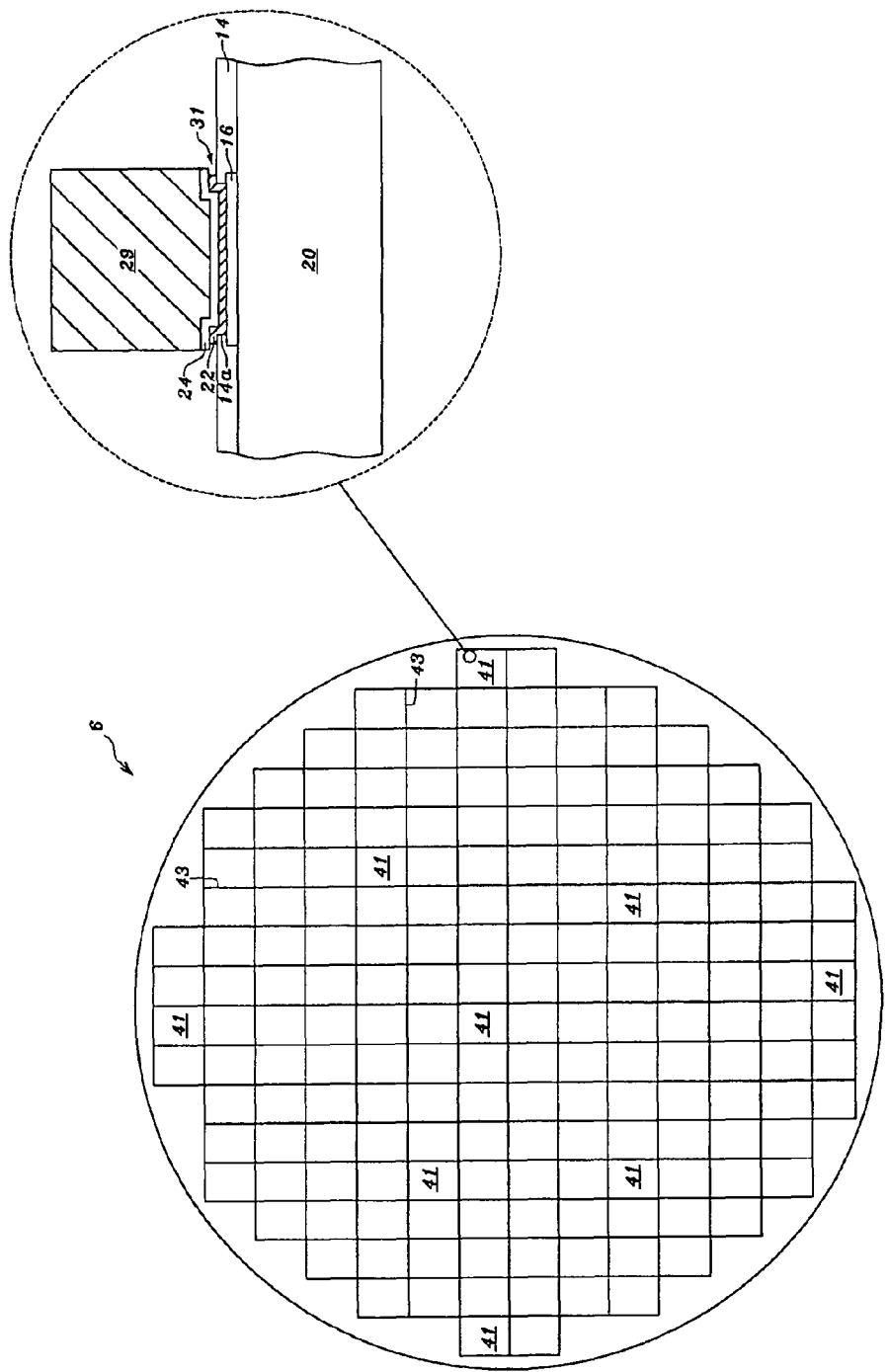
FIG. 3G is a top view showing a semiconductor wafer with multiple gold bumps.

Referring to FIG. 3G, the semiconductor wafer 6 includes multiple dies 41 with scribe lines 43 between neighboring two of the dies 41. In the following wafer dicing process, the semiconductor wafer 6 can be cut along the scribe lines 43 to separate the dies 41. Each of the dies 41 may have the gold bumps 29, respectively, over the pads 16 exposed by the openings 14a.

Figure 3H:
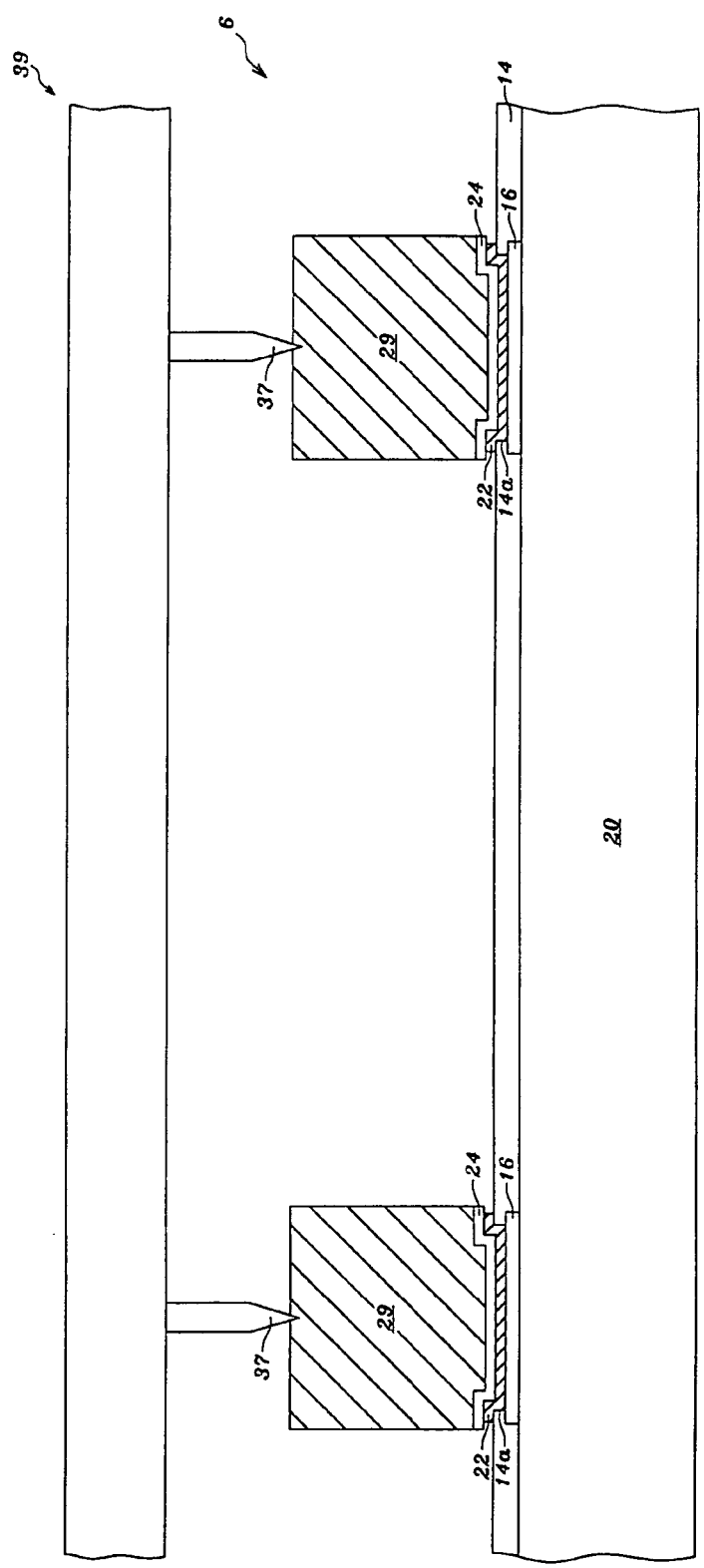

Referring to FIGS. 3G and 3H, after etching the titanium-tungsten-alloy layer 22 not under the gold bumps 29, a chip probing (CP) test can be performed to electrically test all dies 41 of the semiconductor wafer 6 shown in FIG. 3F by contacting multiple probe tips 37 of a probe card 39 with some of the gold bumps 29 of the semiconductor wafer 6, in sequence, until the probe tips 37 of the probe card 39 have contacted with the entire gold bumps 29 provided by the semiconductor wafer 6. The probe tips 37 can contact with the entire gold bumps 29 provided by one of the dies 41 of the semiconductor wafer 6 once, or the probe tips 37 can contact with the entire gold bumps 29 provided by at least two of the dies 41 of the semiconductor wafer 6 once. The probe card 39 can be a vertical probe card, that is, the probe tips 37 can vertically contact with top surfaces of the gold bumps 29. The material of the probe tips 37 may include tungsten or rhenium.

Therefore, all dies 41 of the semiconductor wafer 6 can be electrically tested by contacting the probe tips 37 of the probe card 39 with the entire gold bumps 29 provided by one or more than one of the dies 41 once, until the probe tips 37 of the probe card 39 have contacted with the entire gold bumps 29 provided by the semiconductor wafer 6. The electrically testing process comprises following steps:

Step 1: the probe tips 37 of the probe card 39 probe the entire gold bumps 29 provided by one or more than one of the dies 41 of the semiconductor wafer 6 to electrically test the probed die or dies 41;

Step 2: the probe tips 37 of the probe card 39 probe the entire gold bumps 29 provided by another one or more than another one of the dies 41 of the semiconductor wafer 6 to electrically test the probed die or dies 41;

Step 3: the probe tips 37 of the probe card 39 are cleaned until the probe tips 37 probe the gold bumps 29 provided by the semiconductor wafer 6 at greater than 100 times, 150 times or even 200 times for electrically testing the respective dies 41 of the semiconductor wafer 6;

Step 4: after cleaning the probe tips 37 of the probe card 39, the probe tips 37 of the probe card 39 probe the gold bumps 29 provided by the other untested dies 41 of the semiconductor wafer 6; and Step 5: repeating the step 3 and step 4 until all of the dies 41 of the semiconductor wafer 6 have been electrically tested using the probe card 39.

The probe tips 37 of the probe card 39 may be cleaned by a cleaning sheet to remove metal oxide, such as titanium oxide or tungsten oxide, adhered to the probe tips 37.

In the present invention, the residual of titanium oxide and tungsten oxide remaining on the gold bumps 29 of the semiconductor wafer 6 can be reduced using the two above-mention methods for removing the titanium-tungsten-alloy layer 22 not under the gold bumps 29. Thereby, the probe tips 37 of the probe card 39 should be cleaned only until the probe tips 37 of the probe card 39 contact with the gold bumps 29 provided by the semiconductor wafer 6 at greater than 100 times, 150 times or even 200 times. The invention can reduce the frequency of cleaning the probe tips 37 on the probe card 39 during a chip probing (CP) test and reduce the frequency of a CP re-test.

After the chip probing (CP) test, the semiconductor wafer 6 can be cut along the scribe lines 43 into multiple individual semiconductor chips 41, integrated circuit chips.

Figure 3I:
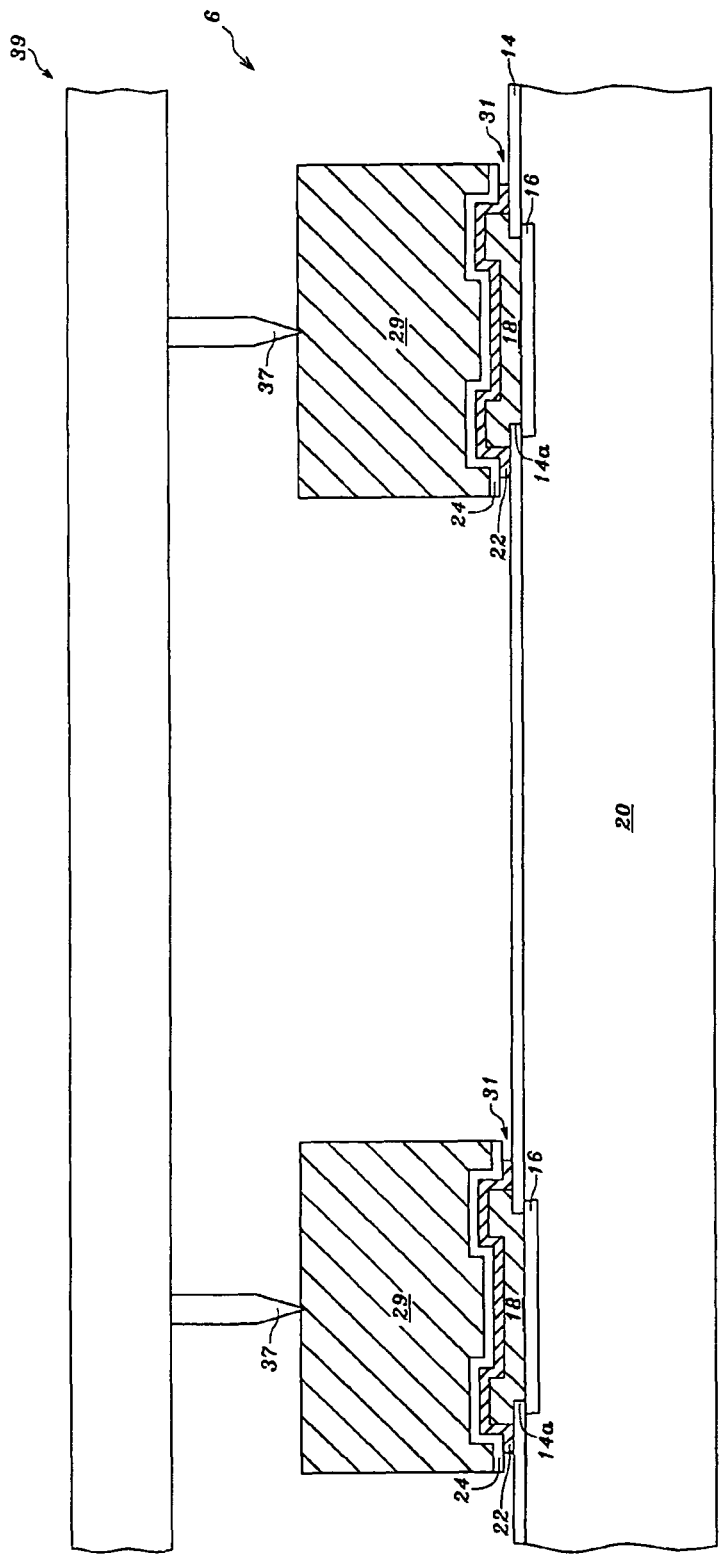

Referring to FIG. 3I, the gold bumps 29 (only two of them are shown) can be formed over the metal caps 18, respectively, that is, the titanium-tungsten-alloy layer 22 having a thickness of between 0.03 and 0.7 μm, and preferably of between 0.03 and 0.35 μm or between 0.02 and 0.5 μm, can be sputtered on the passivation layer 14 and on the aluminum-containing layer of the metal caps 18, wherein the aluminum-containing layer may be an aluminum layer, an aluminum-copper-alloy layer or an Al—Si—Cu-alloy layer, followed by the above-mentioned steps as shown in FIGS. 2B and 3A-3F. Next, the semiconductor wafer 6 can be electrically tested by performing the above-mentioned steps as shown in FIGS. 3G-3H. After the step shown in FIG. 3H, the semiconductor wafer 6 can be cut along the scribe lines into multiple individual semiconductor chips.

EMBODIMENT 3

In the present invention, multiple metal traces can be formed over the passivation layer 14. The process of forming the metal traces and testing the semiconductor wafer 6 will be illustrated in FIGS. 4A-4V.

One of the metal traces can be a redistributed metal trace to redistribute input or output positions. The redistributed metal trace is over the passivation layer 14 and on a first metal pad connected to the metallization structure, wherein the first metal pad may be a copper pad exposed by the opening 14a in the passivation layer 14, an aluminum pad exposed by the opening 14a in the passivation layer 14 or a metal cap 18 on a copper pad exposed by the opening 14a in the passivation layer 14. The redistributed metal trace comprises a second metal pad over the passivation layer 14, and the position of the second metal pad from a top perspective view is different from that of the first metal pad, to which the redistributed metal trace is connected. In a chip probing (CP) test, a probe tip 37 of a probe card 39 can contact with the second metal pad of the redistributed metal trace.

Alternatively, one of the metal traces can be an interconnection trace connecting at least two first metal pads, wherein the first metal pads may be copper pads exposed by the openings 14a in the passivation layer 14, aluminum pads exposed by the openings 14a in the passivation layer 14 or metal caps 18 on copper pads exposed by the openings 14a in the passivation layer 14, and wherein the first metal pads can be connected to active devices, such as MOS devices, in or over the semiconductor substrate 2 through sub-metallization structures of the metallization structure, respectively. One of the MOS devices can be connected to another one of the MOS devices through the interconnection trace over the passivation layer 14. The interconnection trace is over the passivation layer and on the first metal pads, and the interconnection trace comprises a second metal pad over the passivation layer 14. From a top perspective view, the position of the second metal pad can be different from that of each of the first metal pads, to which the interconnection trace is connected. In a chip probing (CP) test, a probe tip 37 of a probe card 39 can contact with the second metal pad of the interconnection trace.

Alternatively, one of the metal traces can be a coil over the passivation layer 14. The coil comprises a first terminal and a second terminal. In a case, the first and second terminals of the coil are connected to two metal pads, respectively, over the passivation layer 14, wherein the two metal pads can be used to have wires bonded thereon using a wirebonding process or used to have metal bumps formed thereon using sputtering and electroplating processes, without being connected to any pad 16 exposed by an opening 14a in the passivation layer 14. In a chip probing (CP) test, two probe tips 37 of a probe card 39 can contact with the two metal pads connected to the first and second terminals of the coil.

In another case, the first terminal of the coil is connected to a first metal pad over the passivation layer 14, wherein the first metal pad can be used to have a wire bonded thereon using a wirebonding process or used to have a metal bump formed thereon using sputtering and electroplating processes, without being connected to any pad 16 exposed by an opening 14a in the passivation layer 14. The second terminal of the coil is connected to a second metal pad, wherein the second metal pad may be a copper pad exposed by the opening 14a in the passivation layer 14, an aluminum pad exposed by the opening 14a in the passivation layer 14 or a metal cap 18 on a copper pad exposed by the opening 14a in the passivation layer 14. In a chip probing (CP) test, a probe tip 37 of a probe card 39 can contact with the first metal pad connected to the first terminal of the coil.

In another case, the first and second terminals of the coil are connected, respectively, to two metal pads, wherein the two metal pads may be copper pads exposed, respectively, by the openings 14a in the passivation layer 14, aluminum pads exposed, respectively, by the openings 14a in the passivation layer 14 or metal caps 18, respectively, on copper pads exposed by the openings 14a in the passivation layer 14.

In a first case, any one kind of the above-mentioned coils as well as the above-mentioned redistributed metal traces can be over a passivation layer of a same semiconductor chip. In a second case, any one kind of the above-mentioned coils as well as the above-mentioned interconnection metal traces can be over a passivation layer of a same semiconductor chip. In a third case, the above-mentioned redistributed metal traces as well as the above-mentioned interconnection metal traces can be over a passivation layer of a same semiconductor chip. In a fourth case, any one kind of the above-mentioned coils, the above-mentioned interconnection metal traces and the above-mentioned redistributed metal traces can be over a passivation layer of a same semiconductor chip. In a fifth case, the entirety of the above-mentioned metal traces over a passivation layer of a semiconductor layer may serve as redistributed metal traces. In a sixth case, the entirety of the above-mentioned metal traces over a passivation layer of a semiconductor layer may serve as interconnection metal traces. In a seventh case, the entirety of the above-mentioned metal traces over a passivation layer of a semiconductor layer may serve as coils.

Figure 4A:
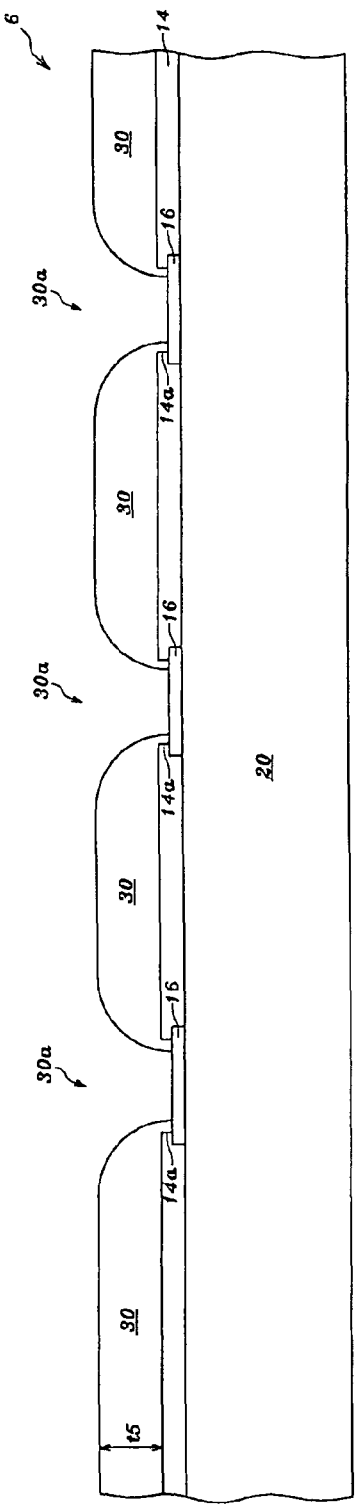
Figure 4B:
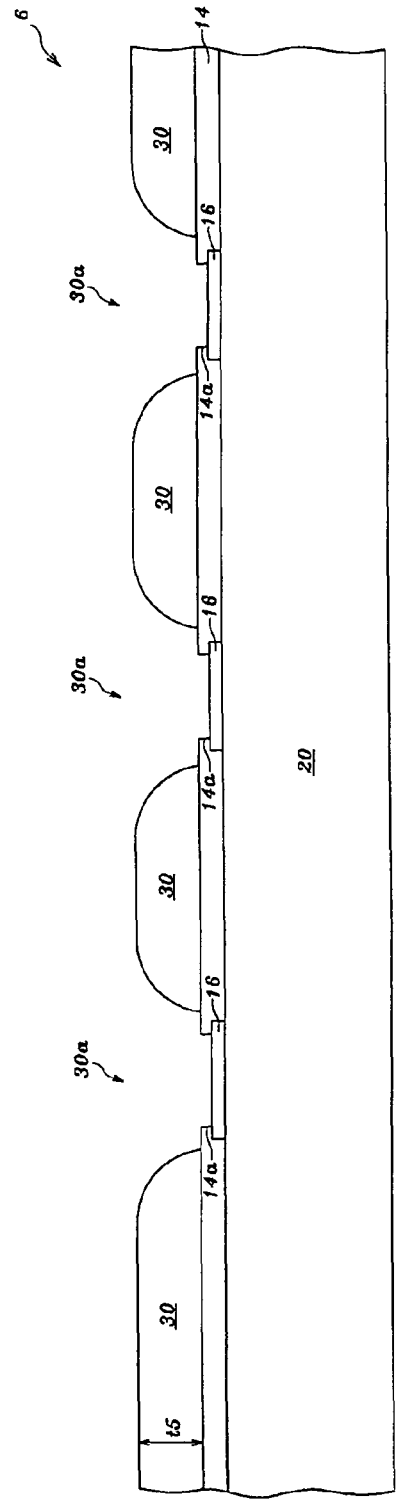

Referring to FIGS. 4A and 4B, a polymer layer 30 can be formed on the passivation layer 14, and multiple openings 30a are formed in the polymer layer 30 by patterning the polymer layer 30 to expose the pads 16 exposed by the openings 14a, respectively. The polymer layer 30 has a thickness t5 of between 3 and 25 micrometers. In a case, the polymer layer 30 covers peripheral regions of each pads 16 exposed by the openings 14a, respectively, and covers the passivation layer 14, each openings 30a in the polymer layer 30 exposing center regions of each pads 16 exposed by the openings 14a, respectively, as shown in FIG. 4A, wherein the peripheral regions surround the center regions, respectively. In this type, the polymer layer 30 covers sidewalls of the openings 14a. In another case, each openings 30a shown in FIG. 4B may expose some regions of a top surface of the passivation layer 14 surrounding the center regions of each pads 16, respectively, in addition to exposing each pads 16, respectively, and the polymer layer 30 is on other regions of the top surface of the passivation layer 14 surrounding the regions of the top surface of the passivation layer 14, respectively, exposed by the openings 30a. The specification of the polymer layer 30 shown in FIGS. 4A-4J, 4L-4M, 4P-4Q and 4T-4V can be referred to as the polymer layer 30 illustrated in FIGS. 2K and 2L. The process of forming the polymer layer 30, as shown in FIG. 4A, can be referred to as the process of forming the polymer layer 30, as illustrated in FIG. 2K. The process of forming the polymer layer 30, as shown in FIG. 4B, can be referred to as the process of forming the polymer layer 30, as illustrated in FIG. 2L. The descriptions of this embodiment in FIGS. 4C-4J, 4L-4M and 4T-4V are based on the structure shown in FIG. 4A. Alternatively, the process of forming metal traces shown in FIGS. 4C-4J, 4L-4M and 4T-4V can be performed on the structure shown in FIG. 4B.

Figure 4C:
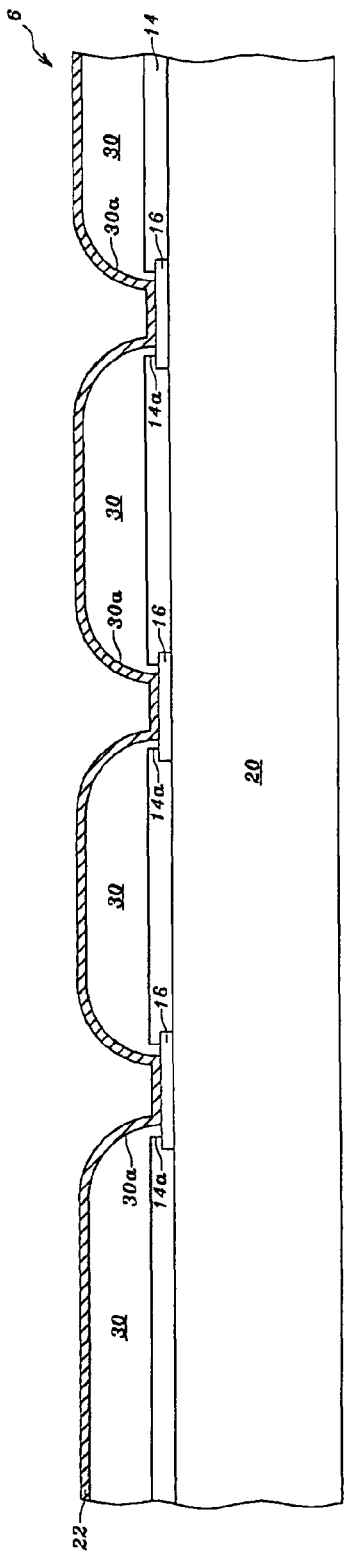

Referring to FIG. 4C, a titanium-tungsten-alloy layer 22 having a thickness of between 0.03 and 0.7 μm, and preferably of between 0.03 and 0.35 μm, can be formed on the polymer layer 30 and on the pads 16 exposed, respectively, by the openings 30a. For example, the titanium-tungsten-alloy layer 22 having a thickness of between 0.02 and 0.5 μm can be sputtered on the polymer layer 30 and on the pads 16, principally made of aluminum, exposed, respectively, by the openings 30a. Alternatively, the titanium-tungsten-alloy layer 22 having a thickness of between 0.02 and 0.5 μm can be sputtered on the polymer layer 30 and on the pads 16, principally made of copper, exposed, respectively, by the openings 30a. The titanium-tungsten-alloy layer 22 is treated as an adhesion/barrier layer to prevent the occurrence of interdiffusion between metal layers and to provide good adhesion between the metal layers.

Alternatively, the titanium-tungsten-alloy layer 22 can be replaced by a titanium layer with a thickness of between 0.02 and 0.5 μm formed by a sputtering process or a chemical vapor deposition (CVD) process, a titanium-nitride layer with a thickness of between 0.02 and 0.5 μm formed by a sputtering process or a chemical vapor deposition process, a chromium layer with a thickness of between 0.02 and 0.5 μm formed by a sputtering process or a chemical vapor deposition process, or a tantalum-nitride layer with a thickness of between 0.02 and 0.5 μm formed by a sputtering process or a chemical vapor deposition process.

Figure 4D:
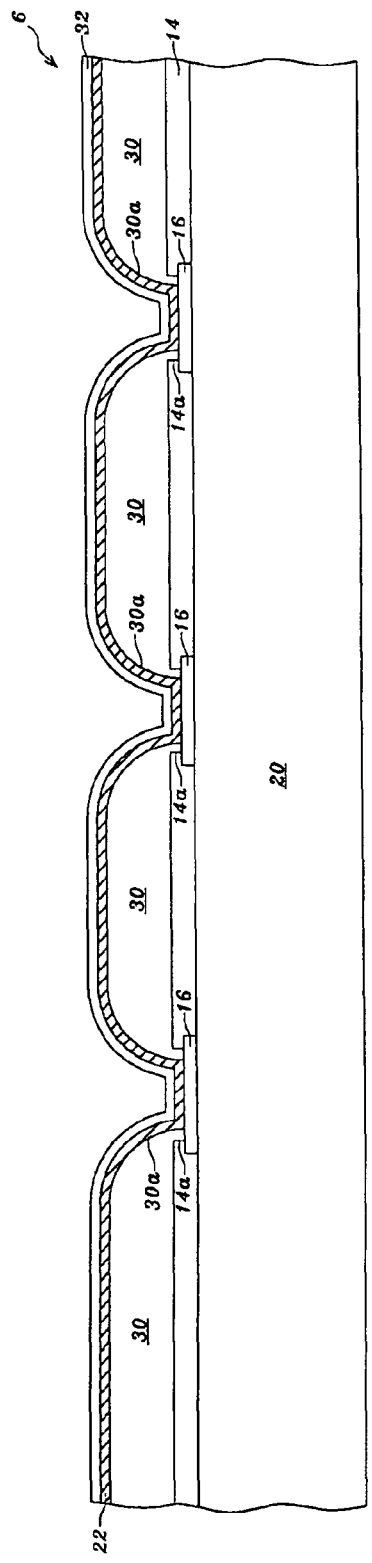

Referring to FIG. 4D, a seed layer 32 having a thickness of between 0.02 and 0.5 μm, and preferably of between 0.02 and 0.3 μm, can be sputtered on the titanium-tungsten-alloy layer 22. Alternatively, the seed layer 32 can be formed by a vapor deposition method, an electroless plating method or a physical vapor deposition (PVD) method. The seed layer 32 is beneficial to electroplating a metal layer thereon. Thus, the material of the seed layer 32 varies with the material of the electroplated metal layer formed on the seed layer 32. When a gold layer is to be electroplated on the seed layer 32, gold is a preferable material to the seed layer 32. When a copper layer is to be electroplated on the seed layer 32, copper is a preferable material to the seed layer 32.

For example, the seed layer 32 can be formed by sputtering a gold layer with a thickness of between 0.02 and 1 μm, and preferably of between 0.02 and 0.3 μm, on the titanium-tungsten-alloy layer 22. Alternatively, the seed layer 32 can be formed by sputtering a copper layer with a thickness of between 0.02 and 1 μm, and preferably of between 0.03 and 0.5 μm, on the titanium-tungsten-alloy layer 22.

Figure 4E:
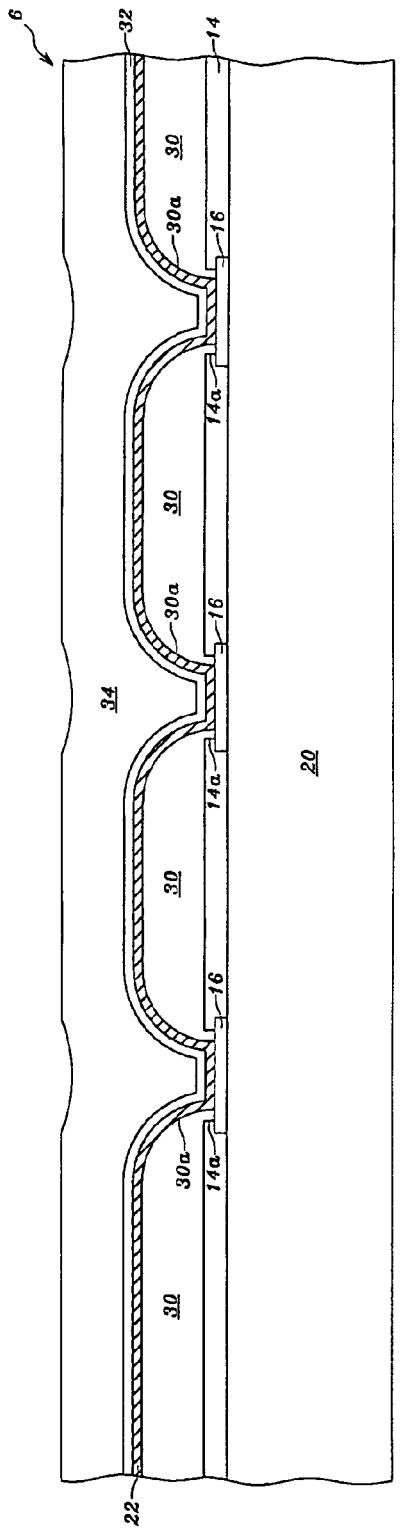
Figure 4F:
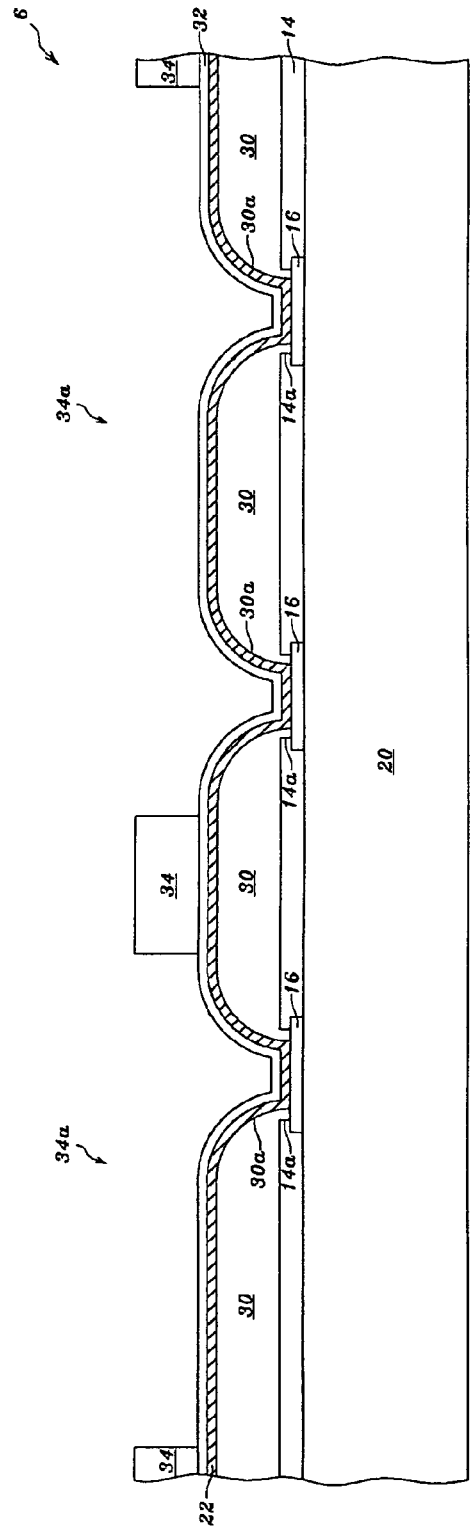

Referring to FIG. 4E, a photoresist layer 34, such as positive-type photoresist layer, having a thickness of between 5 and 20 micrometers is spin-on coated on the seed layer 32. Referring to FIG. 4F, the photoresist layer 34 is patterned with the processes of exposure and development to form multiple openings 34a in the photoresist layer 34 exposing the seed layer 32. A 1× stepper or 1× contact aligner can be used to expose the photoresist layer 34 during the process of exposure.

For example, the photoresist layer 34 can be formed by spin-on coating a positive-type photosensitive polymer layer having a thickness of between 5 and 20 μm on the seed layer 32, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 32 with an O$_2$ plasma or a plasma containing fluorine of below 200 PPM and oxygen, such that the photoresist layer 34 can be patterned with the openings 34a in the photoresist layer 34 exposing the seed layer 32.

Figure 4G:
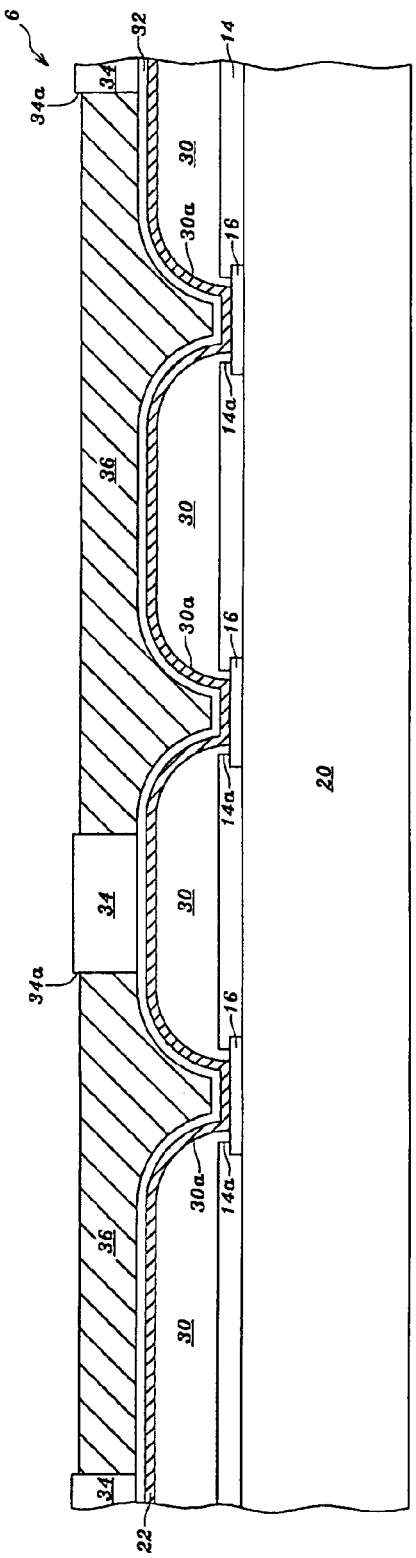

Referring to FIG. 4G, a metal layer 36 having a thickness of between 2 and 30 micrometers, and preferably of between 3 and 15 μm, is formed on the seed layer 32 exposed by the openings 34a. The material of the metal layer 36 may include gold, copper, nickel or palladium.

For example, the metal layer 36 may be formed by electroplating a copper layer with a thickness of between 2 and 30

µm, and preferably of between 3 and 15 µm, on the seed layer 32, made of copper, exposed by the openings 34a. Alternatively, the metal layer 36 may be formed by electroplating a copper layer with a thickness of between 2 and 20 µm on the seed layer 32, made of copper, exposed by the openings 34a, then electroplating a nickel layer with a thickness of between 0.5 and 5 µm on the copper layer in the openings 34a, and then electroplating a gold layer with a thickness of between 0.05 and 5 µm on the nickel layer in the openings 34a. Alternatively, the metal layer 36 may be formed by electroplating a copper layer with a thickness of between 2 and 23 µm on the seed layer 32, made of copper, exposed by the openings 34a, then electroplating a nickel layer with a thickness of between 0.5 and 5 µm on the copper layer in the openings 34a, and then electroless plating a gold layer with a thickness of between 0.05 and 2 µm on the nickel layer in the openings 34a. Alternatively, the metal layer 36 may be formed by electroplating a copper layer with a thickness of between 2 and 23 µm on the seed layer 32, made of copper, exposed by the openings 34a, then electroplating a nickel layer with a thickness of between 0.5 and 5 µm on the copper layer in the openings 34a, and then electroplating a palladium layer with a thickness of between 0.05 and 2 µm on the nickel layer in the openings 34a. Alternatively, the metal layer 36 may be formed by electroplating a copper layer with a thickness of between 2 and 23 µm on the seed layer 32, made of copper, exposed by the openings 34a, then electroplating a nickel layer with a thickness of between 0.5 and 5 µm on the copper layer in the openings 34a, and then electroless plating a palladium layer with a thickness of between 0.05 and 2 µm on the nickel layer in the openings 34a. Alternatively, the metal layer 36 may be formed by electroplating a copper layer with a thickness of between 2 and 24 µm on the seed layer 32, made of copper, exposed by the openings 34a, then electroplating a nickel layer with a thickness of between 0.5 and 5 µm on the copper layer in the openings 34a, then electroplating or electroless plating a palladium layer with a thickness of between 0.05 and 0.5 µm on the nickel layer in the openings 34a, and then electroplating or electroless plating a gold layer with a thickness of between 0.01 and 0.5 µm on the palladium layer in the openings 34a.

For example, the metal layer 36 may be formed by electroplating a gold layer having a thickness of between 2 and 30 micrometers, and preferably of between 3 and 15 µm, on the seed layer 32, made of gold, exposed by the openings 34a with an electroplating solution containing gold of between 1 and 20 grams per litter (g/L), and preferably between 5 and 15 g/L, and sulfite ion of between 10 and 120 g/L, and preferably between 30 and 90 g/L. The electroplating solution may further comprise sodium ion, to be turned into a solution of gold sodium sulfite ($Na_3Au(SO_3)_2$), or may further comprise ammonium ion, to be turned into a solution of gold ammonium sulfite (($NH_4)_3[Au(SO_3)_2]$).

The operational parameters of electroplating the gold layer are described below:

1. The above-mentioned electroplating solution used to electroplate the gold layer on the seed layer 32 exposed by the openings 34a can be at a temperature of between 30 and 70° C., and preferably between 45 and 65° C.

2. The above-mentioned electroplating solution can be used to electroplate the gold layer on the seed layer 32 exposed by the openings 34a through an electric current with a current density at between 1 and 10 mA/cm$^2$, and preferably between 4 and 6 mA/cm$^2$.

3. The above-mentioned electroplating solution may have a pH value of between 6 and 9, and preferably between 7 and 8.5, to electroplate the gold layer on the seed layer 32 exposed by the openings 34a.

Alternatively, the metal layer 36 may be formed by electroplating a gold layer having a thickness between 2 and 30 µm, and preferably between 3 and 15 µm, on the seed layer 32, made of gold, exposed by the openings 34a with an electroplating solution containing cyanide.

Figure 4H:
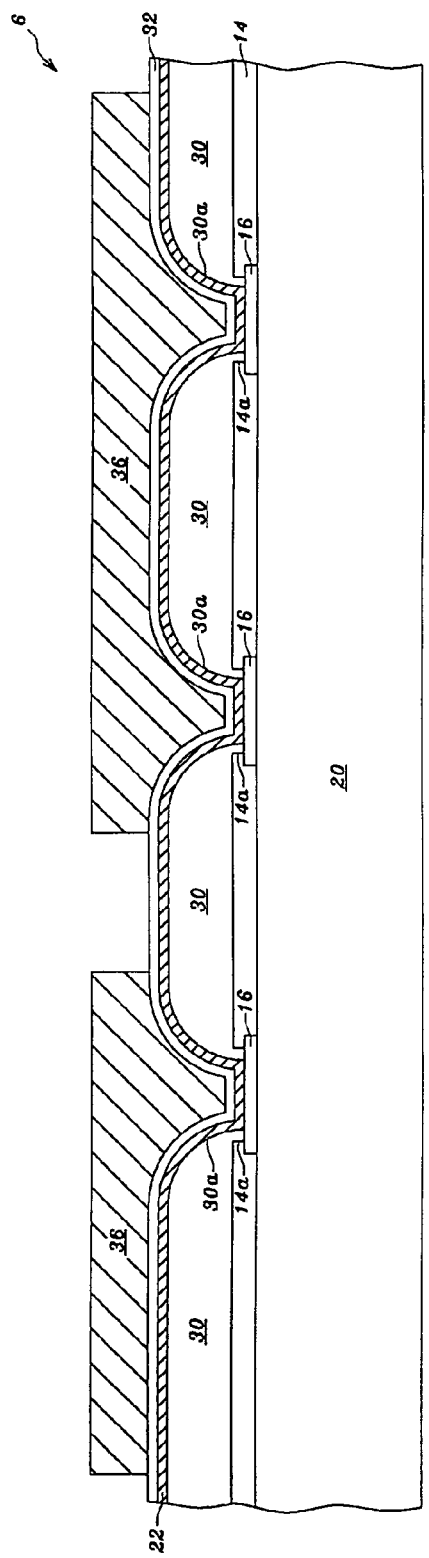

Referring to FIG. 4H, after the metal layer 36 is formed, most of the photoresist layer 34 can be removed using an organic solution with amide. However, some residuals from the photoresist layer 34 could remain on the metal layer 36 and on the seed layer 32. Thereafter, the residuals can be removed from the metal layer 36 and from the seed layer 32 with a plasma, such as $O_2$ plasma or plasma containing fluorine of below 200 PPM and oxygen.

Figure 4I:
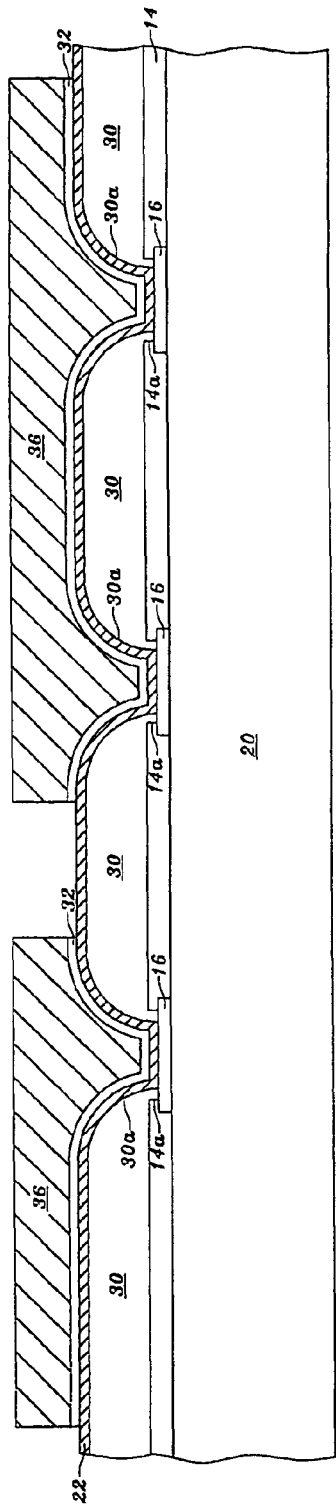

Referring to FIG. 4I, the seed layer 32 not under the metal layer 36 can be removed with a dry etching method or a wet etching method. As to the wet etching method, when the seed layer 32 is a gold layer, it can be etched with an iodine-containing solution, such as solution containing potassium iodide; when the seed layer 32 is a copper layer, it can be etched with a solution containing $NH_4OH$. As to the dry etching method, when the seed layer 32 is a gold layer, it can be removed with an Ar sputtering etching process; when the seed layer 32 is a copper layer, it can be removed with an Ar sputtering etching process. Generally, the dry etching method to etch the seed layer 32 not under the metal layer 36 may include a chemical plasma etching process, a sputtering etching process, such as argon sputter process, or a chemical vapor etching process.

Figure 4J:
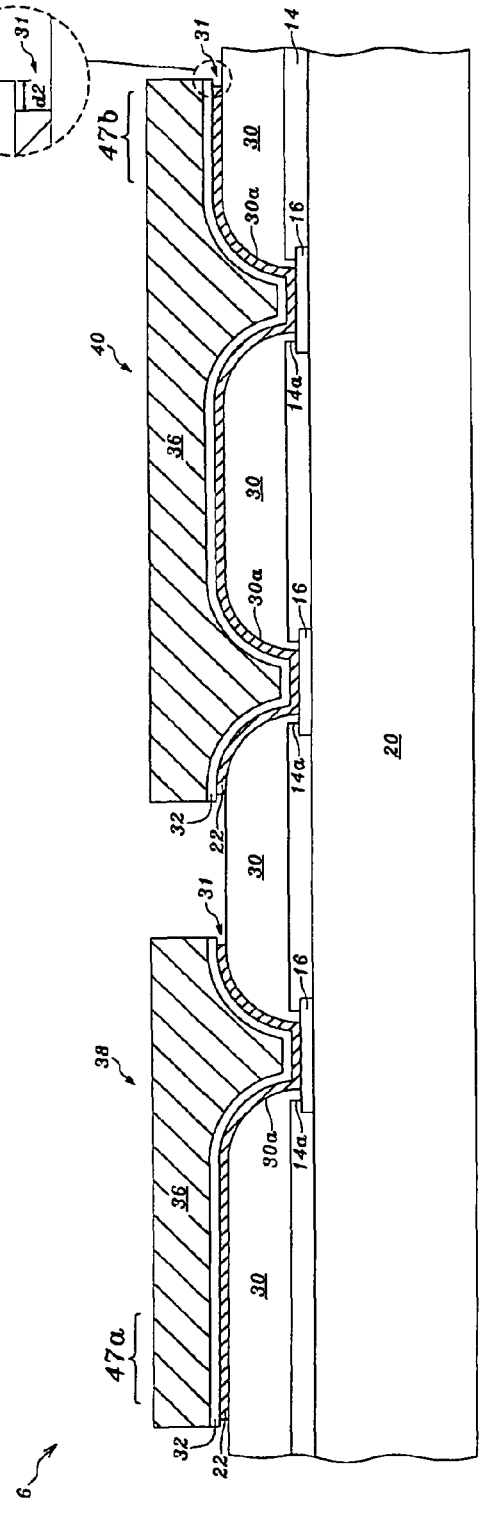

Referring to FIG. 4J, the titanium-tungsten-alloy layer 22 not under the metal layer 36 can be removed with a wet etching method. Two methods for removing the titanium-tungsten-alloy layer 22 not under the metal layer 36 are described as below:

In a first method, the semiconductor wafer 6 shown in FIG. 4I can be immersed in an etchant containing between 15 wt. % and 50 wt. % of hydrogen peroxide, such as 30 wt. % of hydrogen peroxide, at a temperature of between 35 and 50 degrees C., and preferably of between 38 and 42 degrees C., such as 40 degrees C., for a time of between 3 and 20 minutes, and preferably of between 5 and 15 minutes, to etch the titanium-tungsten-alloy layer 22 not under the metal layer 36 with circulation flow. Alternatively, the semiconductor wafer 6 shown in FIG. 4I can be immersed in an etchant containing between 15 wt. % and 50 wt. % of hydrogen peroxide, such as 30 wt. % of hydrogen peroxide, at a temperature of between 43 and 47 degrees C., and preferably of 45 degrees C., for a time of between 3 and 20 minutes, and preferably of between 5 and 15 minutes, to etch the titanium-tungsten-alloy layer 22 not under the metal layer 36 with circulation flow. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The method has a high etching rate and can improve the etching behavior to prevent the titanium oxide and tungsten oxide from drifting onto the metal layer 36 with the hydrodynamic circulation flow. Therefore, the frequency of probe cleaning during a chip probing (CP) test and of a CP re-test can be reduced due to the metal layer 36 having clean surface.

In a second method, the semiconductor wafer 6 shown in FIG. 4I can be immersed in an etchant containing between 15 wt. % and 50 wt. % of hydrogen peroxide, such as 30 wt. % of hydrogen peroxide, at a temperature of between 23 and 27 degrees C., and preferably of 25 degrees C., for a time of between 10 and 50 minutes, and preferably of between 15 and 40 minutes, to etch the titanium-tungsten-alloy layer 22 not under the metal layer 36 with circulation flow, and ultrasonic waves are applied to the etchant in the entire etching process or in a selected time interval between 5 and 10 minutes at the final period of the etching process. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The ultrasonic waves having a fixed frequency selected from a frequency range between 28K Hz and 120K Hz are used here. The ultrasonic waves have a power of between 1.0 KW and 2.0 KW, and preferably of 1.5 KW. The method can prevent the titanium oxide and tungsten oxide from drifting onto the metal layer 36 with the hydrodynamic circulation flow. Therefore, the frequency of probe cleaning during a chip probing (CP) test and of a CP re-test can be reduced due to the metal layer 36 having clean surface.

Multiple undercuts 31 are formed under the seed layer 32 when the titanium-tungsten-alloy layer 22 not under the meter layer 36 is removed using a wet etching method. The titanium-tungsten-alloy layer 22 under the metal layer 36 has a first sidewall recessed from a second sidewall of the seed layer 32, wherein a distance d2 between the first sidewall and the second sidewall is between 0.3 and 2 micrometers.

Thereby, in the present invention, multiple metal traces 38 (only one of them is shown) and multiple metal traces 40 (only one of them is shown) can be formed on the polymer layer 30 and on the pads 16, such as aluminum pads or copper pads, exposed, respectively, by the openings 30*a*. Each of the metal traces 38, acting as redistributed metal traces, is formed on the polymer layer 30 and on the pad 16, such as aluminum pad or copper pad, exposed by the opening 30*a* and comprises a metal pad 47*a* connected to the pad 16, wherein the position of the metal pad 47*a* from a top perspective view is different from that of the pad 16, to which the metal trace 38 is connected. Each of the metal traces 40, acting as interconnection traces, is formed on the polymer layer 30 and on the pads 16, such as aluminum pads or copper pads, exposed, respectively, by the openings 30*a* and comprises a metal pad 47*b* connected to the pads 16, wherein the position of the metal pad 47*b* from a top perspective view is different from that of each one of the pads 16, to which the metal trace 40 is connected. The metal traces 38 and 40 can be formed of the titanium-tungsten-alloy layer 22, the seed layer 32 on the titanium-tungsten-alloy layer 22 and the metal layer 36 on the seed layer 32. Multiple active devices, such as MOS devices, in or over the semiconductor substrate 2 can be connected to one another through the metal trace 40 on the polymer layer 30.

Figure 4K:
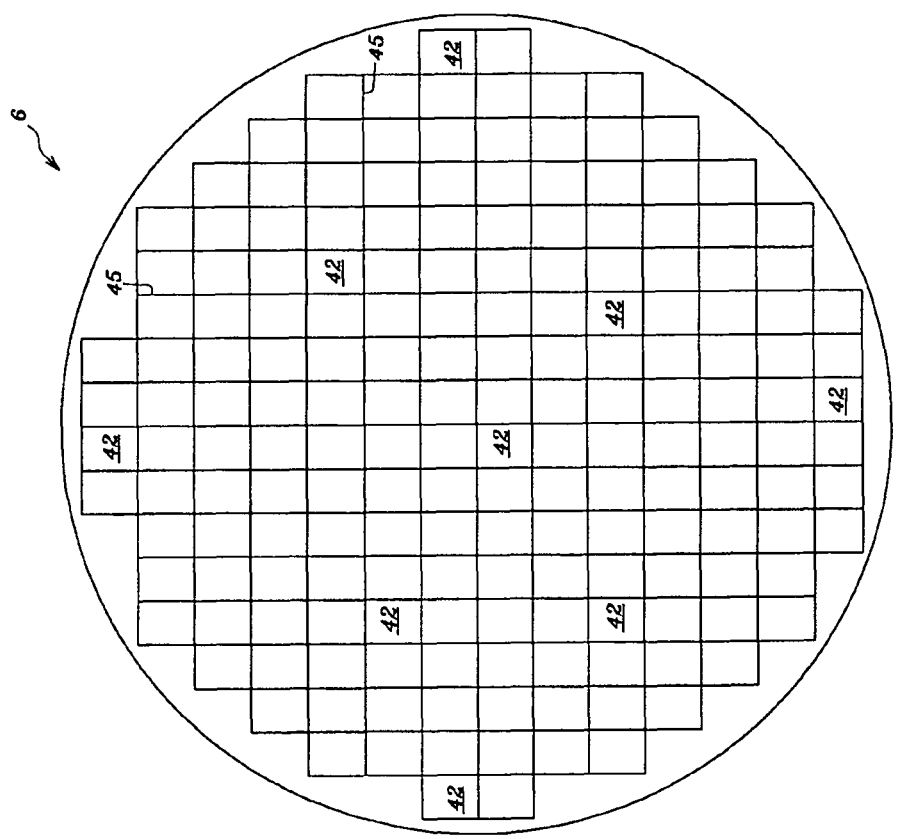
FIG. 4K is a top view showing a semiconductor wafer with multiple metal traces.

Referring to FIG. 4K, the semiconductor wafer 6 includes multiple dies 42 with scribe lines 45 between neighboring two of the dies 42. In the following wafer dicing process, the semiconductor wafer 6 can be cut along the scribe lines 45 to separate the dies 42. Each of the dies 42 may have multiple metal traces, such as the metal traces 38 or the metal traces 40, over the passivation layer 14, wherein the metal traces 38 and 40 comprise multiple metal pads 47*a* and 47*b*, wherein the positions of the metal pads 47*a* and 47*b* from a top perspective view are different from those of the pads 16, to which the metal traces 38 and 40 are connected.

Figure 4L:
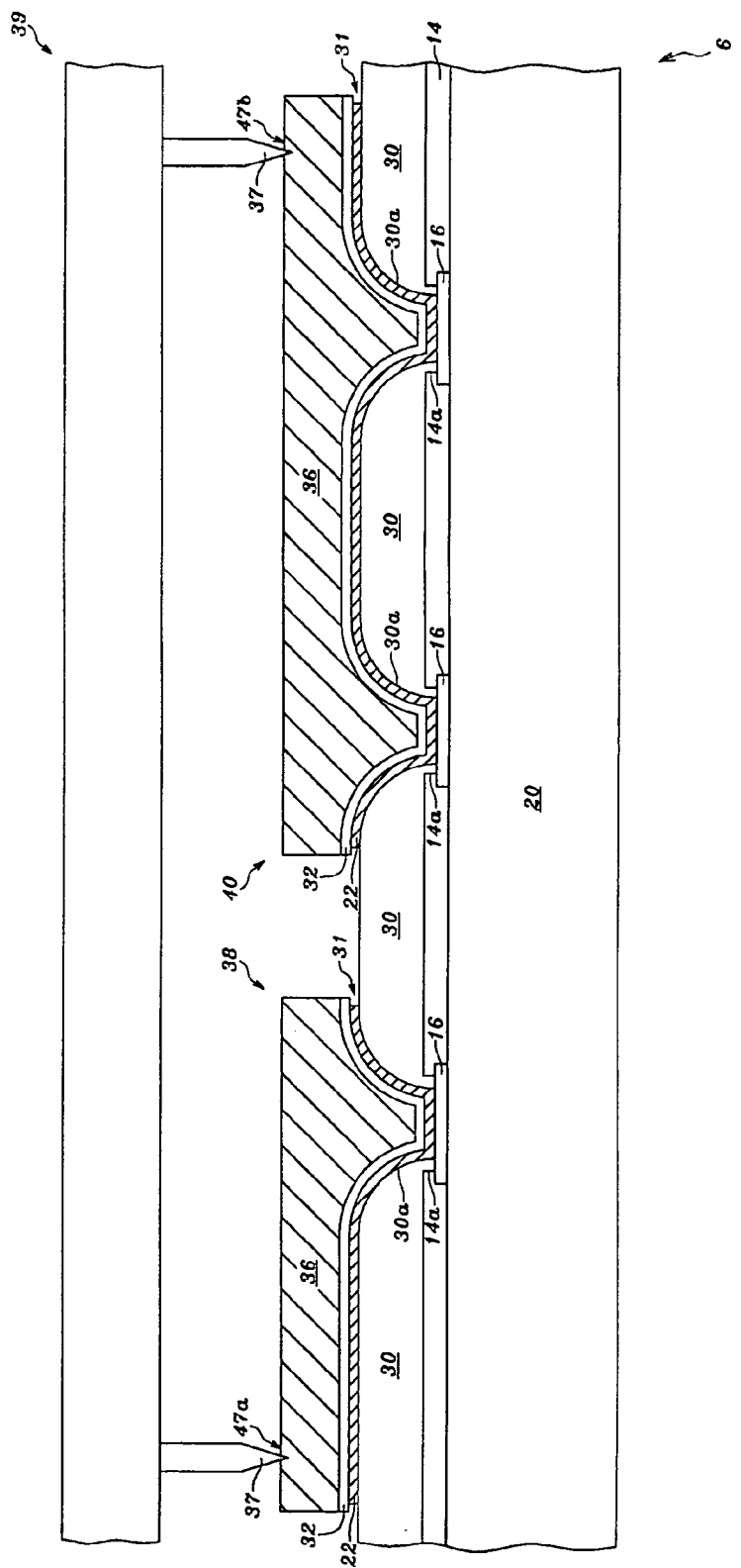

Referring to FIGS. 4K and 4L, after etching the titanium-tungsten-alloy layer 22 not under the metal layer 36, a chip probing (CP) test can be performed to electrically test all dies 42 of the semiconductor wafer 6 shown in FIG. 4J by contacting multiple probe tips 37 of a probe card 39 with some of the metal pads 47*a* and 47*b* of the semiconductor wafer 6, in sequence, until the probe tips 37 of the probe card 39 have contacted with the entire metal pads 47*a* and 47*b* provided by the semiconductor wafer 6. The probe tips 37 can contact with the entire metal pads 47*a* and 47*b* provided by one of the dies 42 of the semiconductor wafer 6 once, or the probe tips 37 can contact with the entire metal pads 47*a* and 47*b* provided by at least two of the dies 42 of the semiconductor wafer 6 once. The probe card 39 can be a vertical probe card, that is, the probe tips 37 can vertically contact with top surfaces of the metal pads 47*a* and 47*b*. The material of the probe tips 37 may include tungsten or rhenium.

Therefore, all dies 42 of the semiconductor wafer 6 can be electrically tested by contacting the probe tips 37 of the probe card 39 with the entire metal pads 47*a* and 47*b* provided by one or more than one of the dies 42 once, until the probe tips 37 of the probe card 39 have contacted with the entire metal pads 47*a* and 47*b* provided by the semiconductor wafer 6. The electrically testing process comprises following steps:

Step 1: the probe tips 37 of the probe card 39 probe the entire metal pads 47*a* and 47*b* provided by one or more than one of the dies 42 of the semiconductor wafer 6 to electrically test the probed die or dies 42;

Step 2: the probe tips 37 of the probe card 39 probe the entire metal pads 47*a* and 47*b* provided by another one or more than another one of the dies 42 of the semiconductor wafer 6 to electrically test the probed die or dies 42;

Step 3: the probe tips 37 of the probe card 39 are cleaned until the probe tips 37 probe the metal pads 47*a* and 47*b* provided by the semiconductor wafer 6 at greater than 100 times, 150 times or even 200 times for electrically testing the respective dies 42 of the semiconductor wafer 6;

Step 4: after cleaning the probe tips 37 of the probe card 39, the probe tips 37 of the probe card 39 probe the metal pads 47*a* and 47*b* provided by the other untested dies 42 of the semiconductor wafer 6; and Step 5: repeating the step 3 and step 4 until all of the dies 42 of the semiconductor wafer 6 have been electrically tested using the probe card 39.

The probe tips 37 of the probe card 39 may be cleaned by a cleaning sheet to remove metal oxide, such as titanium oxide or tungsten oxide, adhered to the probe tips 37.

In the present invention, the residual of titanium oxide and tungsten oxide remaining on the metal pads 47*a* and 47*b* of the semiconductor wafer 6 can be reduced using the two above-mention methods for removing the titanium-tungsten-alloy layer 22 not under the metal layer 36. Thereby, the probe tips 37 of the probe card 39 should be cleaned only until the probe tips 37 of the probe card 39 contact with the metal pads 47*a* and 47*b* provided by the semiconductor wafer 6 at greater than 100 times, 150 times or even 200 times. The invention can reduce the frequency of cleaning the probe tips 37 on the probe card 39 during a chip probing (CP) test and reduce the frequency of a CP re-test.

After the chip probing (CP) test, the semiconductor wafer 6 can be cut along the scribe lines 45 into multiple individual semiconductor chips 42, integrated circuit chips.

Figure 4M:
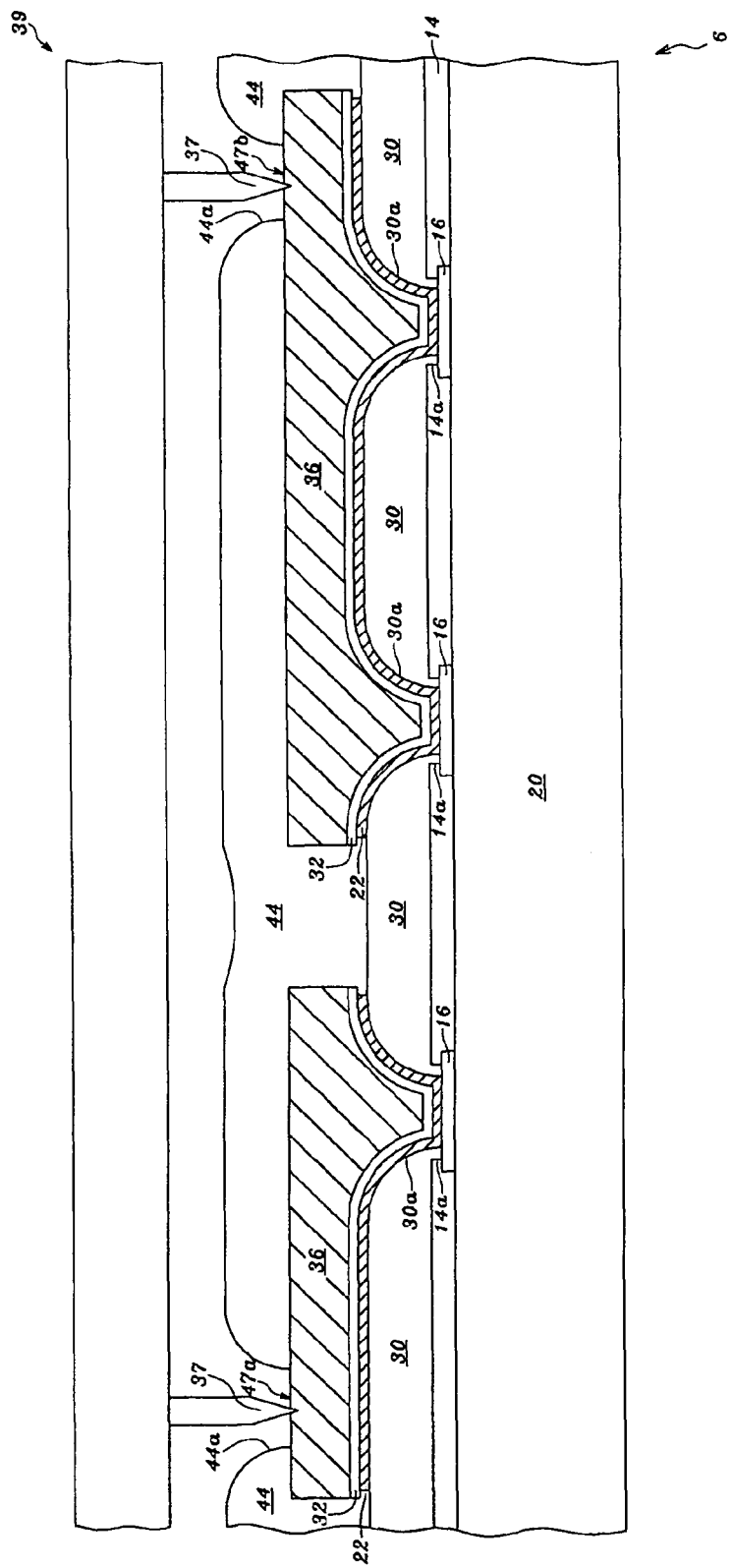

Referring to FIG. 4M, after the step shown in FIG. 4J, a polymer layer 44 can be formed on the polymer layer 30 and on the metal layer 36 of the metal traces 38 and 40, and openings 44*a* are formed in the polymer layer 44 by a photolithography process, exposing the metal layer 36 at the metal pads 47*a* and 47*b*, respectively.

The material of the polymer layer 44 may include benzocyclobutane (BCB), polyimide (PI), polyurethane, epoxy resin, a parylene-based polymer, a solder-mask material, an elastomer, or a porous dielectric material. The polymer layer 44 has a thickness of between 3 and 25 μm.

The polymer layer 44 can be formed by a spin-on coating process, a lamination process or a screen-printing process. Below, the process of forming a patterned polymer layer 44 is exemplified with the case of spin-on coating a polyimide layer on the polymer layer 30 and on the metal layer 36 of the metal traces 38 and 40, and then patterning the polyimide layer. Alternatively, the polymer layer 44 can be formed by spin-on coating a layer of benzocyclobutane, polyurethane, epoxy resin, a parylene-based polymer, a solder-mask material, an elastomer or a porous dielectric material on polymer layer 30 and on the metal layer 36 of the metal traces 38 and 40, and then patterning the layer.

For example, the polymer layer 44 can be formed by spin-on coating a negative-type photosensitive polyimide layer, containing ester-typer precursor, having a thickness of between 6 and 50 μm on polymer layer 30 and on the metal layer 36 of the metal traces 38 and 40, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings in the exposed polyimide layer exposing the metal layer 36 at the metal pads 47a and 47b, respectively, then curing or heating the developed polyimide layer at a peak temperature of between 180 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the metal layer 36 at the metal pads 47a and 47b exposed by the polyimide openings with an $O_2$ plasma or a plasma containing fluorine of below 200 PPM and oxygen, such that the polymer layer 44 can be patterned with the openings 44a in the polymer layer 44 exposing the metal layer 36 at the metal pads 47a and 47b, respectively. For example, the developed polyimide layer can be cured or heated at a temperature between 180 and 250° C. for a time of between 20 and 150 minutes in a nitrogen ambient or in an oxygen-free ambient. Alternatively, the developed polyimide layer can be cured or heated at a temperature between 250 and 290° C. for a time of between 20 and 150 minutes in a nitrogen ambient or in an oxygen-free ambient. Alternatively, the developed polyimide layer can be cured or heated at a temperature between 290 and 400° C. for a time of between 20 and 150 minutes in a nitrogen ambient or in an oxygen-free ambient.

After forming the polymer layer 44 on the polymer layer 30 and on the metal layer 36 of the metal traces 38 and 40, the above-mentioned steps as shown in FIGS. 4K-4L can be performed to electrically test the semiconductor wafer 6. After the chip probing (CP) test, the semiconductor wafer 6 can be cut along the scribe lines into multiple individual semiconductor chips.

Figure 4N:
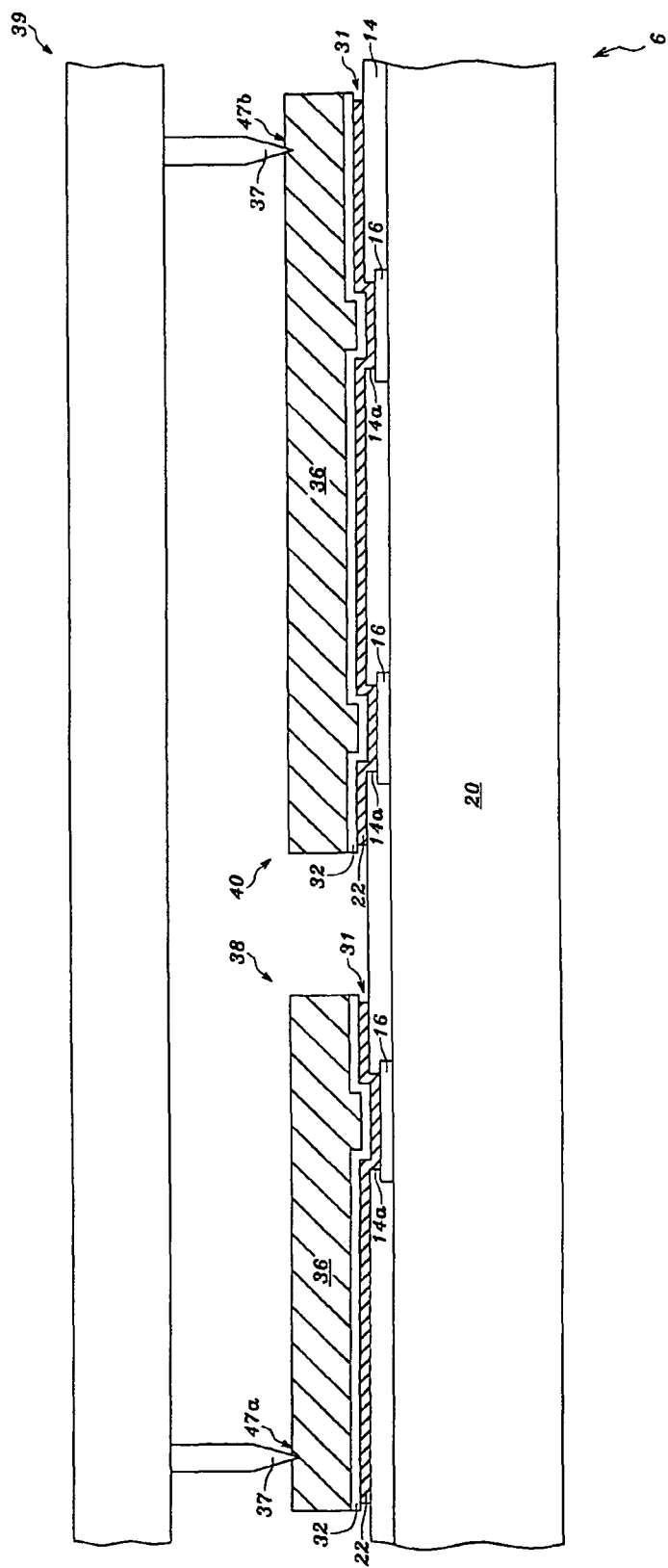
Figure 40:
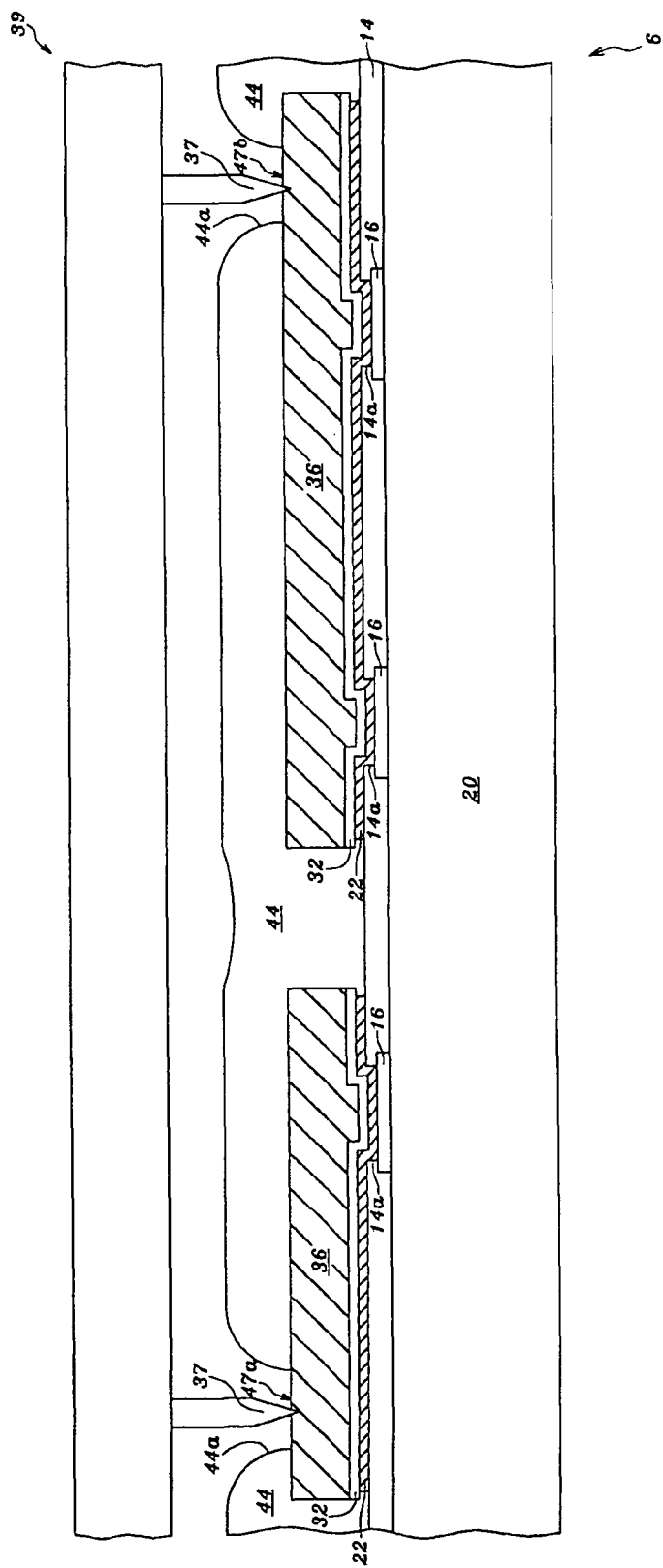

Referring to FIG. 4N, in the present invention, the step of forming the polymer layer 30 on the passivation layer 14, as shown in FIGS. 4A and 4B, can be omitted, that is, the titanium-tungsten-alloy layer 22 having a thickness of between 0.02 and 0.5 μm can be directly formed on the passivation layer 14 and on the pads 16, such as aluminum pads or copper pads, exposed, respectively, by the openings 14a, followed by the steps as referred to in FIGS. 4D-4L, followed by cutting the semiconductor wafer 6 along the scribe lines into multiple individual semiconductor chips.

Referring to FIG. 4O, in the present invention, the step of forming the polymer layer 30 on the passivation layer 14, as shown in FIGS. 4A and 4B, can be omitted, that is, the titanium-tungsten-alloy layer 22 having a thickness of between 0.02 and 0.5 μm can be directly formed on the passivation layer 14 and on the pads 16, such as aluminum pads or copper pads, exposed, respectively, by the openings 14a, followed by the steps as referred to in FIGS. 4D-4J, followed by forming the polymer layer 44 on the polymer layer 30 and on the metal layer 36 of the metal traces 38 and 40, the openings 44a in the polymer layer 44 exposing the metal layer 36 at the metal pads 47a and 47b, respectively, followed by the steps as referred to in FIGS. 4K-4L, followed by cutting the semiconductor wafer 6 along the scribe lines into multiple individual semiconductor chips.

Referring to FIG. 4P, each of the metal traces 38 can be formed on the metal cap 18 and on the polymer layer 30, and each of the metal traces 40 can be formed on at least two metal caps 18 and on the polymer layer 30, that is, the polymer layer 30 can be formed on the passivation layer 14, the openings 30a in the polymer layer 30 exposing the aluminum-containing layer of the metal caps 18, wherein the aluminum-containing layer may be an aluminum layer, an Al—Si—Cu-alloy layer or an aluminum-copper-alloy layer, followed by sputtering the titanium-tungsten-alloy layer 22 having a thickness of between 0.1 and 0.5 μm on the polymer layer 30 and on the aluminum-containing layer of the metal caps 18, followed by the above-mentioned steps as shown in FIGS. 4D-4L, followed by cutting the semiconductor wafer 6 along the scribe lines into multiple individual semiconductor chips. The specification of the polymer layer 30 shown in FIG. 4P can be referred to as the polymer layer 30 illustrated in FIGS. 2K and 2L. The process of forming the polymer layer 30, as shown in FIG. 4P, can be referred to as the process of forming the polymer layer 30, as illustrated in FIG. 2K or 2L.

Figure 4Q:
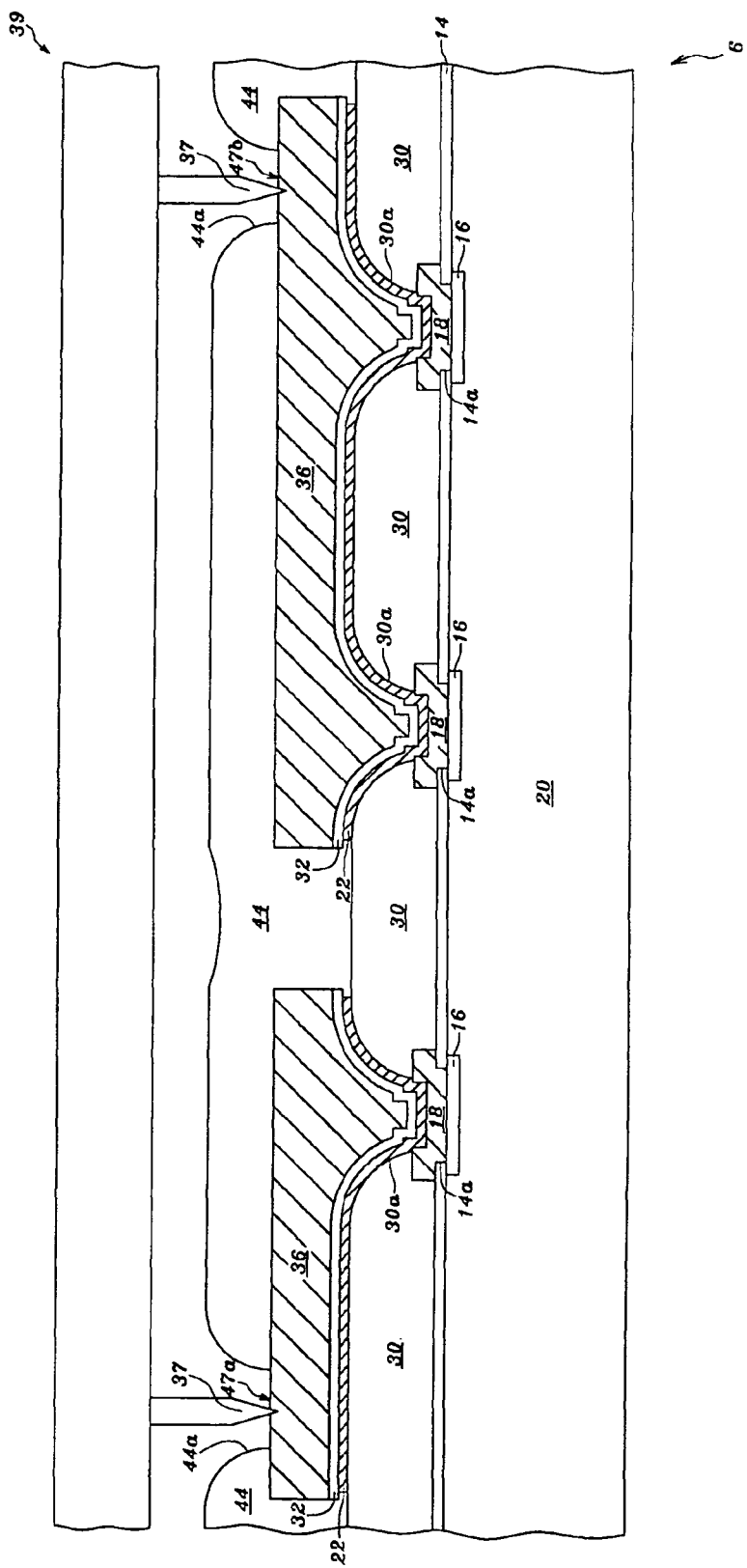

Referring to FIG. 4Q, each of the metal traces 38 can be formed on the metal cap 18 and on the polymer layer 30, and each of the metal traces 40 can be formed on at least two metal caps 18 and on the polymer layer 30, that is, the polymer layer 30 can be formed on the passivation layer 14, the openings 30a in the polymer layer 30 exposing the aluminum-containing layer of the metal caps 18, wherein the aluminum-containing layer may be an aluminum layer, an Al—Si—Cu-alloy layer or an aluminum-copper-alloy layer, followed by sputtering the titanium-tungsten-alloy layer 22 having a thickness of between 0.1 and 0.5 μm on the polymer layer 30 and on the aluminum-containing layer of the metal caps 18, followed by the above-mentioned steps as shown in FIGS. 4D-4J, followed by forming the polymer layer 44 on the polymer layer 30 and on the metal layer 36 of the metal traces 38 and 40, the openings 44a in the polymer layer 44 exposing the metal layer 36 at the pads 47a and 47b, followed by the steps as referred to in FIGS. 4K-4L, followed by cutting the semiconductor wafer 6 along the scribe lines into multiple individual semiconductor chips.

Figure 4R:
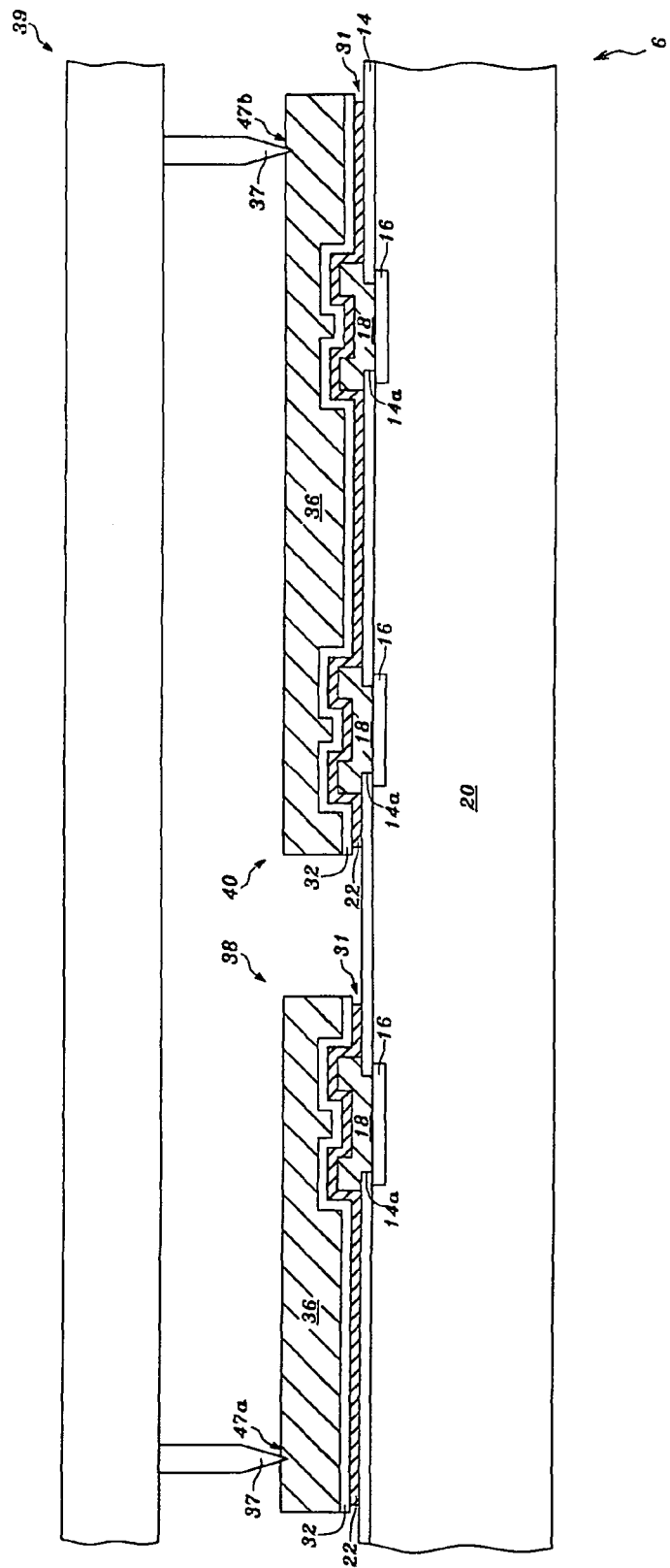

Referring to FIG. 4R, in the present invention, the step of forming the polymer layer 30 on the passivation layer 14, as shown in FIG. 4P, can be omitted, that is, the titanium-tungsten-alloy layer 22 having a thickness of between 0.02 and 0.5 μm can be directly formed on the passivation layer 14 and on the aluminum-containing layer of the metal caps 18, wherein the aluminum-containing layer may be an aluminum layer, an Al—Si—Cu-alloy layer or an aluminum-copper-alloy layer, followed by the steps as referred to in FIGS. 4D-4L, followed by cutting the semiconductor wafer 6 along the scribe lines into multiple individual semiconductor chips.

Figure 4S:
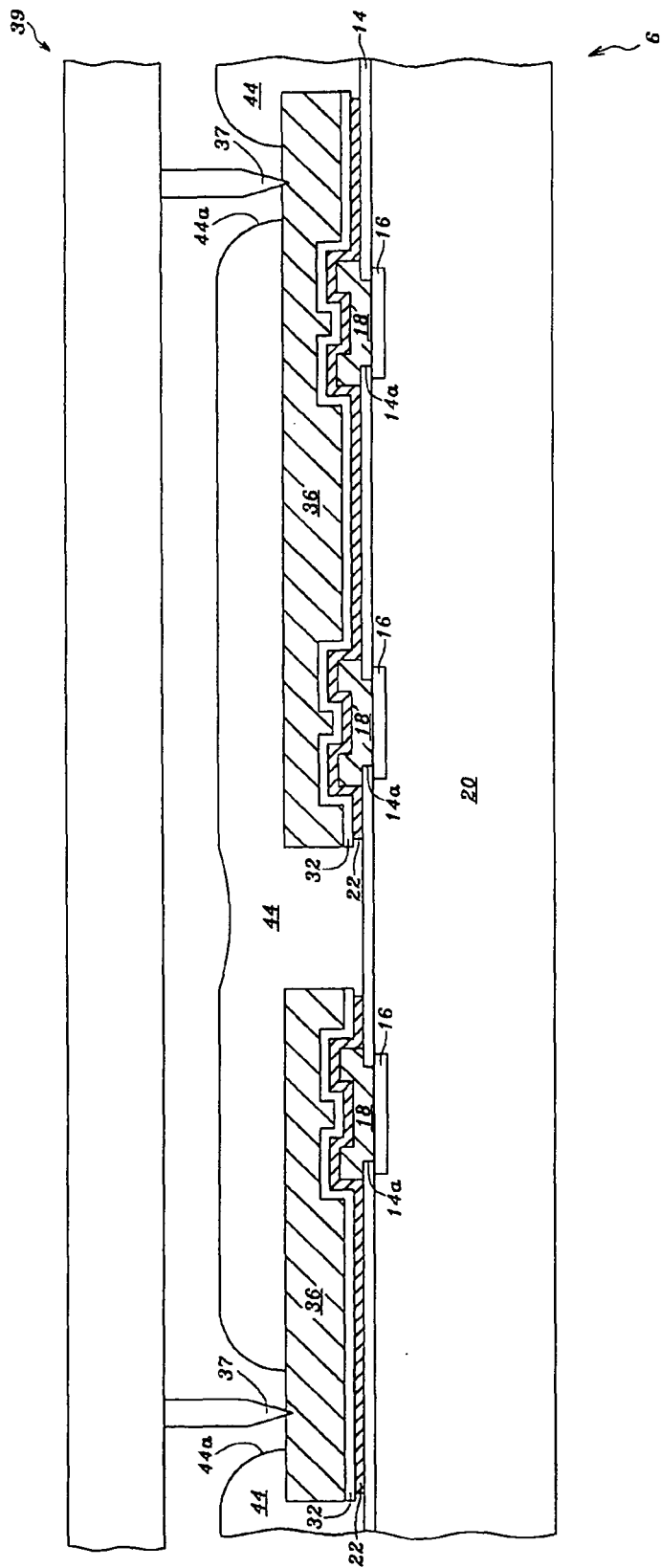

Referring to FIG. 4S, in the present invention, the step of forming the polymer layer 30 on the passivation layer 14, as shown in FIG. 4Q, can be omitted, that is, the titanium-tungsten-alloy layer 22 having a thickness of between 0.02 and 0.5 μm can be directly formed on the passivation layer 14 and on the aluminum-containing layer of the metal caps 18, wherein the aluminum-containing layer may be an aluminum layer, an Al—Si—Cu-alloy layer or an aluminum-copper-alloy layer, followed by the steps as referred to in FIGS. 4D-4J, followed by forming the polymer layer 44 on the passivation layer 14 and on the metal layer 36 of the metal traces 38 and 40, the openings 44a in the polymer layer 44 exposing the metal layer 36 of the metal pads 47a and 47b, followed by the steps as referred to in FIGS. 4K-4L, followed by cutting the semiconductor wafer 6 along the scribe lines into multiple individual semiconductor chips.

Figure 4T:
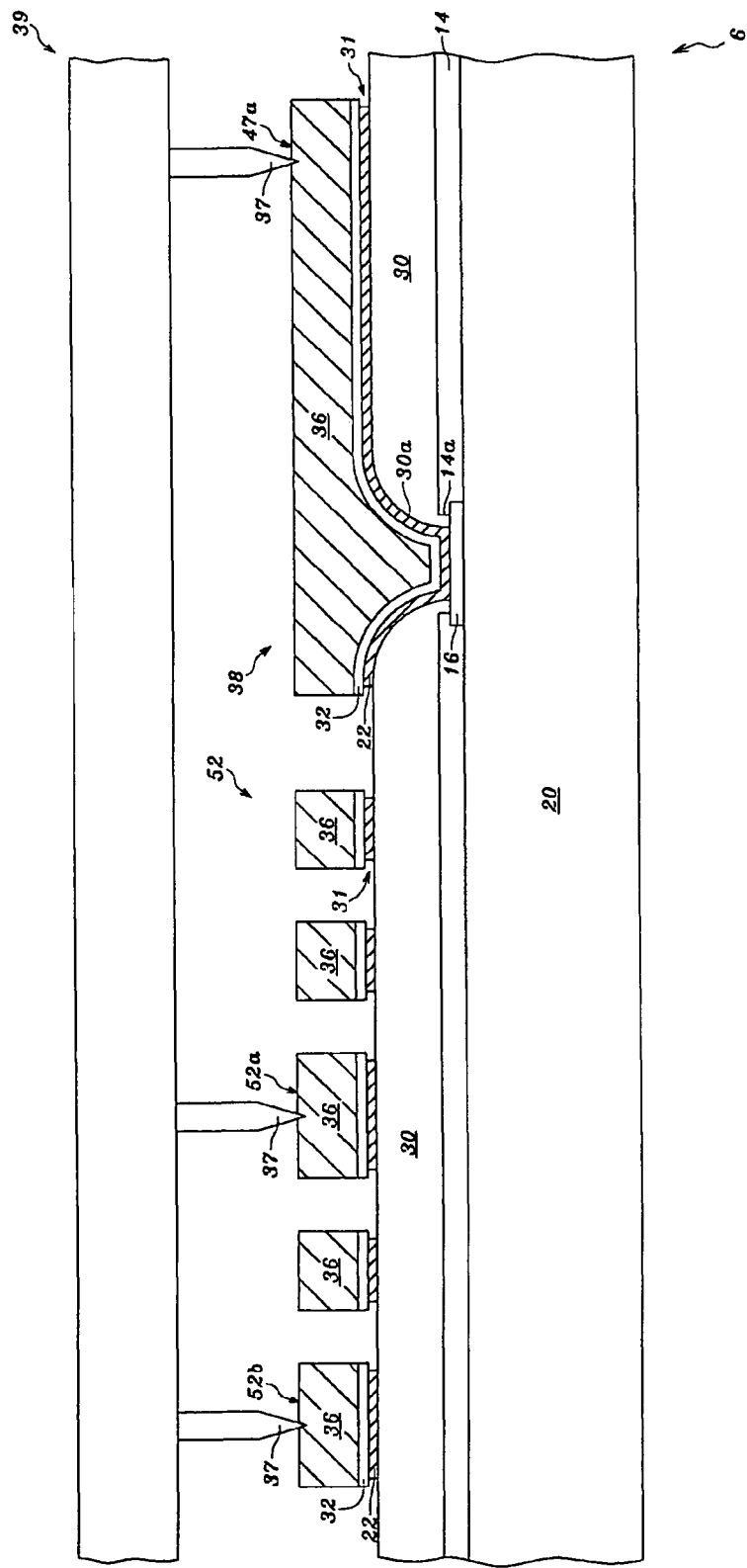

Referring to FIG. 4T, the metal traces 40 can be replaced by multiple coils 52 (only one of them is shown). Each of the coils 52 can be formed of the titanium-tungsten-alloy layer 22, the seed layer 32 on the titanium-tungsten-alloy layer 22 and the metal layer 36 on the seed layer 32, and each of the coils 52 comprises a first terminal and a second terminal. The first terminal is connected to a metal pad 52a and the second terminal is connected to a metal pad 52b, wherein the metal pads 52a and 52b can be used to have wires bonded thereon using a wirebonding process or used to have metal bumps formed thereon using sputtering and electroplating processes, without being connected to any pad 16 exposed by an opening 14a in the passivation layer 14. The process of forming the coils 52, as shown in FIG. 4T, can be referred to as the process of forming the metal traces 38 and 40, as illustrated in FIGS. 4C-4J. After etching the titanium-tungsten-alloy layer 22 not under the metal layer 36, the above-mentioned steps as shown in FIGS. 4K-4L can be performed to electrically test the semiconductor wafer 6 by contacting the probe tips 37 with the metal pads 52a, 52b and/or 47a. After the chip probing (CP) test, the semiconductor wafer 6 can be cut along the scribe lines into multiple individual semiconductor chips.

Figure 4U:
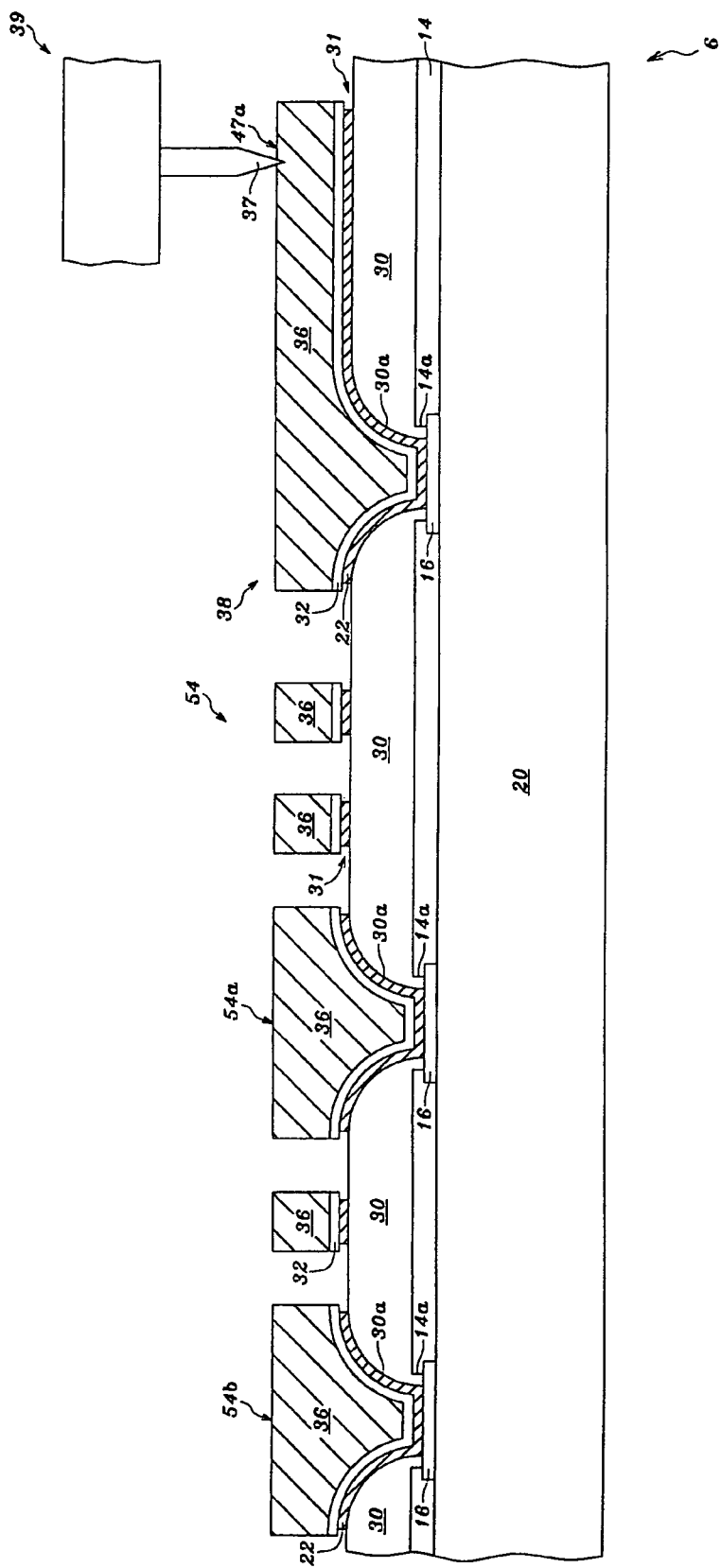

Referring to FIG. 4U, the metal traces 40 can be replaced by multiple coils 54. Each of the coils 54 can be formed of the titanium-tungsten-alloy layer 22, the seed layer 32 on the titanium-tungsten-alloy layer 22 and the metal layer 36 on the seed layer 32, and each of the coils 54 comprises a first terminal 54a and a second terminal 54b. The first terminal 54a and the second terminal 54b are connected, respectively, to two pads 16. The process of forming the coils 54, as shown in FIG. 4U, can be referred to as the process of forming the metal traces 38 and 40, as illustrated in FIGS. 4C-4J. After etching the titanium-tungsten-alloy layer 22 not under the metal layer 36, the above-mentioned steps as shown in FIGS. 4K-4L can be performed to electrically test the semiconductor wafer 6 by contacting the probe tips 37 with the metal pads 47a (one of them is shown). After the chip probing (CP) test, the semiconductor wafer 6 can be cut along the scribe lines into multiple individual semiconductor chips.

Figure 4V:
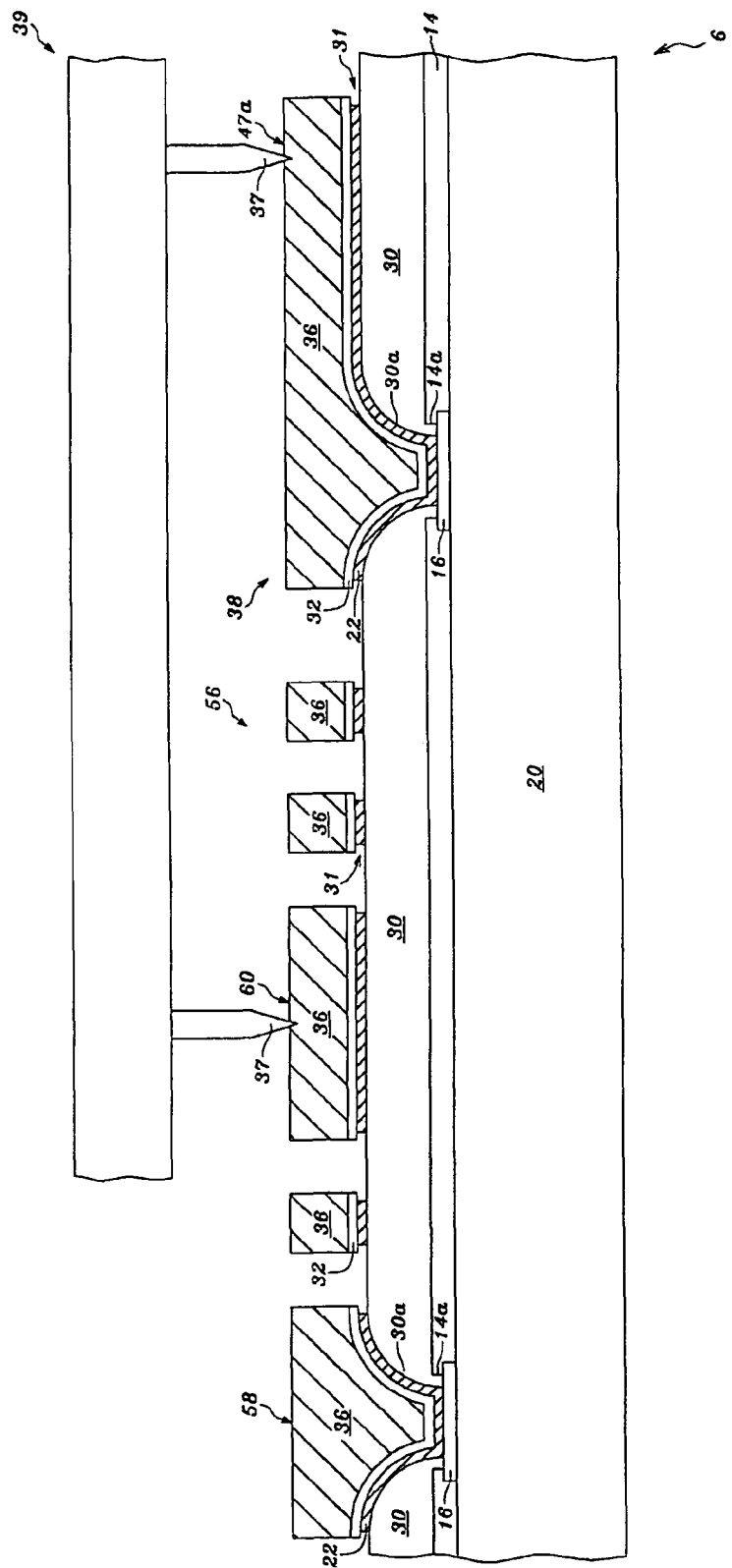

Referring to FIG. 4V, the metal traces 40 can be replaced by multiple coils 56. Each of the coils 56 can be formed of the titanium-tungsten-alloy layer 22, the seed layer 32 on the titanium-tungsten-alloy layer 22 and the metal layer 36 on the seed layer 32, and each of the coils 56 comprises a first terminal and a second terminal 58. The first terminal is connected to a metal pad 60, wherein the metal pad 60 can be used to have a wire bonded thereon using a wirebonding process or used to have a metal bump formed thereon using sputtering and electroplating processes, without being connected to any pad 16 exposed by an opening 14a in the passivation layer 14. The second terminal 58 is connected to a pad 16, such as copper pad or aluminum pad, through the opening 30a in the polymer layer 30. The process of forming the coils 56, as shown in FIG. 4V, can be referred to as the process of forming the metal traces 38 and 40, as illustrated in FIGS. 4C and 4J. After etching the titanium-tungsten-alloy layer 22 not under the metal layer 36, the above-mentioned steps as shown in FIGS. 4K-4L can be performed to electrically test the semiconductor wafer 6 by contacting the probe tips 37 with the metal pads 60 and/or 47a. After the chip probing (CP) test, the semiconductor wafer 6 can be cut along the scribe lines into multiple individual semiconductor chips.

EMBODIMENT 4

Figure 5C:
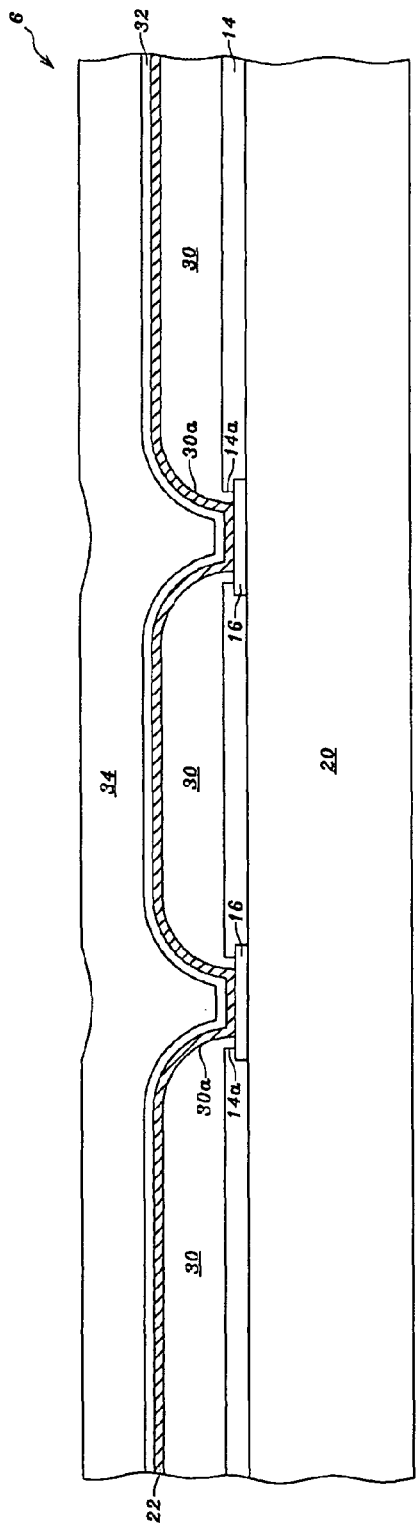

Referring to FIG. 5A, after the step shown in FIG. 4A, a titanium-tungsten-alloy layer 22 having a thickness of between 0.03 and 0.7 μm, and preferably of between 0.03 and 0.35 μm, can be formed on the polymer layer 30 and on the pads 16 exposed, respectively, by the openings 30a. For example, the titanium-tungsten-alloy layer 22 having a thickness of between 0.02 and 0.5 μm can be sputtered on the polymer layer 30 and on the pads 16, principally made of aluminum, exposed, respectively, by the openings 30a. Alternatively, the titanium-tungsten-alloy layer 22 having a thickness of between 0.02 and 0.5 μm can be sputtered on the polymer layer 30 and on the pads 16, principally made of copper, exposed, respectively, by the openings 30a. The descriptions of this embodiment in FIGS. 5A-5L and 5N are based on the structure shown in FIG. 4A. Alternatively, the process of forming metal traces and metal bumps on the metal traces shown in FIGS. 5A-5L and 5N can be performed on the structure shown in FIG. 4B.

Referring to FIG. 5B, a seed layer 32 having a thickness of between 0.02 and 1 μm can be sputtered on the titanium-tungsten-alloy layer 22. Alternatively, the seed layer 32 can be formed by a vapor deposition method, an electroless plating method or a physical vapor deposition (PVD) method. The seed layer 32 is beneficial to electroplating a metal layer thereon. Thus, the material of the seed layer 32 varies with the material of the electroplated metal layer formed on the seed layer 32. When a gold layer is to be electroplated on the seed layer 32, gold is a preferable material to the seed layer 32. When a copper layer is to be electroplated on the seed layer 32, copper is a preferable material to the seed layer 32.

For example, the seed layer 32 can be formed by sputtering a gold layer with a thickness of between 0.02 and 1 μm, and preferably of between 0.02 and 0.3 μm, on the titanium-tungsten-alloy layer 22. Alternatively, the seed layer 32 can be formed by sputtering a copper layer with a thickness of between 0.02 and 1 μm, and preferably of between 0.03 and 0.5 μm, on the titanium-tungsten-alloy layer 22.

Figure 5D:
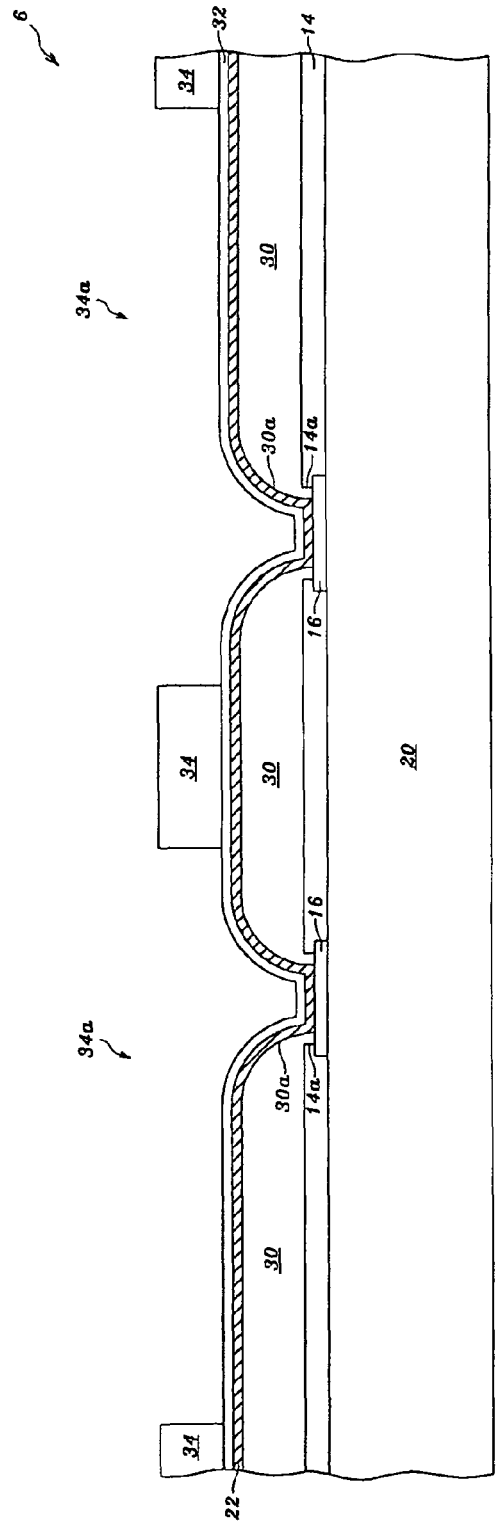

Referring to FIG. 5C, a photoresist layer 34, such as positive-type photoresist layer, having a thickness of between 5 and 20 micrometers is spin-on coated on the seed layer 32. Referring to FIG. 5D, the photoresist layer 34 is patterned with the processes of exposure and development to form multiple openings 34a in the photoresist layer 34 exposing the seed layer 32. A 1× stepper or 1× contact aligner can be used to expose the photoresist layer 34 during the process of exposure.

For example, the photoresist layer 34 can be formed by spin-on coating a positive-type photosensitive polymer layer having a thickness of between 5 and 20 μm on the seed layer 32, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 32 with an $O_2$ plasma or a plasma containing fluorine of below 200 PPM and oxygen, such that the photoresist layer 34 can be patterned with the openings 34a in the photoresist layer 34 exposing the seed layer 32.

Figure 5E:
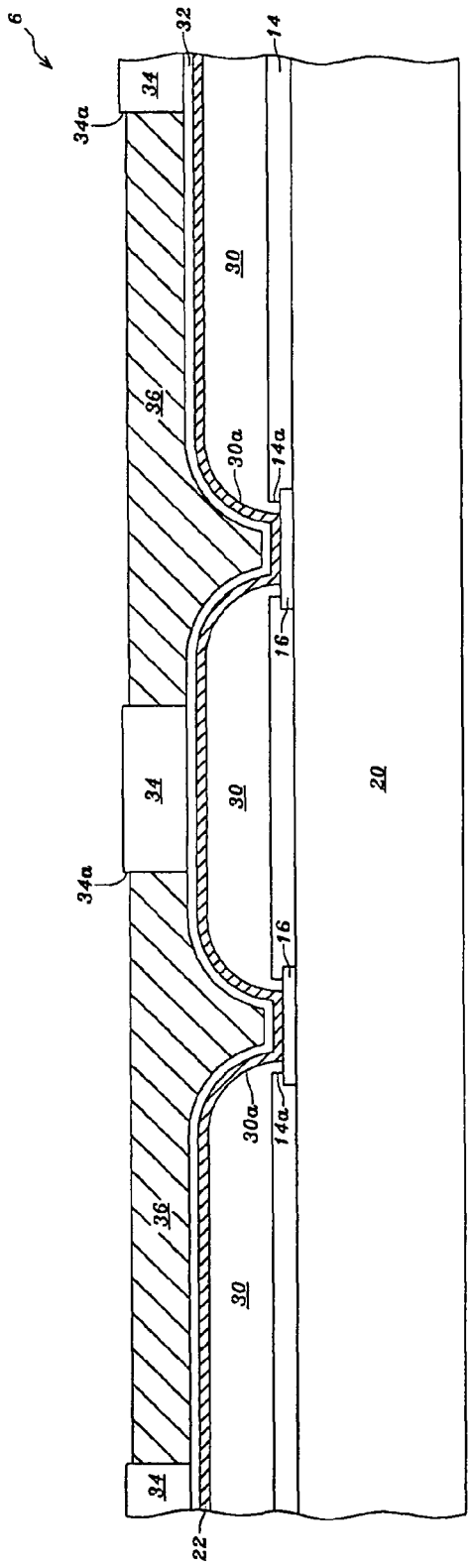

Referring to FIG. 5E, a metal layer 36 having a thickness of between 2 and 30 micrometers, and preferably of between 3 and 15 μm, is formed on the seed layer 32 exposed by the openings 34a. The material of the metal layer 36 may include gold, copper, nickel or palladium.

For example, the metal layer 36 may be formed by electroplating a copper layer with a thickness of between 2 and 30 μm, and preferably of between 3 and 15 μm, on the seed layer 32, made of copper, exposed by the openings 34a. Alternatively, the metal layer 36 may be formed by electroplating a copper layer with a thickness of between 2 and 20 μm on the seed layer 32, made of copper, exposed by the openings 34a, then electroplating a nickel layer with a thickness of between 0.5 and 5 μm on the copper layer in the openings 34a, and then electroplating a gold layer with a thickness of between 0.05 and 5 μm on the nickel layer in the openings 34a. Alternatively, the metal layer 36 may be formed by electroplating a copper layer with a thickness of between 2 and 23 μm on the seed layer 32, made of copper, exposed by the openings 34a, then electroplating a nickel layer with a thickness of between 0.5 and 5 μm on the copper layer in the openings 34a, and then electroless plating a gold layer with a thickness of between 0.05 and 2 μm on the nickel layer in the openings 34a. Alternatively, the metal layer 36 may be formed by electroplating a copper layer with a thickness of between 2 and 23 μm on the seed layer 32, made of copper, exposed by the openings 34a, then electroplating a nickel layer with a thickness of between 0.5 and 5 μm on the copper layer in the openings 34a, and then electroplating a palladium layer with a thickness of between 0.05 and 2 μm on the nickel layer in the openings 34a. Alternatively, the metal layer 36 may be formed by electroplating a copper layer with a thickness of between 2 and 23 μm on the seed layer 32, made of copper, exposed by the openings 34a, then electroplating a nickel layer with a thickness of between 0.5 and 5 μm on the copper layer in the openings 34a, and then electroless plating a palladium layer with a thickness of between 0.05 and 2 μm on the nickel layer in the openings 34a. Alternatively, the metal layer 36 may be formed by electroplating a copper layer with a thickness of between 2 and 34 μm on the seed layer 32, made of copper, exposed by the openings 34a, then electroplating a nickel layer with a thickness of between 0.5 and 5 μm on the copper layer in the openings 34a, then electroplating or electroless plating a palladium layer with a thickness of between 0.05 and 0.5 μm on the nickel layer in the openings 34a, and then electroplating or electroless plating a gold layer with a thickness of between 0.01 and 0.5 μm on the palladium layer in the openings 34a.

For example, the metal layer 36 may be formed by electroplating a gold layer having a thickness of between 2 and 30 micrometers, and preferably of between 3 and 15 μm, on the seed layer 32, made of gold, exposed by the openings 34a with an electroplating solution containing gold of between 1 and 20 grams per litter (g/L), and preferably between 5 and 15 g/L, and sulfite ion of between 10 and 120 g/L, and preferably between 30 and 90 g/L. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$).

The operational parameters of electroplating the gold layer are described below:

1. The above-mentioned electroplating solution used to electroplate the gold layer on the seed layer 32 exposed by the openings 34a can be at a temperature of between 30 and 70° C., and preferably between 45 and 65° C.

2. The above-mentioned electroplating solution can be used to electroplate the gold layer on the seed layer 32 exposed by the openings 34a through an electric current with a current density at between 1 and 10 mA/cm$^2$, and preferably between 4 and 6 mA/cm$^2$.

3. The above-mentioned electroplating solution may have a pH value of between 6 and 9, and preferably between 7 and 8.5, to electroplate the gold layer on the seed layer 32 exposed by the openings 34a.

Alternatively, the metal layer 36 may be formed by electroplating a gold layer having a thickness between 2 and 30 μm, and preferably between 3 and 15 μm, on the seed layer 32, made of gold, exposed by the openings 34a with an electroplating solution containing cyanide.

Figure 5F:
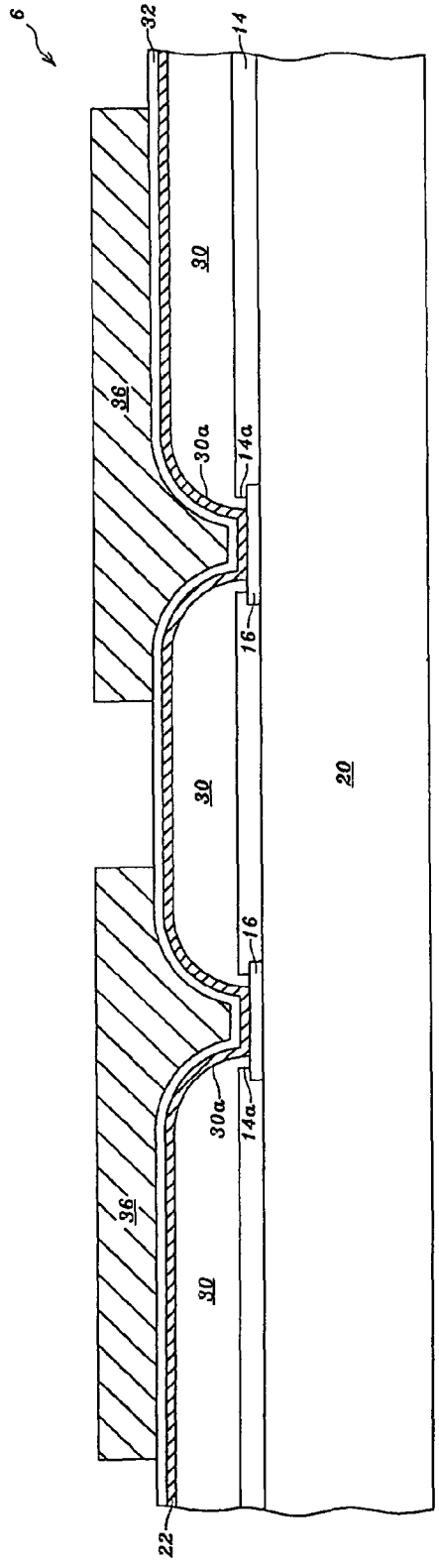

Referring to FIG. 5F, after the metal layer 36 is formed, most of the photoresist layer 34 can be removed using an organic solution with amide. However, some residuals from the photoresist layer 34 could remain on the metal layer 36 and on the seed layer 32. Thereafter, the residuals can be removed from the metal layer 36 and from the seed layer 32 with a plasma, such as $O_2$ plasma or plasma containing fluorine of below 200 PPM and oxygen.

Figure 5G:
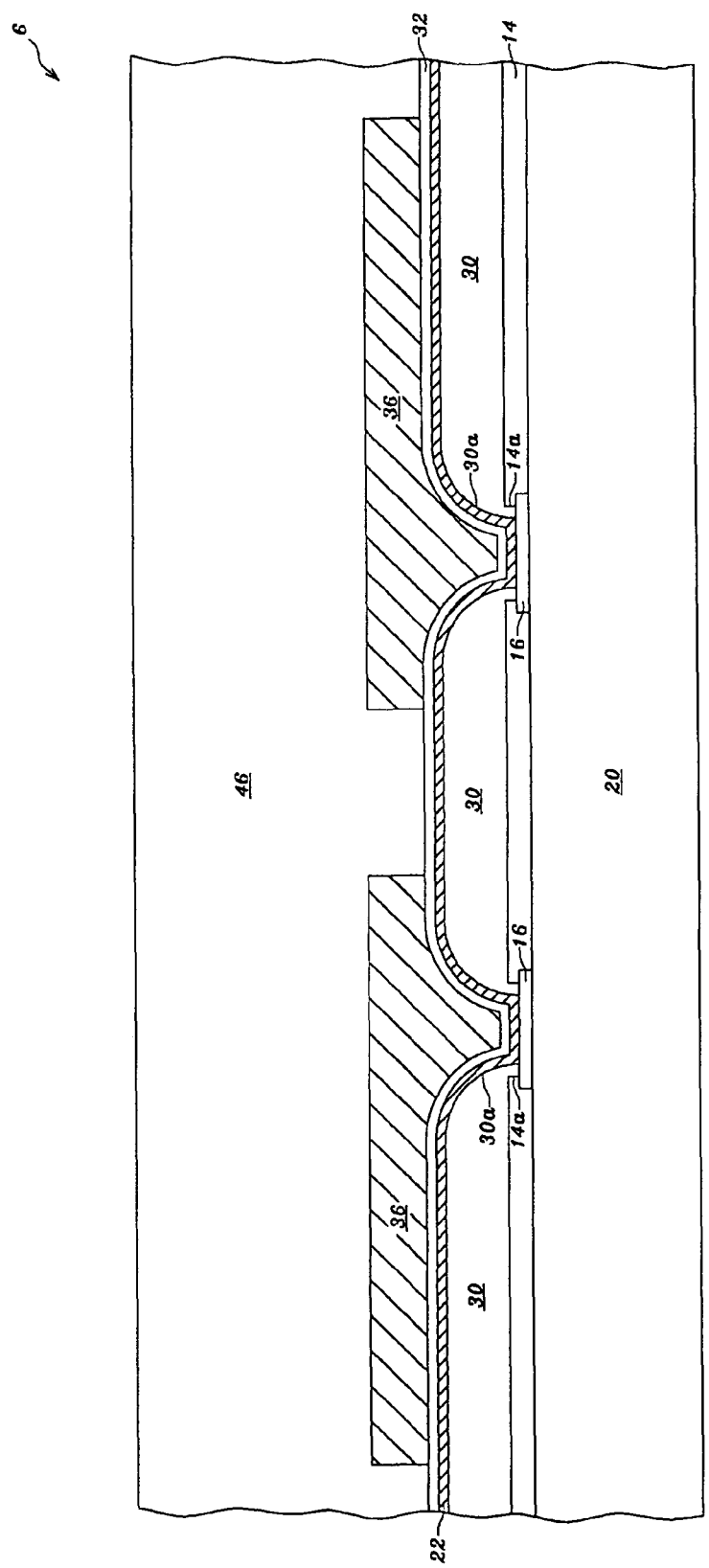
Figure 5H:
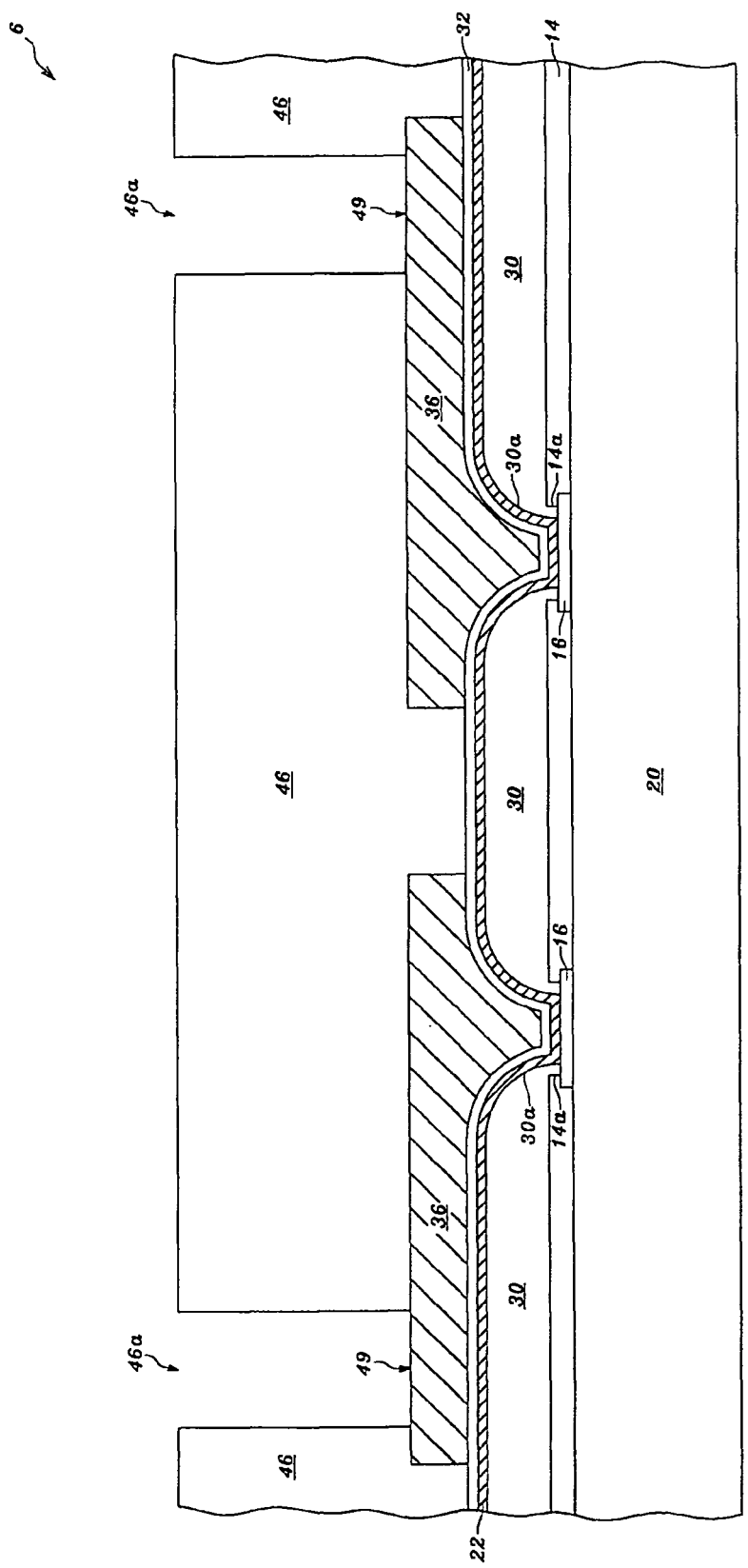

Referring to FIG. 5G, a photoresist layer 46, such as positive-type photoresist layer, having a thickness of between 25 and 50 micrometers is spin-on coated on the seed layer 32 and on the metal layer 36. Referring to FIG. 5H, the photoresist layer 46 is patterned with the processes of exposure and development to form multiple openings 46a in the photoresist layer 46 exposing the metal layer 36 at multiple contact points 49. From a top perspective view, the positions of the contact points 49 may be different from those of the pads 16, respectively, to which the contact points 49 are connected, respectively. A 1× stepper or 1× contact aligner can be used to expose the photoresist layer 46 during the process of exposure.

For example, the photoresist layer 46 can be formed by spin-on coating a positive-type photosensitive polymer layer having a thickness of between 25 and 50 μm on the seed layer 32 and on the metal layer 36, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the metal layer 36 with an $O_2$ plasma or a plasma containing fluorine of below 200 PPM and oxygen, such that the photoresist layer 46 can be patterned with the openings 46a in the photoresist layer 46 exposing the metal layer 36 at the contact points 49.

Figure 5I:
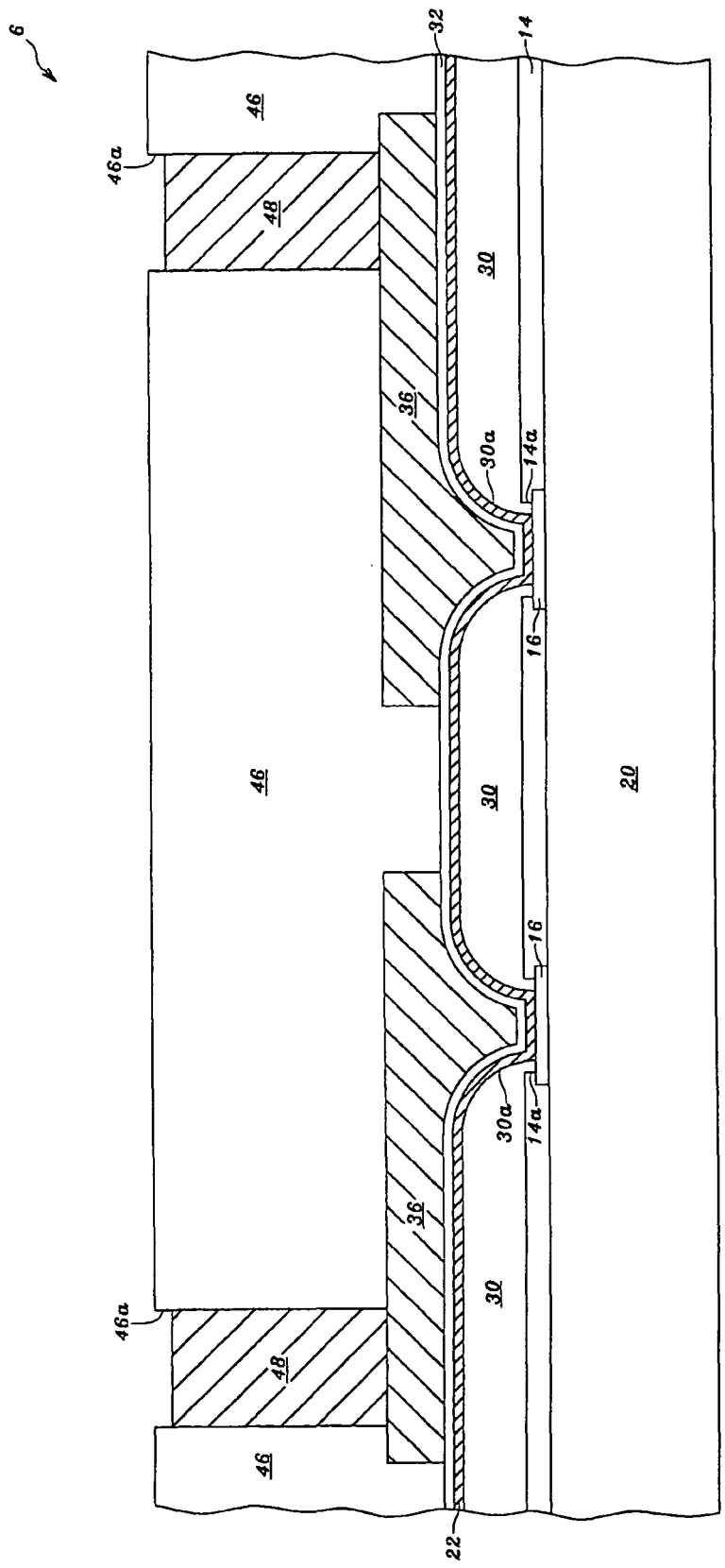

Referring to FIG. 5I, multiple metal bumps 48 (only two of them are shown) having a thickness of between 10 and 50 micrometers, and preferably of between 12 and 20 μm or between 15 and 50 μm, are formed, respectively, on the metal layer 36 at the contact points 49 exposed by the openings 46a. The material of the metal layer 48 may include gold, copper, nickel or palladium.

For example, the metal bumps 48 may be formed by electroplating a copper layer with a thickness of between 10 and 50 μm, and preferably of between 12 and 20 μm or between 15 and 50 μm, on the metal layer 36 at the contact points 49 exposed, respectively, by the openings 46a. Alternatively, the metal bumps 48 may be formed by electroplating a copper layer with a thickness of between 10 and 40 μm on the metal layer 36 at the contact points 49 exposed, respectively, by the openings 46a, then electroplating a nickel layer with a thickness of between 0.5 and 5 μm on the copper layer in the openings 46a, and then electroplating a gold layer with a thickness of between 0.05 and 5 μm on the nickel layer in the openings 46a. Alternatively, the metal bumps 48 may be formed by electroplating a copper layer with a thickness of between 10 and 45 μm on the metal layer 36 at the contact points 49 exposed, respectively, by the openings 46a, then electroplating a nickel layer with a thickness of between 0.5 and 5 μm on the copper layer in the openings 46a, and then electroless plating a gold layer with a thickness of between 0.05 and 2 μm on the nickel layer in the openings 46a. Alternatively, the metal bumps 48 may be formed by electroplating a copper layer with a thickness of between 10 and 45 μm on the metal layer 36 at the contact points 49 exposed, respectively, by the openings 46a, then electroplating a nickel layer with a thickness of between 0.5 and 5 μm on the copper layer in the openings 46a, and then electroplating a palladium layer with a thickness of between 0.05 and 2 μm on the nickel layer in the openings 46a. Alternatively, the metal bumps 48 may be formed by electroplating a copper layer with a thickness of between 10 and 45 μm on the metal layer 36 at the contact points 49 exposed, respectively, by the openings 46a, then electroplating a nickel layer with a thickness of between 0.5 and 5 μm on the copper layer in the openings 46a, and then electroless plating a palladium layer with a thickness of between 0.05 and 2 μm on the nickel layer in the openings 46a. Alternatively, the metal bumps 48 may be formed by electroplating a copper layer with a thickness of between 10 and 45 μm on the metal layer 36 at the contact points 49 exposed, respectively, by the openings 46a, then electroplating a nickel layer with a thickness of between 0.5 and 5 μm on the copper layer in the openings 46a, then electroplating or electroless plating a palladium layer with a thickness of between 0.05 and 0.5 μm on the nickel layer in the openings 46a, and then electroplating or electroless plating a gold layer with a thickness of between 0.01 and 0.5 μm on the palladium layer in the openings 46a.

For example, the metal bumps 48 may be formed by electroplating a gold layer having a thickness of between 10 and 50 micrometers, and preferably of between 12 and 20 μm, on the metal layer 36 at the contact points 49 exposed, respectively, by the openings 46a with an electroplating solution containing gold of between 1 and 20 grams per litter (g/L), and preferably between 5 and 15 g/L, and sulfite ion of between 10 and 120 g/L, and preferably between 30 and 90 g/L. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$).

The operational parameters of electroplating the gold layer are described below:

1. The above-mentioned electroplating solution used to electroplate the gold layer on the metal layer 36 at the contact points 49 exposed, respectively, by the openings 46a can be at a temperature of between 30 and 70° C., and preferably between 45 and 65° C.

2. The above-mentioned electroplating solution can be used to electroplate the gold layer on the metal layer 36 at the contact points 49 exposed, respectively, by the openings 46a through an electric current with a current density at between 1 and 10 mA/cm$^2$, and preferably between 4 and 6 mA/cm$^2$.

3. The above-mentioned electroplating solution may have a pH value of between 6 and 9, and preferably between 7 and 8.5, to electroplate the gold layer on the metal layer 36 at the contact points 49 exposed, respectively, by the openings 46a.

Alternatively, the metal bumps 48 may be formed by electroplating a gold layer having a thickness between 10 and 50 μm, and preferably between 12 and 20 μm, on the metal layer 36 at the contact points 49 exposed, respectively, by the openings 46a with an electroplating solution containing cyanide.

Figure 5J:
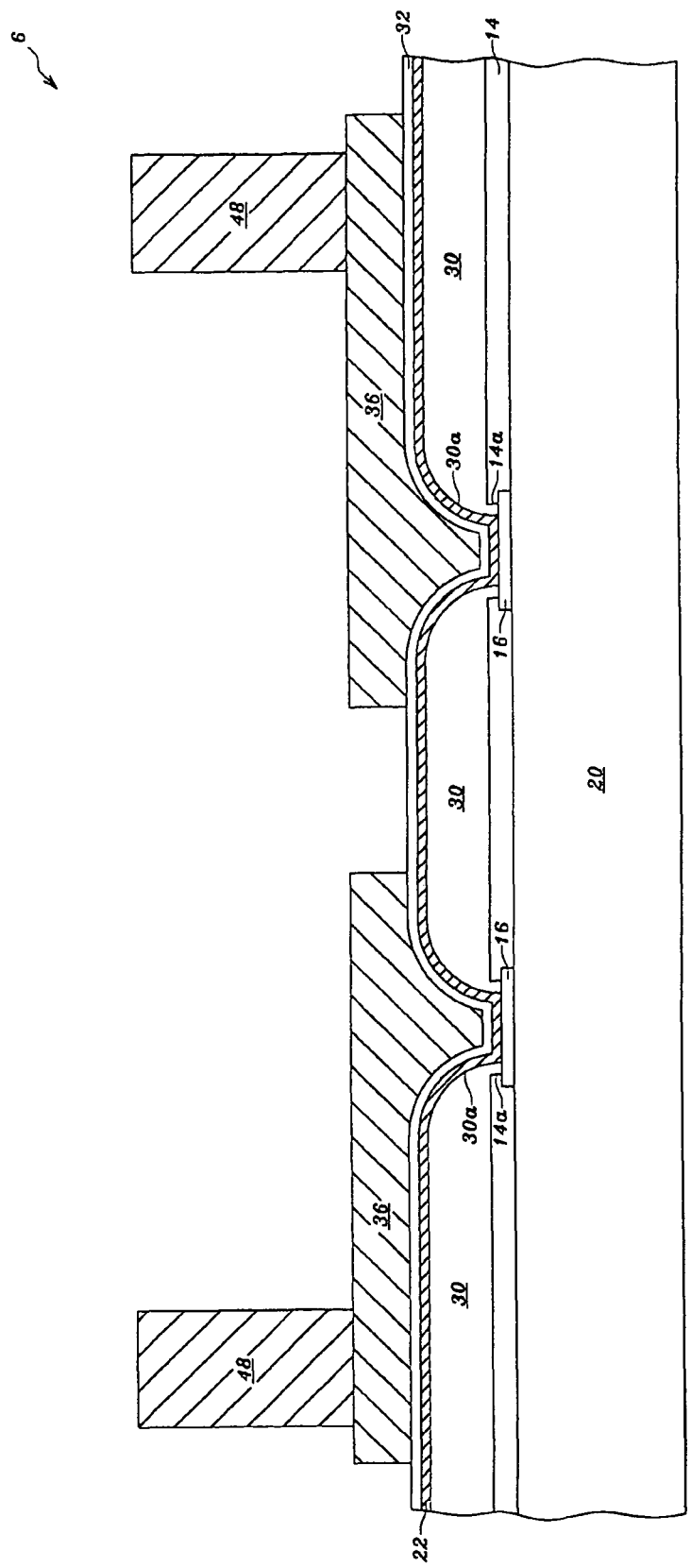

Referring to FIG. 5J, after the metal bumps 48 are formed, most of the photoresist layer 46 can be removed using an organic solution with amide. However, some residuals from the photoresist layer 46 could remain on the metal bumps 48, on the metal layer 36 and on the seed layer 32. Thereafter, the residuals can be removed from the metal bumps 48, from the metal layer 36 and from the seed layer 32 with a plasma, such as $O_2$ plasma or plasma containing fluorine of below 200 PPM and oxygen.

Figure 5K:
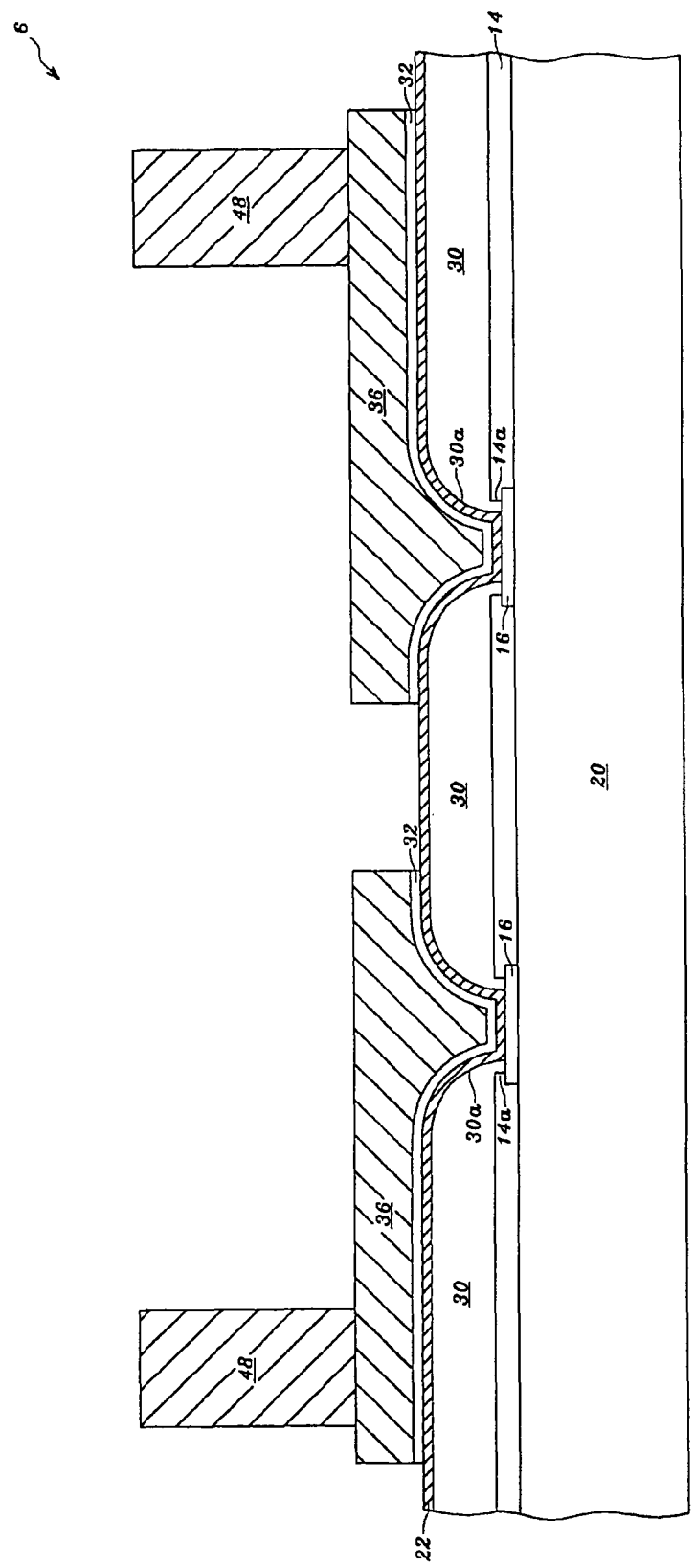

Referring to FIG. 5K, the seed layer 32 not under the metal layer 36 can be removed with a dry etching method or a wet etching method. As to the wet etching method, when the seed layer 32 is a gold layer, it can be etched with an iodine-containing solution, such as solution containing potassium iodide; when the seed layer 32 is a copper layer, it can be etched with a solution containing $NH_4OH$. As to the dry etching method, when the seed layer 32 is a gold layer, it can be removed with an Ar sputtering etching process; when the seed layer 32 is a copper layer, it can be removed with an Ar sputtering etching process. Generally, the dry etching method to etch the seed layer 32 not under the metal layer 36 may include a chemical plasma etching process, a sputtering etching process, such as argon sputter process, or a chemical vapor etching process.

Figure 5L:
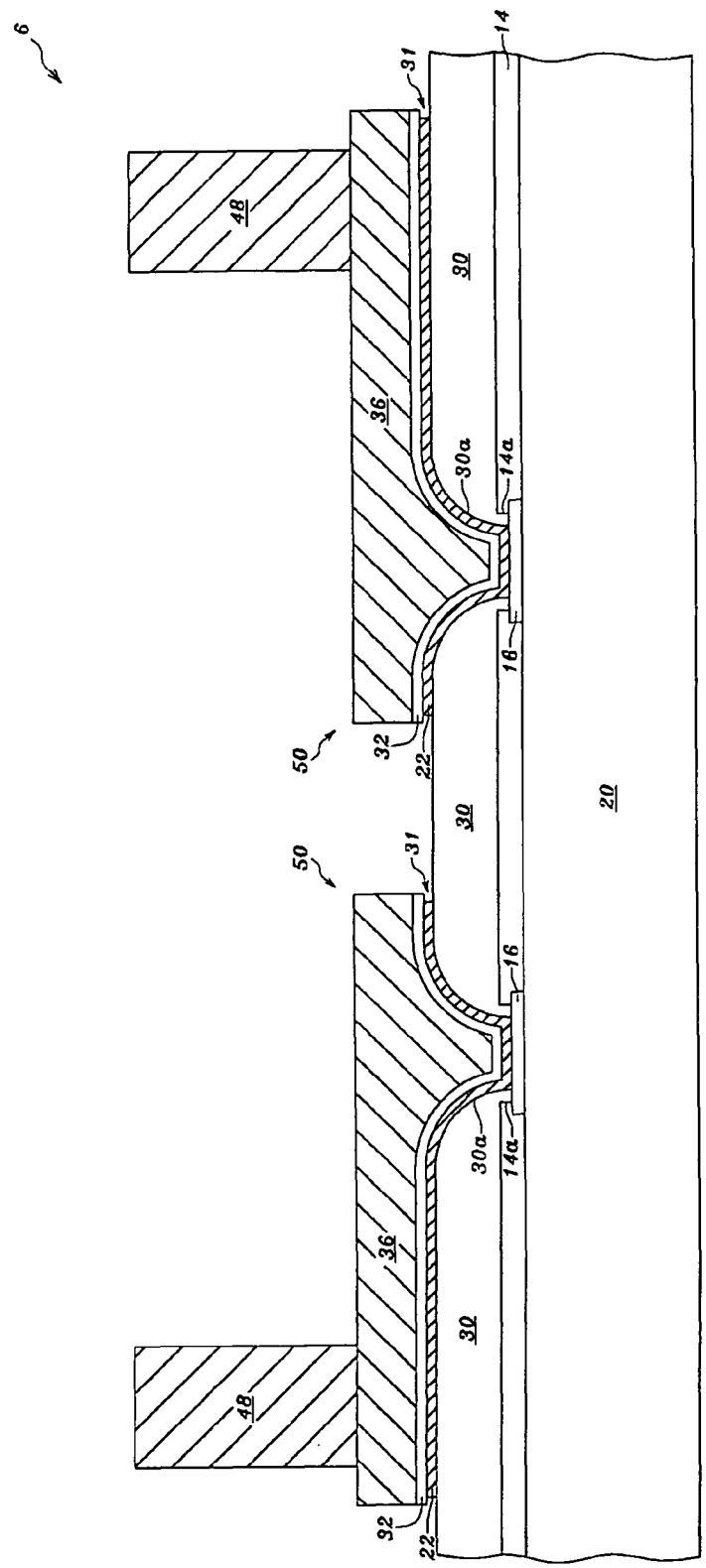

Referring to FIG. 5L, the titanium-tungsten-alloy layer 22 not under the metal layer 36 can be removed with a wet etching method. Two methods for removing the titanium-tungsten-alloy layer 22 not under the metal layer 36 are described as below:

In a first method, the semiconductor wafer 6 shown in FIG. 5K can be immersed in an etchant containing between 15 wt. % and 50 wt. % of hydrogen peroxide, such as 30 wt. % of hydrogen peroxide, at a temperature of between 35 and 50 degrees C., and preferably of between 38 and 42 degrees C., such as 40 degrees C., for a time of between 3 and 20 minutes, and preferably of between 5 and 15 minutes, to etch the titanium-tungsten-alloy layer 22 not under the metal layer 36 with circulation flow. Alternatively, the semiconductor wafer 6 shown in FIG. 5K can be immersed in an etchant containing between 15 wt. % and 50 wt. % of hydrogen peroxide, such as 30 wt. % of hydrogen peroxide, at a temperature of between 43 and 47 degrees C., and preferably of 45 degrees C., for a time of between 3 and 20 minutes, and preferably of between 5 and 15 minutes, to etch the titanium-tungsten-alloy layer 22 not under the metal layer 36 with circulation flow. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The method has a high etching rate and can improve the etching behavior to prevent the titanium oxide and tungsten oxide from drifting onto the metal layer 36 and onto the metal bumps 48 with the hydrodynamic circulation flow. Therefore, the frequency of probe cleaning during a chip probing (CP) test and of a CP re-test can be reduced due to the metal layer 36 and the metal bumps 48 having clean surface.

In a second method, the semiconductor wafer 6 shown in FIG. 5K can be immersed in an etchant containing between 15 wt. % and 50 wt. % of hydrogen peroxide, such as 30 wt. % of hydrogen peroxide, at a temperature of between 23 and 27 degrees C., and preferably of 25 degrees C., for a time of between 10 and 50 minutes, and preferably of between 15 and 40 minutes, to etch the titanium-tungsten-alloy layer 22 not under the metal layer 36 with circulation flow, and ultrasonic waves are applied to the etchant in the entire etching process or in a selected time interval between 5 and 10 minutes at the final period of the etching process. For example, the etchant may contain between 15 wt. % and 25 wt. % of hydrogen peroxide, between 25 wt. % and 35 wt. % of hydrogen peroxide or between 35 wt. % and 50 wt. % of hydrogen peroxide. The ultrasonic waves having a fixed frequency selected from a frequency range between 28K Hz and 120K Hz are used here. The ultrasonic waves have a power of between 1.0 KW and 2.0 KW, and preferably of 1.5 KW. The method can prevent the titanium oxide and tungsten oxide from drifting onto the metal layer 36 and onto the metal bumps 48 with the hydrodynamic circulation flow. Therefore, the frequency of probe cleaning during a chip probing (CP) test and of a CP re-test can be reduced due to the metal layer 36 and the metal bumps 48 having clean surface.

Multiple undercuts 31 are formed under the seed layer 32 when the titanium-tungsten-alloy layer 22 not under the meter layer 36 is removed using a wet etching method. The titanium-tungsten-alloy layer 22 under the metal layer 36 has a first sidewall recessed from a second sidewall of the seed layer 32, wherein a distance d2 between the first sidewall and the second sidewall is between 0.3 and 2 micrometers.

Thereby, in the present invention, multiple metal traces 50 can be formed on the polymer layer 30 and on the pads 16, such as aluminum pads or copper pads, exposed, respectively, by the openings 14a, and the metal bumps 48 are formed on the metal traces 50, respectively. The metal traces 50 can be formed of the titanium-tungsten-alloy layer 22, the seed layer 32 on the titanium-tungsten-alloy layer 22 and the metal layer 36 on the seed layer 32. From a top perspective view, the positions of the metal bumps 48 may be different from those of the pads 16, respectively, to which the metal bumps 48 are connected, respectively. Alternatively, the metal bumps 48 on the metal layer 36 can be formed directly over the pads 16.

Figure 5M:
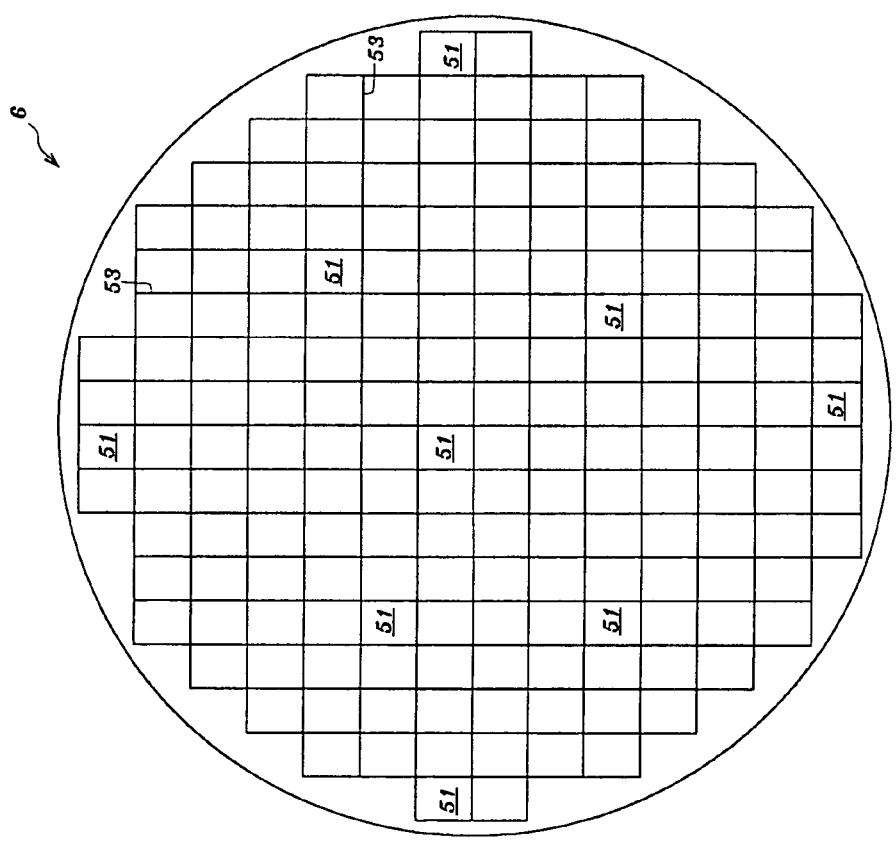
FIG. 5M is a top view showing a semiconductor wafer with multiple metal traces and multiple metal bumps on the metal traces.

Referring to FIG. 5M, the semiconductor wafer 6 includes multiple dies 51 with scribe lines 53 between neighboring two of the dies 51. In the following wafer dicing process, the semiconductor wafer 6 can be cut along the scribe lines 53 to separate the dies 51. Each of the dies 51 may have the metal traces 50 and the metal bumps 48 on the metal traces 50, respectively.

Figure 5N:
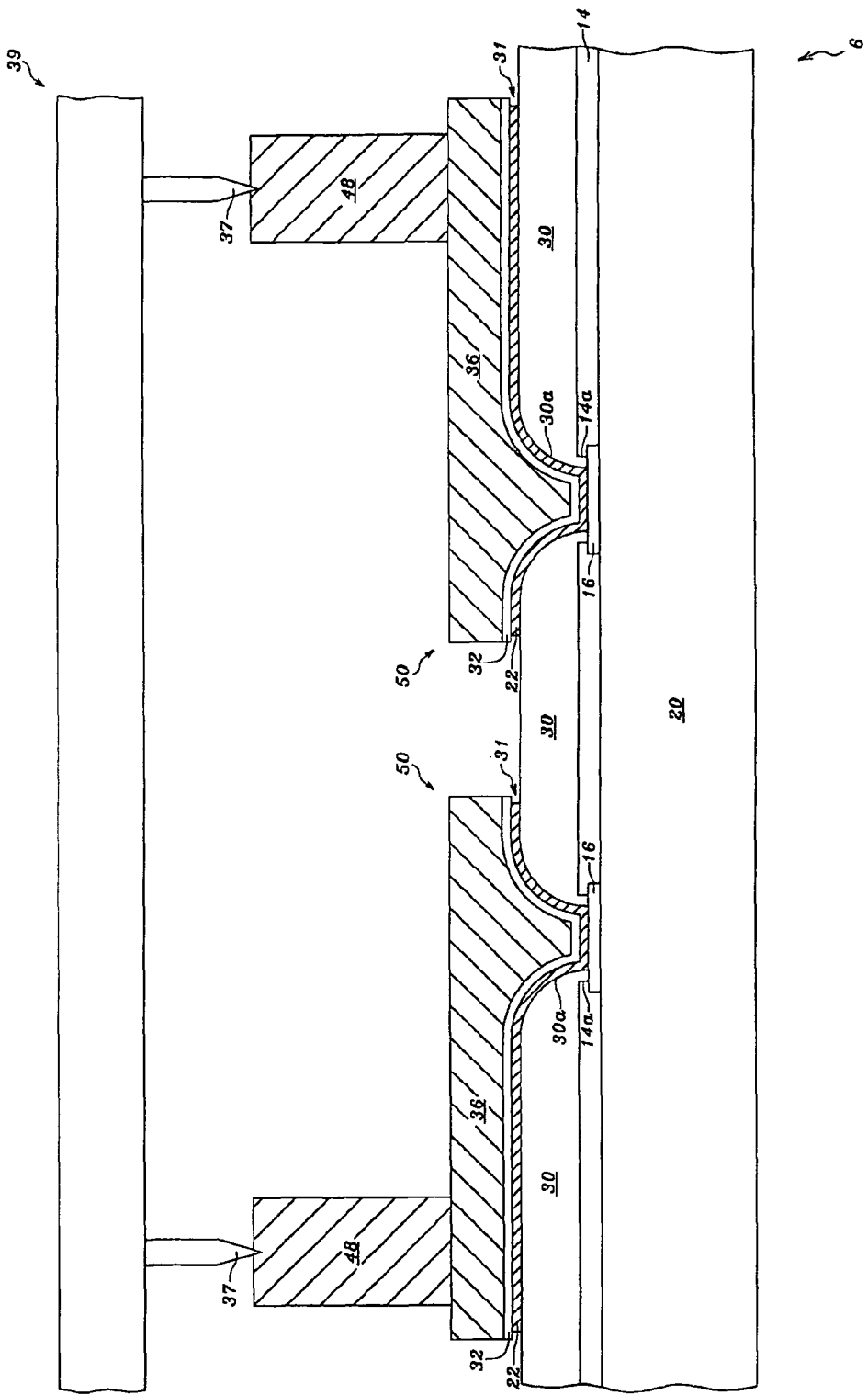
Figure 50:
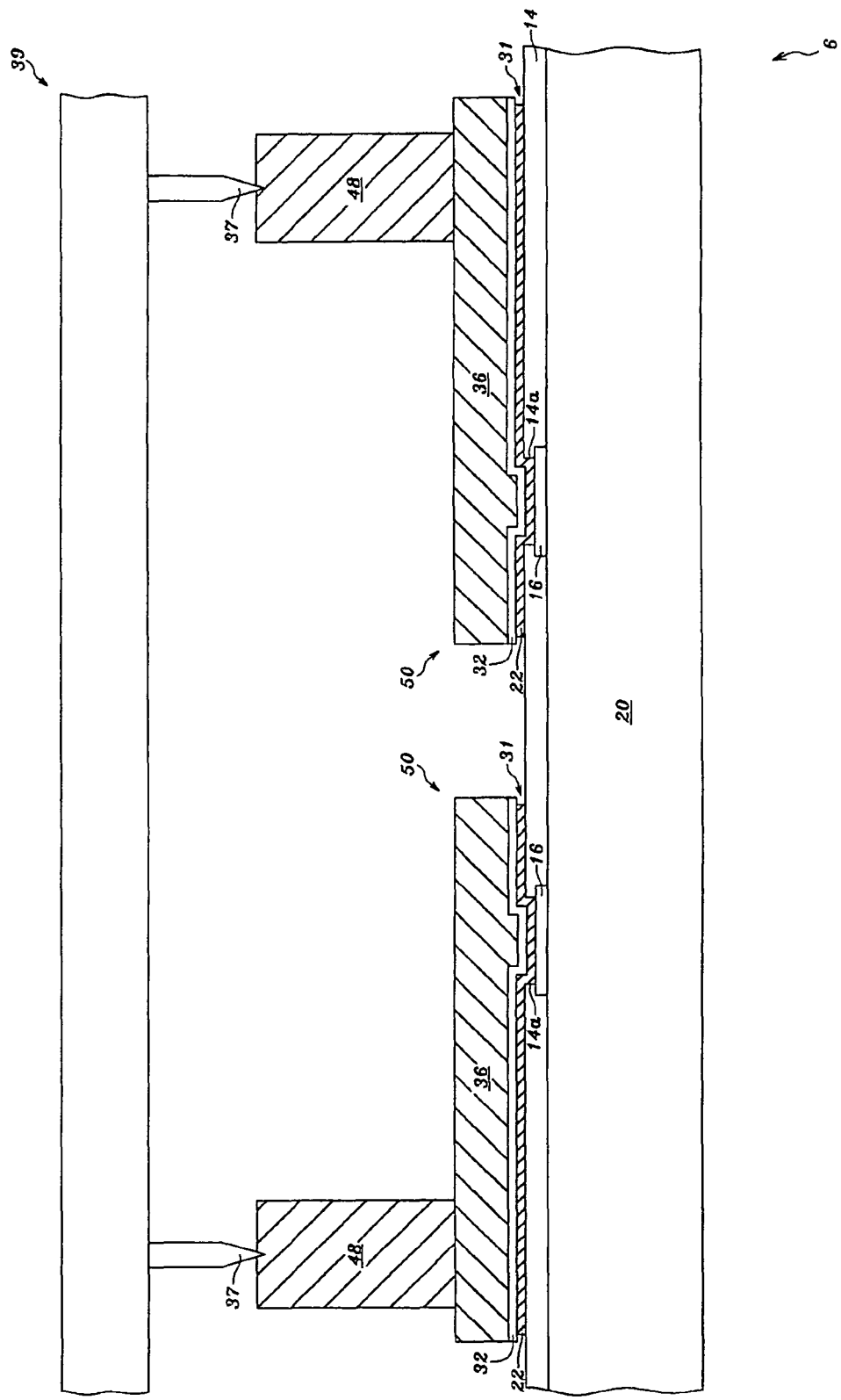

Referring to FIGS. 5M and 5N, after etching the titanium-tungsten-alloy layer 22 not under the metal layer 36, a chip probing (CP) test can be performed to electrically test all dies 51 of the semiconductor wafer 6 shown in FIG. 5L by contacting multiple probe tips 37 of a probe card 39 with some of the metal bumps 48 of the semiconductor wafer 6, in sequence, until the probe tips 37 of the probe card 39 have contacted with the entire metal bumps 48 provided by the semiconductor wafer 6. The probe tips 37 can contact with the entire metal bumps 48 provided by one of the dies 51 of the semiconductor wafer 6 once, or the probe tips 37 can contact with the entire metal bumps 48 provided by at least two of the dies 51 of the semiconductor wafer 6 once. The probe card 39 can be a vertical probe card, that is, the probe tips 37 can vertically contact with top surfaces of the metal bumps 48. The material of the probe tips 37 may include tungsten or rhenium.

Therefore, all dies 51 of the semiconductor wafer 6 can be electrically tested by contacting the probe tips 37 of the probe card 39 with the entire metal bumps 48 provided by one or more than one of the dies 51 once, until the probe tips 37 of the probe card 39 have contacted with the entire metal bumps 48 provided by the semiconductor wafer 6. The electrically testing process comprises following steps:

Step 1: the probe tips 37 of the probe card 39 probe the entire metal bumps 48 provided by one or more than one of the dies 51 of the semiconductor wafer 6 to electrically test the probed die or dies 51;

Step 2: the probe tips 37 of the probe card 39 probe the entire metal bumps 48 provided by another one or more than another one of the dies 51 of the semiconductor wafer 6 to electrically test the probed die or dies 51;

Step 3: the probe tips 37 of the probe card 39 are cleaned until the probe tips 37 probe the metal bumps 48 provided by the semiconductor wafer 6 at greater than 100 times, 150 times or even 200 times for electrically testing the respective dies 51 of the semiconductor wafer 6;

Step 4: after cleaning the probe tips 37 of the probe card 39, the probe tips 37 of the probe card 39 probe the metal bumps 48 provided by the other untested dies 51 of the semiconductor wafer 6; and Step 5: repeating the step 3 and step 4 until all of the dies 51 of the semiconductor wafer 6 have been electrically tested using the probe card 39.

The probe tips 37 of the probe card 39 may be cleaned by a cleaning sheet to remove metal oxide, such as titanium oxide or tungsten oxide, adhered to the probe tips 37.

In the present invention, the residual of titanium oxide and tungsten oxide remaining on the metal bumps 48 of the semiconductor wafer 6 can be reduced using the two above-mention methods for removing the titanium-tungsten-alloy layer 22 not under the metal layer 36. Thereby, the probe tips 37 of the probe card 39 should be cleaned only until the probe tips 37 of the probe card 39 contact with the metal bumps 48 provided by the semiconductor wafer 6 at greater than 100 times, 150 times or even 200 times. The invention can reduce the frequency of cleaning the probe tips 37 on the probe card 39 during a chip probing (CP) test and reduce the frequency of a CP re-test.

After the chip probing (CP) test, the semiconductor wafer 6 can be cut along the scribe lines 53 into multiple individual semiconductor chips 51, integrated circuit chips.

Referring to FIG. 5O, in the present invention, the step of forming the polymer layer 30 on the passivation layer 14, as shown in FIG. 4A, can be omitted, that is, the titanium-tungsten-alloy layer 22 having a thickness of between 0.02 and 0.5 μm can be directly formed on the passivation layer 14 and on the pads 16, such as aluminum pads or copper pads, exposed, respectively, by the openings 14a, followed by the steps as referred to in FIGS. 5B-5N, followed by cutting the semiconductor wafer 6 along the scribe lines into multiple individual semiconductor chips.

Figure 5P:
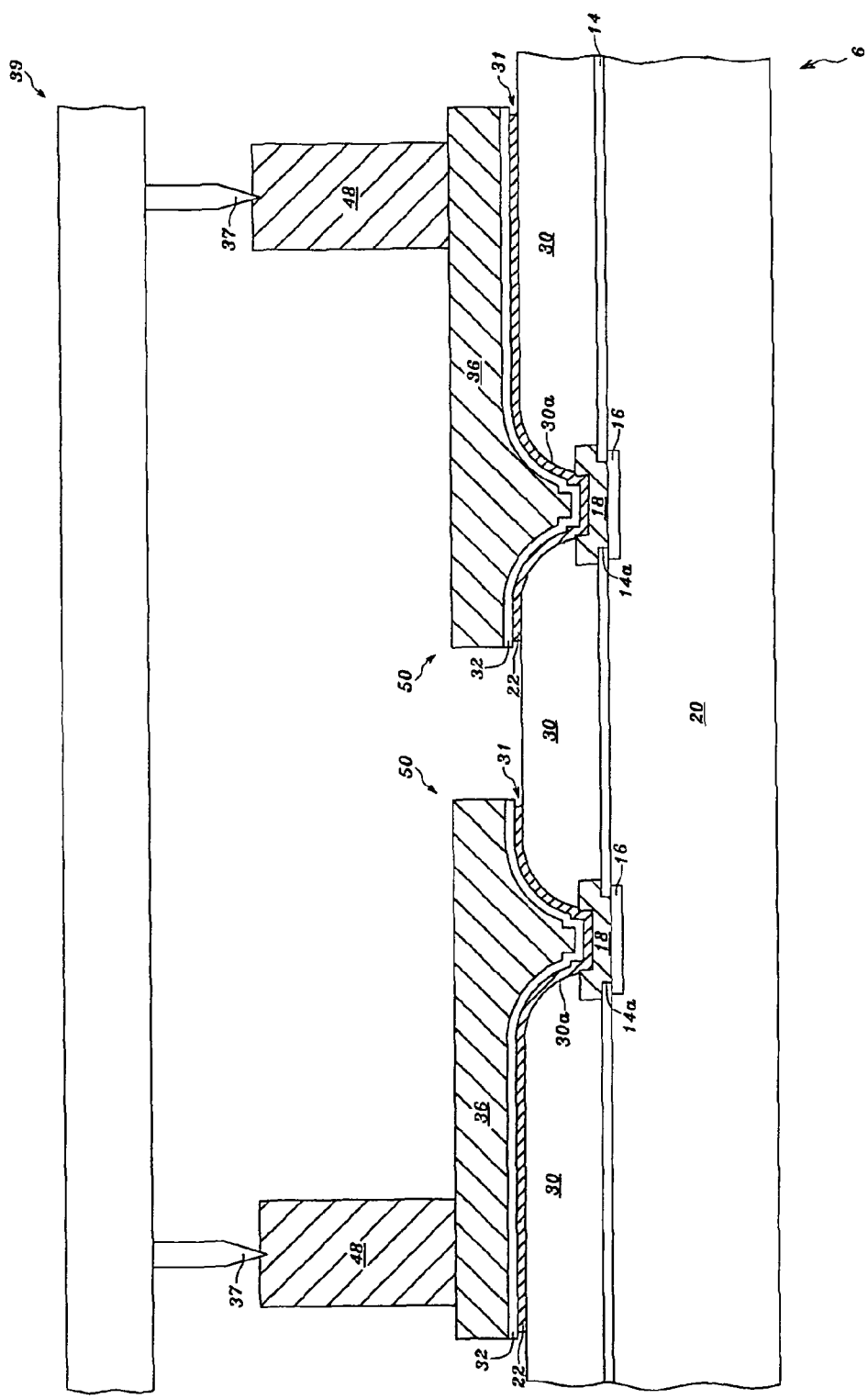

Referring to FIG. 5P, the polymer layer 30 can be formed on the passivation layer 14, and the openings 30a are formed in the polymer layer 30 by a photolithography process, exposing the metal caps 18 over the pads 16, respectively. Next, the metal traces 50 are formed on the polymer layer 30 and on the metal caps 18 exposed, respectively, by the openings 30a, and the metal bumps 48 are formed, respectively, on the metal traces 50, that is, the titanium-tungsten-alloy layer 22 having a thickness of between 0.02 and 0.5 μm can be sputtered on the polymer layer 30 and on the aluminum-containing layer of the metal caps 18, wherein the an aluminum-containing layer may be an aluminum layer, an Al—Si—Cu-alloy layer or an aluminum-copper-alloy layer, followed by the above-mentioned steps as shown in FIGS. 5B-5L. Next, the semiconductor wafer 6 can be electrically tested by performing the above-mentioned steps as shown in FIGS. 5M-5N. After the chip probing (CP) test, the semiconductor wafer 6 can be cut along the scribe lines into multiple individual semiconductor chips.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A method for fabricating and testing a semiconductor wafer comprising:
providing a silicon substrate, multiple metal oxide semiconductor (MOS) devices in or over said silicon substrate, a first dielectric layer over said silicon substrate and over said multiple MOS devices, a metallization structure over said first dielectric layer, wherein said metallization structure comprises a first metal layer and a second metal layer over said first metal layer, a second dielectric layer between said first and second metal layers, multiple metal pads over said silicon substrate and over said multiple MOS devices and said first and second dielectric layers, and a passivation layer over said metallization structure, over said first and second dielectric layers and over outer edges of said multiple metal pads, wherein said passivation layer comprises a nitride layer, wherein multiple first openings in said passivation layer expose respective portions of said multiple metal pads;
forming multiple metal traces over said passivation layer and on said multiple exposed portions of said multiple metal pads, wherein said multiple metal traces are not on said outer edges of said multiple metal pads, wherein said multiple metal traces have multiple contact points over said passivation layer and being located in a top surface of said multiple metal traces, wherein said multiple contact points are not in vertical alignment with any portion of said multiple exposed portions of said metal pads, wherein each one of said multiple contact points is connected to each one of said respective multiple metal pads via the contact point's corresponding metal trace through one of said multiple first openings, wherein said forming of said multiple metal traces comprises sputtering a titanium-tungsten-alloy layer with a thickness between 0.02 and 0.5 μm over said passivation layer and on said multiple exposed portions of said metal pads, next forming a seed layer with a thickness between 0.02 and 0.3 μm on said titanium-tungsten-alloy layer, next forming a photoresist layer on said seed layer, wherein multiple second openings in said photoresist layer expose multiple regions of said seed layer, next forming a third metal layer with a thickness between 1 and 30 micrometers over said multiple regions, said third metal comprising one or more of gold, copper, nickel, and palladium, next removing said photoresist layer, next removing said seed layer not under said third metal layer, and then etching said titanium-tungsten-alloy layer not under said third metal layer by immersion in an etchant containing hydrogen peroxide at a temperature between 35 and 50 degrees C. with circulation flow; and
contacting multiple probe tips of a probe card with some of said multiple contact points to probe said semiconductor wafer.

2. The method of claim 1, wherein said forming said seed layer comprises sputtering a first gold layer with a thickness between 0.03 and 0.5 μm, and said forming said third metal layer comprises electroplating a second gold layer with a thickness between 3 and 15 micrometers on said first gold layer.

3. The method of claim 2, wherein said removing said seed layer not under said third metal layer comprises etching said first gold layer not under said second gold layer with a solution containing potassium iodide.

4. The method of claim 1, wherein said forming said multiple metal traces further comprises said etching said titanium-tungsten-alloy layer not under said third metal layer with said etchant at a temperature between 38 and 42 degrees C.

5. The method of claim 1, wherein said forming said multiple metal traces further comprises said etching said titanium-tungsten-alloy layer not under said third metal layer with said etchant for a time between 5 and 15 minutes.

6. The method of claim 1, wherein said passivation layer further comprises an oxide layer under said nitride layer.

7. The method of claim 1 further comprising forming a polymer layer over said multiple metal traces and said passivation layer.

8. The method of claim 1 further comprising forming a polymer layer on said passivation layer, wherein multiple third openings in said polymer layer are over said multiple exposed portions of said metal pads, followed by said forming said multiple metal traces further on said polymer layer.

9. The method of claim 1, wherein said forming said multiple metal traces further comprises said etching said titanium-tungsten-alloy layer not under said third metal layer with said etchant containing between 25 and 35 weight percent of hydrogen peroxide.

10. The method of claim 1, wherein said multiple probe tips comprise tungsten.

11. A method for fabricating and testing a semiconductor wafer comprising:
providing a silicon substrate, multiple metal oxide semiconductor (MOS) devices in or over said silicon substrate, a first dielectric layer over said silicon substrate and over said multiple MOS devices, a metallization structure over said first dielectric layer, wherein said metallization structure comprises a first metal layer and a second metal layer over said first metal layer, a second dielectric layer between said first and second metal layers, multiple metal pads over said silicon substrate and over said multiple MOS devices and said first and second dielectric layers, and a passivation layer over said metallization structure, over said first and second dielectric layers and over outer edges of said multiple metal pads, wherein said passivation layer comprises a nitride layer, wherein multiple first openings in said passivation layer are over multiple exposed portions of said multiple metal pads;
forming multiple metal traces over said passivation layer and on said multiple exposed portions of said multiple metal pads, wherein said multiple metal traces are not on said outer edges of said multiple metal pads, wherein said multiple metal traces have multiple contact points over said passivation layer and being located in a top surface of said multiple metal traces, wherein said multiple contact points are not in vertical alignment with any portion of said multiple exposed portions of said metal pads, wherein each one of said multiple contact points is connected to a respective one of said multiple exposed portions of said metal pads via the contact point's corresponding metal trace through one of said multiple first openings, wherein said forming of said multiple metal traces comprises sputtering a titanium-tungsten-alloy layer over said passivation layer and on said multiple exposed portions of said metal pads, next forming a seed layer on said titanium-tungsten-alloy layer, next forming a photoresist layer on said seed layer, wherein multiple second openings in said photoresist layer expose multiple regions of said seed layer, next forming a third metal layer over said multiple regions, said third metal comprising one or more of gold, copper, nickel, and palladium, next removing said photoresist layer, next removing said seed layer not under said third metal layer, and then etching said titanium-tungsten-alloy layer not under said third metal layer by immersion in an etchant containing hydrogen peroxide at a temperature between 35 and 50 degrees C. with circulation flow; and contacting multiple probe tips of a probe card with some of said multiple contact points to probe said semiconductor wafer.

12. The method of claim 11, wherein said forming said seed layer comprises sputtering a first gold layer, and said forming said third metal layer comprises electroplating a second gold layer on said first gold layer.

13. The method of claim 12, wherein said removing said seed layer not under said third metal layer comprises etching said first gold layer not under said second gold layer with a solution containing potassium iodide.

14. The method of claim 11, wherein said forming said multiple metal traces further comprises said etching said titanium-tungsten-alloy layer not under said third metal layer with said etchant at a temperature between 38 and 42 degrees C.

15. The method of claim 11, wherein said forming said multiple metal traces further comprises said etching said titanium-tungsten-alloy layer not under said third metal layer with said etchant for a time between 5 and 15 minutes.

16. The method of claim 11, wherein said passivation layer further comprises an oxide layer under said nitride layer.

17. The method of claim 11 further comprising forming a polymer layer over said multiple metal traces and said passivation layer.

18. The method of claim 11 further comprising forming a polymer layer on said passivation layer, wherein multiple third openings in said polymer layer are over said multiple exposed portions of said metal pads, followed by said forming said multiple metal traces further on said polymer layer.

19. The method of claim 11, wherein said forming said multiple metal traces further comprises said etching said titanium-tungsten-alloy layer not under said third metal layer with said etchant containing between 25 and 35 weight percent of hydrogen peroxide.

20. The method of claim 11, wherein said multiple probe tips comprise tungsten.

* * * * *